US012787360B2

(12) United States Patent
Huang et al.

(10) Patent No.: US 12,787,360 B2
(45) Date of Patent: Nov. 3, 2026

(54) SEMICONDUCTOR STRUCTURE WITH TREATED GATE DIELECTRIC LAYER AND METHOD FOR MANUFACTURING THE SAME

(71) Applicant: Taiwan Semiconductor Manufacturing Company, Ltd., Hsinchu (TW)

(72) Inventors: Chi Huang, Changhua County (TW); Che-Chia Hsu, Taoyuan City (TW); Chih-Pin Tsao, Zhubei City (TW); Chih-Hong Hwang, New Taipei City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 807 days.

(21) Appl. No.: 18/163,539

(22) Filed: Feb. 2, 2023

(65) Prior Publication Data

US 2024/0204073 A1 Jun. 20, 2024

Related U.S. Application Data

(60) Provisional application No. 63/433,655, filed on Dec. 19, 2022.

(51) Int. Cl.
*H10D 30/67* (2025.01)
*H10D 30/69* (2025.01)
(Continued)

(52) U.S. Cl.
CPC ..... *H10D 30/6735* (2025.01); *H10D 30/6757* (2025.01); *H10D 62/121* (2025.01);
(Continued)

(58) Field of Classification Search
CPC .......... H10D 30/6735; H10D 30/6757; H10D 62/121; H10D 62/151; H10D 64/017;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

KR 20210098832 A 8/2021
KR 20210152376 A * 12/2021 ......... H10D 30/6744
(Continued)

*Primary Examiner* — Marlon T Fletcher
*Assistant Examiner* — Sesha Sairaman Srinivasan
(74) *Attorney, Agent, or Firm* — HAYNES AND BOONE, LLP

(57) ABSTRACT

Semiconductor structures and methods for manufacturing the same are provided. The method includes forming a first channel structure and a second channel structure and forming a first type of source/drain structures attached to opposite sides of the first channel structure and a second type of source/drain structures attached to opposite sides of the second channel structure. The method also includes forming a first gate dielectric layer having a first portion covering the first channel structure and a second portion covering the second channel structure and driving a first metal element into the first portion of the first gate dielectric layer. The method also includes forming a cap layer over both the first portion and the second portion of the first gate dielectric layer and performing an annealing process on the first gate dielectric layer under the cap layer.

20 Claims, 64 Drawing Sheets

(51) Int. Cl.

| | |
|---|---|
| ***H10D 62/10*** | (2025.01) |
| ***H10D 62/13*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.
CPC ......... *H10D 62/151* (2025.01); *H10D 64/017* (2025.01); *H10D 84/0128* (2025.01); *H10D 84/013* (2025.01); *H10D 84/038* (2025.01)

(58) Field of Classification Search
CPC ............. H10D 84/0128; H10D 84/013; H10D 84/038; H10D 30/797; H10D 84/017; H10D 84/0181; H10D 84/85; H10D 84/0167; H10D 84/0172; H10D 84/856; H01L 21/28185
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2016/0104705 | A1* | 4/2016 | Chung | H10D 84/0158 257/401 |
| 2018/0166274 | A1* | 6/2018 | Lin | H10D 30/0223 |
| 2020/0105758 | A1* | 4/2020 | Ching | B82Y 10/00 |
| 2020/0294865 | A1* | 9/2020 | Cheng | H10D 62/822 |
| 2020/0373300 | A1* | 11/2020 | Zhang | H10D 84/85 |
| 2021/0265496 | A1* | 8/2021 | Chu | H10D 84/038 |
| 2022/0093596 | A1* | 3/2022 | Lavric | H10D 64/015 |
| 2022/0093597 | A1 | 3/2022 | Ouellette et al. | |
| 2022/0093648 | A1 | 3/2022 | Lavric et al. | |
| 2022/0109047 | A1* | 4/2022 | Jun | H10D 84/85 |
| 2022/0328642 | A1* | 10/2022 | Jin | H10D 62/121 |
| 2022/0352389 | A1* | 11/2022 | Kim | B82Y 10/00 |

FOREIGN PATENT DOCUMENTS

| | | | |
|---|---|---|---|
| TW | 201921454 | A | 6/2019 |
| TW | 202147623 | A | 12/2021 |
| TW | 202232585 | A | 8/2022 |
| TW | 202240901 | A | 10/2022 |
| TW | 202243263 | A | 11/2022 |

* cited by examiner

SEMICONDUCTOR STRUCTURE WITH TREATED GATE DIELECTRIC LAYER AND METHOD FOR MANUFACTURING THE SAME

PRIORITY CLAIM AND CROSS-REFERENCE

This application claims priority to U.S. Provisional Application Ser. No. 63/433,655, filed on Dec. 19, 2022, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIG. 2J-4 illustrates an enlarged cross-sectional view of the semiconductor structure of block $BK_{2J}$ shown in FIG. 2J-2 in accordance with some embodiments.

FIG. 2J-5 illustrates a diagrammatic top view of the semiconductor structure in accordance with some embodiments. FIGS. 2J'-2 and 2J'-3 illustrate the cross-sectional views of an semiconductor structure shown along line $Y_{MG}$-$Y_{MG}$' and X-X' in FIG. 1C, respectively, in accordance with some embodiments.

FIG. 3H' illustrates the enlarged cross-sectional view of the semiconductor structure in accordance with some embodiments.

FIGS. 6A-1 to 6J-1, 6A-2 to 6J-2, and 6A-3 to 6J-3 illustrate cross-sectional views of intermediate stages of manufacturing a semiconductor structure in accordance with some embodiments.

FIG. 6J-4 illustrates an enlarged cross-sectional view of the semiconductor structure of block $BK_{6J}$ shown in FIG. 6J-2 in accordance with some embodiments.

FIG. 6J-5 illustrates a diagrammatic top view of the semiconductor structure in accordance with some embodiments.

FIGS. 6J'-2 and 6J'-3 illustrate cross-sectional views of a semiconductor structure in accordance with some embodiments.

FIGS. 7A-1 to 7Q-1, 7A-2 to 7Q-2, and 7A-3 to 7Q-3 illustrate cross-sectional views of intermediate stages of manufacturing a semiconductor structure in accordance with some embodiments.

FIG. 7Q-4 illustrates an enlarged cross-sectional view of the semiconductor structure of block $BK_{7Q}$ shown in FIG. 7Q-3 in accordance with some embodiments.

FIG. 7Q-5 illustrates a diagrammatic top view of the semiconductor structure in accordance with some embodiments.

FIGS. 7Q'-2 and 7Q'-3 illustrate cross-sectional views of a semiconductor structure in accordance with some embodiments.

FIGS. 8-1, 8-2, and 8-3 illustrate cross-sectional views a semiconductor structure in accordance with some embodiments.

FIG. 8-4 illustrates an enlarged cross-sectional view of the semiconductor structure of block $BK_8$ shown in FIG. 8-3 in accordance with some embodiments.

FIGS. 9-1, 9-2, and 9-3 illustrate cross-sectional views a semiconductor structure in accordance with some embodiments.

FIG. 9-4 illustrates a diagrammatic top view of the semiconductor structure in accordance with some embodiments.

DETAILED DESCRIPTION

Figure 1B:
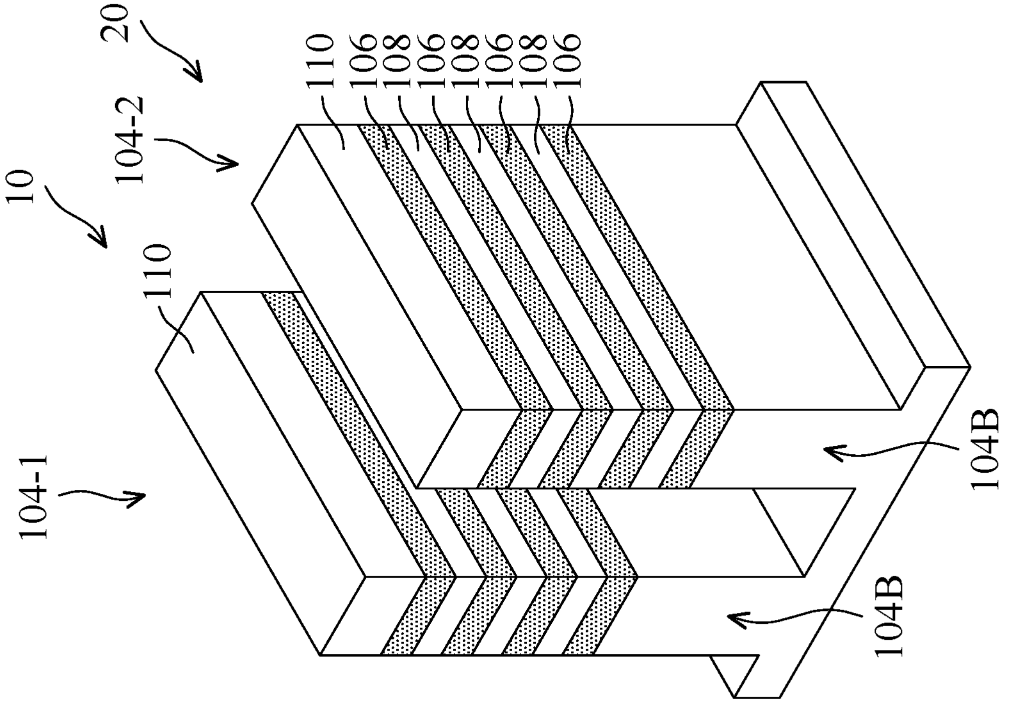
FIGS. 1A to 1C illustrate diagrammatic perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistors (e.g. nanosheet transistors, nanowire transistors, multi-bridge channel transistors, nano-ribbon FET, and gate all around (GAA) transistors) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures.

Embodiments of semiconductor structures and methods for forming the same are provided. The semiconductor structures may include a first type (e.g. n-type) of a transistor formed in a first region and a second type (e.g. p-type) of a transistor formed in a second region that is adjacent to the first region. The first type and second type of transistors may both include channel structures, such as nanostructures, formed over a substrate and a gate structure formed over the channel structures. In addition, the formation of the gate structure may include forming a dielectric material in both the first region and the second region and treating the dielectric material with additional metal elements in the first region but not in the second region. After the dielectric material is treated, a single work function metal layer (e.g. p-type work function metal layer) may be formed over the dielectric material in both the first and the second regions.

The dielectric material may be used as the gate dielectric layer of the gate structures in both the first type and the second type of the transistors, and the threshold voltage of the first type and the second type of the transistors may be different. That is, although the same work function metal layers are formed in both the first type and the second type of transistors, the first type and the second type of the transistors can still have different threshold voltage due to the additional metal elements treated in the first region of the dielectric material. Therefore, by treating the gate dielectric layer with additional metal elements, the threshold voltages of the transistors may be adjusted, and additional work function metal layers are not required. Accordingly, there will be no material boundary of the work function metal materials between the first type and the second type of the transistors, and the performance and the reliability of the resulting transistors may be improved.

Figure 1A:
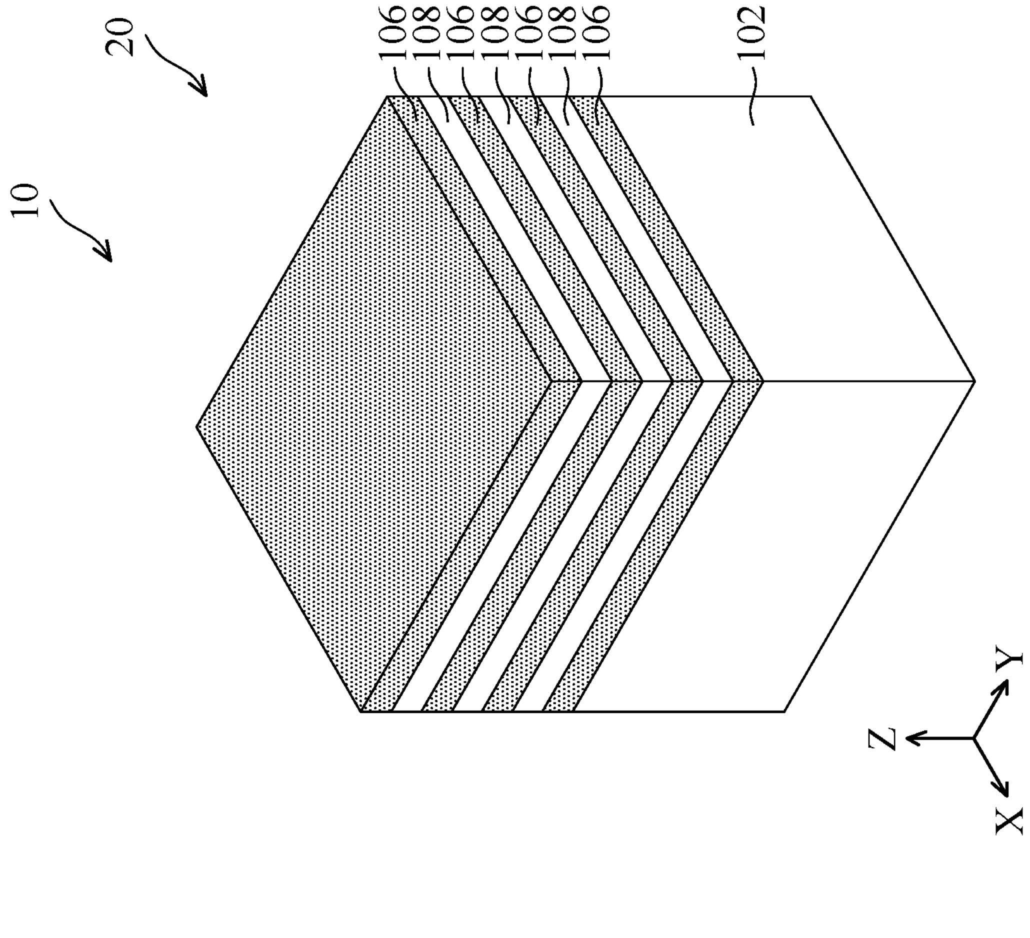
Figure 1C:
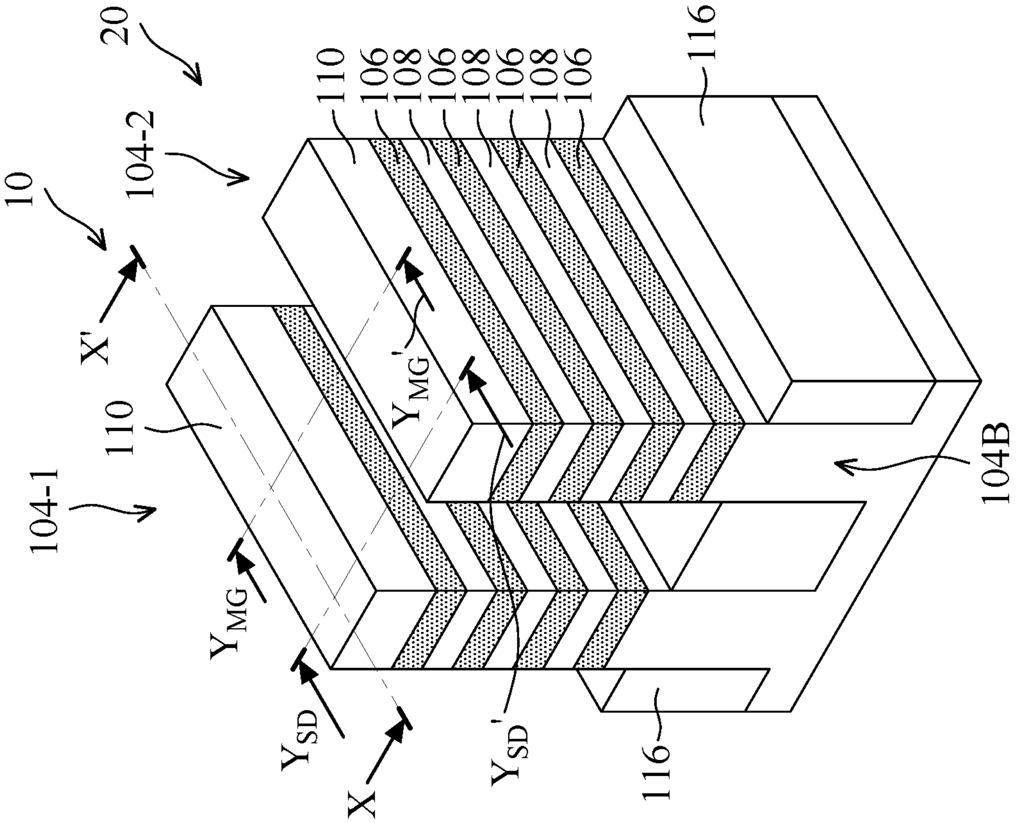

FIGS. 1A to 1C illustrate diagrammatic perspective views of intermediate stages of manufacturing a semiconductor structure 100 in accordance with some embodiments. FIGS. 2A-1 to 2J-1, 2A-2 to 2J-2, and 2A-3 to 2J-3 illustrate the cross-sectional views of intermediate stages of manufacturing the semiconductor structure 100 shown along line $Y_{SD}$-$Y_{SD}'$ (i.e. in the Y direction), $Y_{MG}$-$Y_{MG}'$ (i.e. in the Y direction), and X-X' (i.e. in the X direction) in FIG. 1C, respectively, in accordance with some embodiments. More specifically, FIGS. 2A-1, 2A-2, and 2A-3 illustrate the cross-sectional views of the intermediate stages of the semiconductor structure 100 shown in FIG. 1C, and FIGS. 2B-1 to 2J-1, 2B-2 to 2J-2, 2B-3 to 2J-3 illustrate the cross-sectional views of the intermediate stages of manufacturing the semiconductor structure 100 afterwards in accordance with some embodiments.

The semiconductor structure 100 may include multi-gate devices and may be included in a microprocessor, a memory, or other IC devices. For example, the semiconductor structure 100 may be a portion of an IC chip that includes various passive and/or active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

A substrate 102 including a first region 10 and a second region 20 is formed, and a semiconductor stack including first semiconductor material layers 106 and second semiconductor material layers 108 is formed over both the first region 10 and the second region 20 of the substrate 102, as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102 to form the semiconductor stack. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although four first semiconductor material layers 106 and three second semiconductor material layers 108 are shown in FIG. 1A, the semiconductor stack may include less or more of the first semiconductor material layers 106 and the second semiconductor material layers 108 alternately stacked. For example, the semiconductor stack may include two to five of the first semiconductor material layers 106 and two to five of the second semiconductor material layers 108.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the first semiconductor material layers 106 and the second semiconductor material layers 108 are formed as the semiconductor stack over the substrate 102, the semiconductor stack is patterned to form a fin structure 104-1 in the first region 10 and a fin structure 104-2 in the second region 20, as shown in FIG. 1B in accordance with some embodiments. The fin structures 104-1 and 104-2 may extend lengthwise in the X direction. In some embodiments, the patterning process includes forming a mask structure 110 over the semiconductor material stack and etching the semiconductor material stack and the underlying substrate 102 through the mask structure 110. In some embodiments, the mask structure 110 is a multilayer structure including a pad oxide layer and a nitride layer formed over the pad oxide layer. The pad oxide layer may be made of silicon oxide, which is formed by thermal oxidation or CVD, and the nitride layer may be made of silicon nitride, which is formed by CVD, such as LPCVD or plasma-enhanced CVD (PECVD). In some embodiments, the fin structures 104-1 and 104-2 include base fin structures 104B and the semiconductor stacks, including the first semiconductor material layers 106 and the second semiconductor material layers 108, formed over the base fin structures 104B.

After the fin structures 104-1 and 104-2 are formed, an isolation structure 116 is formed around the fin structures 104-1 and 104-2, as shown in FIGS. 1C, 2A-1, 2A-2, and 2A-3 in accordance with some embodiments. The isolation structure 116 is configured to electrically isolate active regions (e.g. the fin structures 104-1 and 104-2) of the semiconductor structure and is also referred to as shallow trench isolation (STI) feature in accordance with some embodiments.

More specifically, an insulating layer may be formed around and covering the fin structures 104-1 and 104-2, and the insulating layer may be recessed to form the isolation structure 116 with the fin structures 104-1 and 104-2 protruding from the top surface of the isolation structure 116. In some embodiments, the insulating layer is made of silicon oxide, silicon nitride, silicon oxynitride (SiON), another suitable insulating material, or a combination thereof. In addition, liner layers (not shown) may be formed before forming the insulating layer, and the liner layers may also be recessed with the insulating layer to form the isolation structure 116. In some embodiments, the liner layers include multiple dielectric material layers.

Afterwards, a dummy gate structure 130 is formed across the fin structures 104-1 and 104-2, as shown in FIGS. 2B-1, 2B-2, and 2B-3 in accordance with some embodiments. The dummy gate structure 130 may be used to define the channel regions of the resulting semiconductor structure 100.

In some embodiments, the dummy gate structure 130 includes a dummy gate dielectric layer 132 and a dummy gate electrode layer 134. In some embodiments, the dummy gate dielectric layer 132 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 132 is formed using thermal oxidation, CVD, ALD, physical vapor deposition (PVD), another suitable method, or a combination thereof.

In some embodiments, the dummy gate electrode layer 134 is made of conductive material including polycrystalline-silicon (poly-Si), poly-crystalline silicon-germanium (poly-SiGe), or a combination thereof. In some embodiments, the dummy gate electrode layer 134 is formed using CVD, PVD, or a combination thereof.

In some embodiments, a hard mask layer 136 is formed over the dummy gate electrode layer 134. In some embodiments, the hard mask layer 136 includes multiple layers, such as an oxide layer and a nitride layer. In some embodiments, the oxide layer is silicon oxide, and the nitride layer is silicon nitride.

The formation of the dummy gate structures 130 may include conformally forming a dielectric material as the dummy gate dielectric layers 132. Afterwards, a conductive material may be formed over the dielectric material as the dummy gate electrode layers 134, and the hard mask layer 136 may be formed over the conductive material. Next, the dielectric material and the conductive material may be patterned through the hard mask layer 136 to form the dummy gate structures 130.

After the dummy gate structure 130 is formed, a spacer layer 138 is formed to cover the top surfaces and the sidewalls of the dummy gate structures 130 and the fin structures 104-1 and 104-2, as shown in FIGS. 2C-1, 2C-2, and 2C-3 in accordance with some embodiments. In some embodiments, the spacer layer 138 is made one or more dielectric materials. The dielectric materials may include silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

After the spacer layer 138 is formed, an etching process is performed to form gate spacers 140 and fin spacers 142 with the spacer layer 138 and to form source/drain recesses 144 in the fin structures 104-1 and 104-2, as shown in FIGS. 2D-1, 2D-2, and 2D-3 in accordance with some embodiments. The gate spacers 140 may be configured to separate source/drain structures (formed afterwards) from the dummy gate structure 130, and the fin spacers 142 may be configured to confine the growth of the source/drain structures formed therein.

More specifically, the spacer layer 138 is etched to form the gate spacers 140 on opposite sidewalls of the dummy gate structure 130 and to form the fin spacers 142 covering the sidewalls of the fin structures 104-1 and 104-2 in accordance with some embodiments. In addition, the portions of the fin structures 104-1 and 104-2 not covered by the dummy gate structure 130 and the gate spacers 140 are etched to form the source/drain recesses 144 during the etching process in accordance with some embodiments. The etching process may be an anisotropic etching process, such as dry plasma etching, and the dummy gate structure 130 and the gate spacers 140 may be used as etching masks during the etching process. In some embodiments, the isolation structure 116 is also slightly etched during the etching process.

After the source/drain recesses 144 are formed, the first semiconductor material layers 106 exposed by the source/drain recesses 144 are laterally recessed to form notches 146, as shown in FIGS. 2E-1, 2E-2, and 2E-3 in accordance with some embodiments. In some embodiments, an etching process is performed to laterally recess the first semiconductor material layers 106 of the fin structure 104-1 and 104-2 from the source/drain recesses 144. In some embodiments, during the etching process, the first semiconductor material layers 106 have a greater etching rate (or etching amount) than the second semiconductor material layers 108, thereby forming notches 146 between the adjacent second semiconductor material layers 108. In some embodiments, the second semiconductor material layers 108 are also slightly etched during the etching process, so that the portions of the second semiconductor material layers 108 exposed by the notches 146 become thinner than other portions in accordance with some embodiments. In some embodiments, the etching process is an isotropic etching such as dry chemical etching, remote plasma etching, wet chemical etching, another suitable technique, and/or a combination thereof.

Next, inner spacers 148 are formed in the notches 146 between the second semiconductor material layers 108, as shown in FIGS. 2F-1, 2F-2, and 2F-3 in accordance with some embodiments. The inner spacers 148 may be configured to separate the source/drain structures and the gate structures formed in subsequent manufacturing processes. As described previously, since the second semiconductor material layers 108 are also partially etched when forming the notches 146, the inner spacers 148 formed in the notches 146 are thicker than the thicknesses of the first semiconductor material layers 106 in accordance with some embodiments. In addition, the inner spacers 148 have curved sidewalls in accordance with some embodiments. In some embodiments, the inner spacers 148 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

After the inner spacers 148 are formed, source/drain structures 150-1 and 150-2 are formed in the source/drain recesses 144 of the fin structures 104-1 and 104-2 respectively, as shown in FIGS. 2G-1, 2G-2, and 2G-3 in accordance with some embodiments. The source/drain structures described herein may refer to a source or a drain, individually or collectively dependent upon the context.

In some embodiments, the source/drain structures 150-1 and 150-2 are formed using separated epitaxial growth processes, such as MBE, MOCVD, VPE, other applicable epitaxial growth process, or a combination thereof. In some embodiments, the source/drain structures 150-1 and 150-2 are made of any applicable material, such as Ge, Si, GaAs, AlGaAs, SiGe, GaAsP, SiP, SiC, SiCP, or a combination thereof. In some embodiments, the source/drain structures 150-1 and 150-2 are in-situ doped during the epitaxial growth process. In some embodiments, the source/drain structures 150-1 and 150-2 are doped in one or more implantation processes after the epitaxial growth process.

In some embodiments, the source/drain structures 150-1 and 150-2 are made of materials with different conductivity types. In some embodiments, the source/drain structures 150-1 are n-type source/drain structures, and the source/drain structures 150-2 are p-type source/drain structures. For example, the source/drain structures 150-1 may be the epitaxially grown Si doped with carbon to form silicon: carbon (Si: C) source/drain features, with phosphorous to form silicon: phosphor (Si: P) source/drain features, or with both carbon and phosphorous to form silicon carbon phosphor (SiCP) source/drain features. For example, the source/drain structures 150-2 may be the epitaxially grown SiGe doped with boron (B).

After the source/drain structures 150-1 and 150-2 are formed, a contact etch stop layer (CESL) 160 is conformally formed to cover the source/drain structures 150-1 and 150-2, and an interlayer dielectric (ILD) layer 162 is formed over the contact etch stop layers 160, as shown in FIGS. 2H-1, 2H-2, and 2H-3 in accordance with some embodiments.

In some embodiments, the contact etch stop layer 160 is made of a dielectric materials, such as silicon nitride, silicon oxide, silicon oxynitride, another suitable dielectric material, or a combination thereof. The dielectric material for the contact etch stop layers 160 may be conformally deposited over the semiconductor structure by performing CVD, ALD, other application methods, or a combination thereof.

The interlayer dielectric layer 162 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The interlayer dielectric layer 162 may be formed by chemical vapor deposition (CVD), physical vapor deposition, (PVD), atomic layer deposition (ALD), or other applicable processes.

Figures 2, 2A, 3:
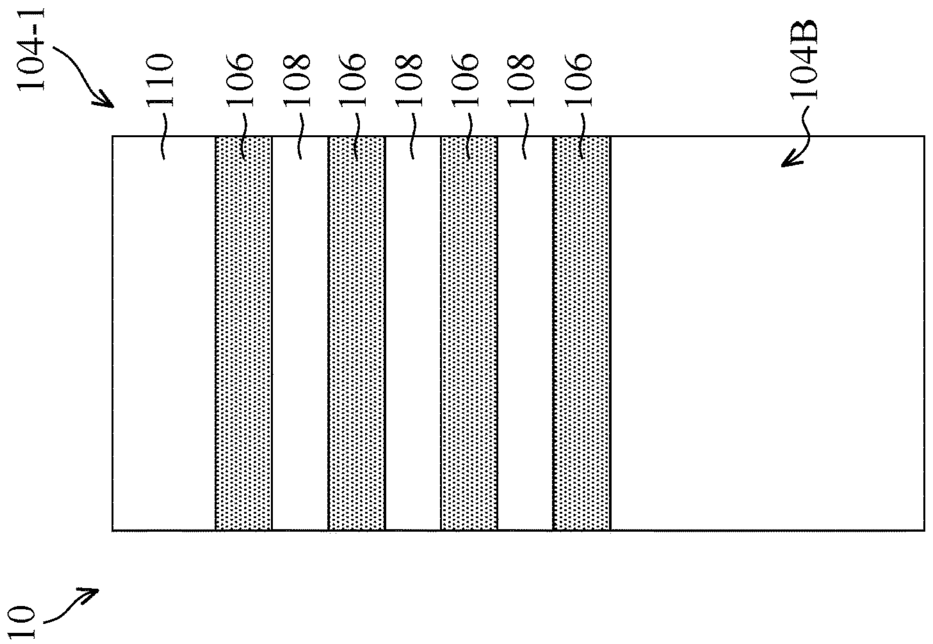
FIGS. 2A-1 to 2J-1, 2A-2 to 2J-2, and 2A-3 to 2J-3 illustrate the cross-sectional views of intermediate stages of manufacturing the semiconductor structure shown along line $Y_{SD}$-$Y_{SD}$' (i.e. in the Y direction), $Y_{MG}$-$Y_{MG}$' (i.e. in the Y direction), and X-X' (i.e. in the X direction) in FIG. 1C, respectively, in accordance with some embodiments.
Figures 2, 2A:
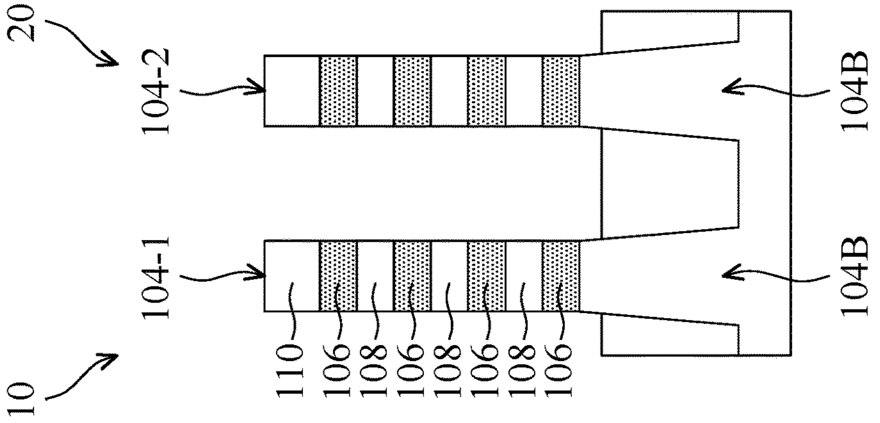
Figures 1, 2A:
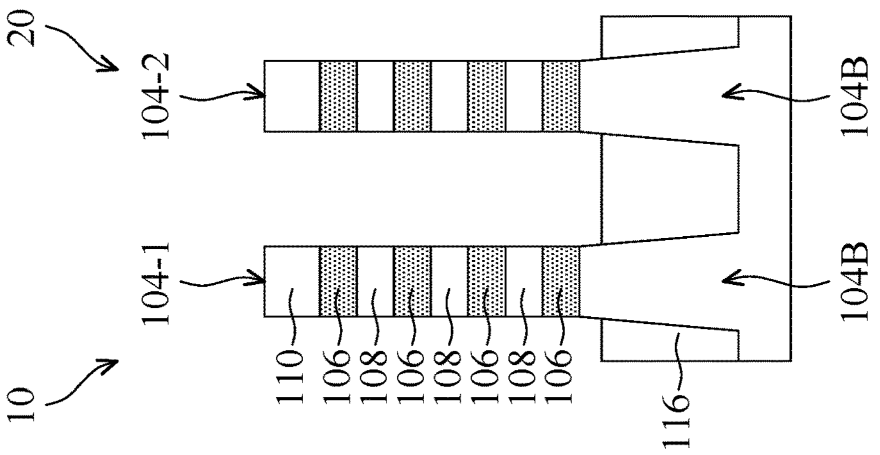
Figures 1, 2B:
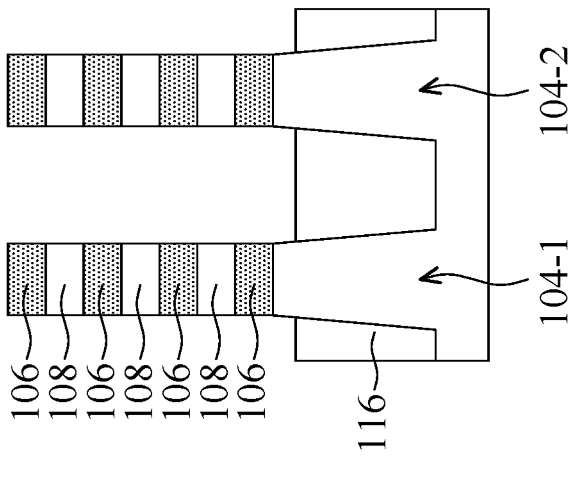
Figures 2, 2B:
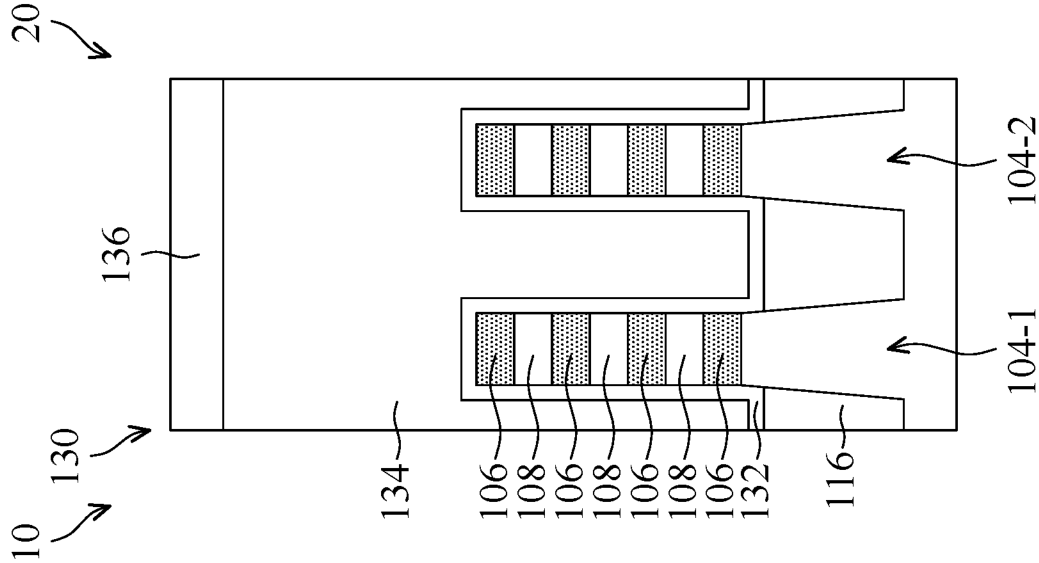
Figures 2, 2B, 3:
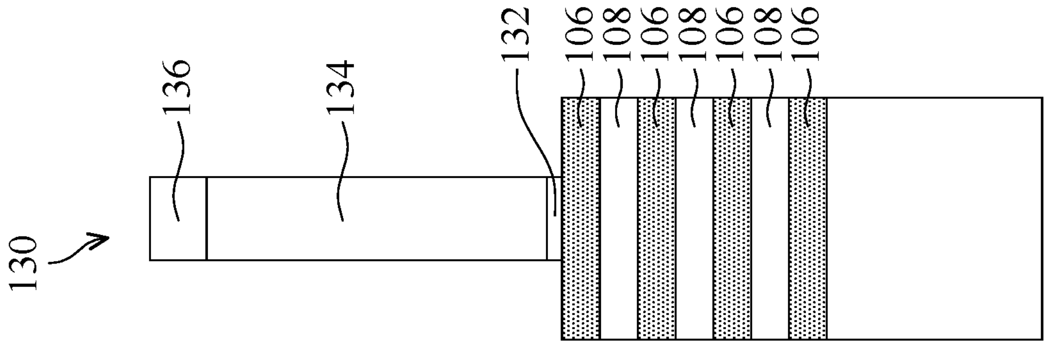
Figures 2, 2C, 3:
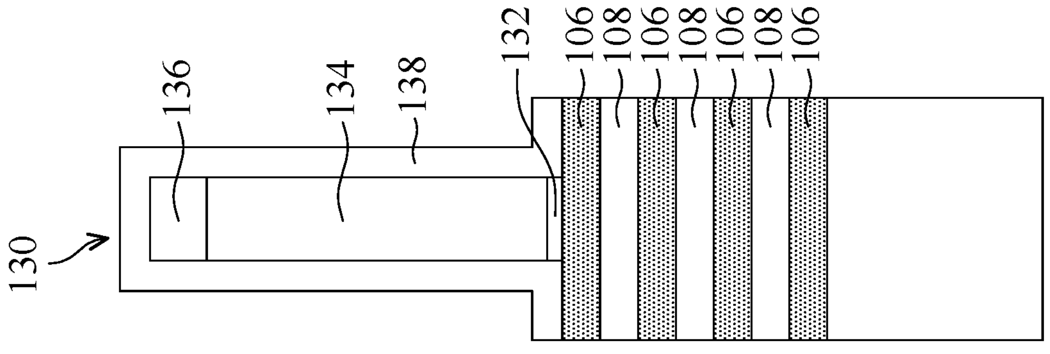
Figures 2, 2C:
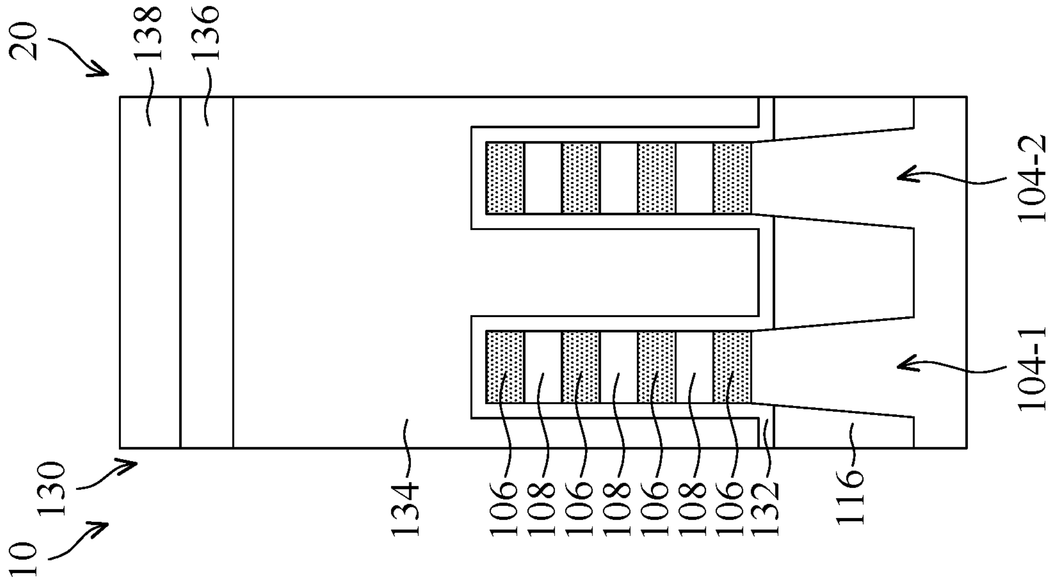
Figures 1, 2C:
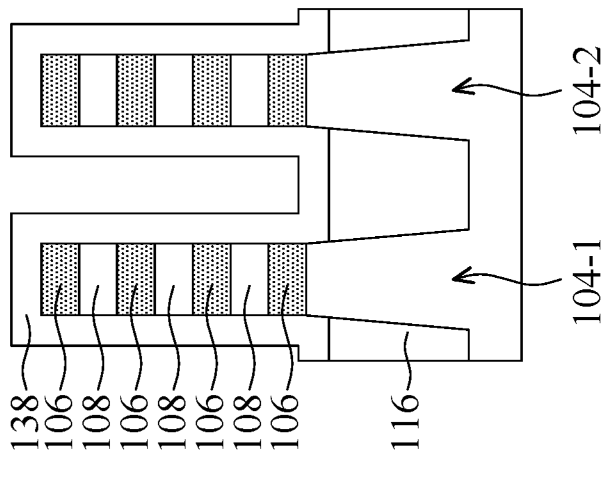
Figures 2, 2D, 3:
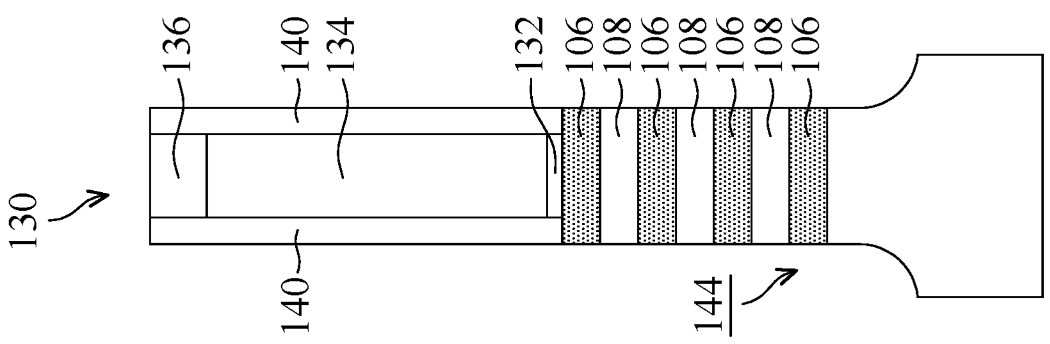
Figures 2, 2D:
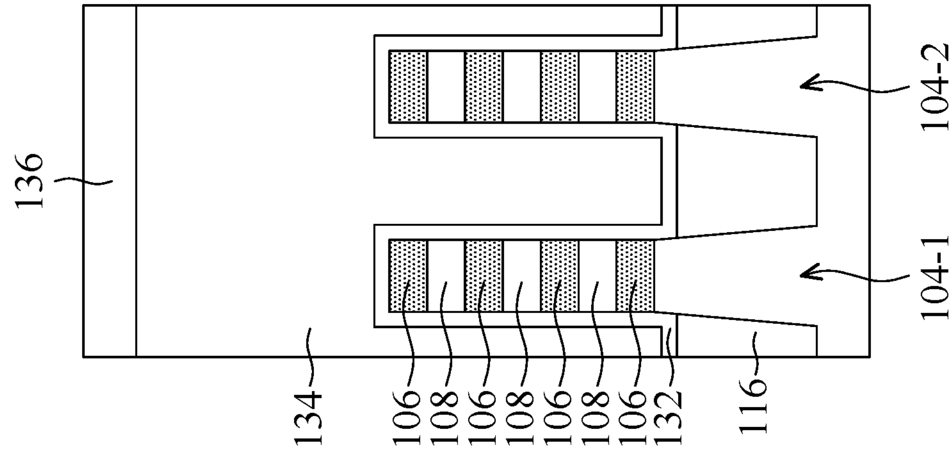
Figures 1, 2D:
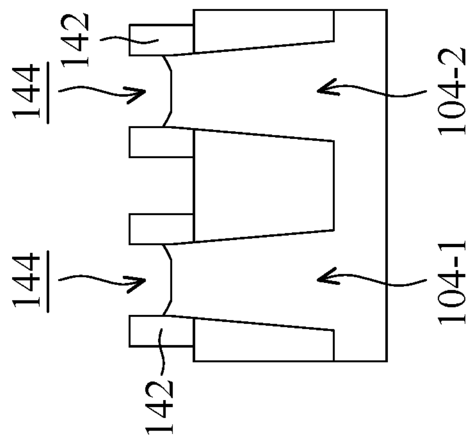
Figures 1, 2E:
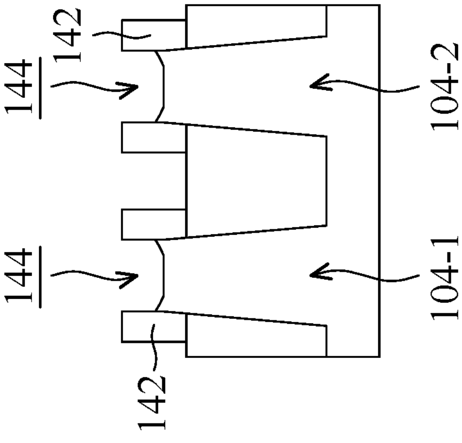
Figures 2, 2E:
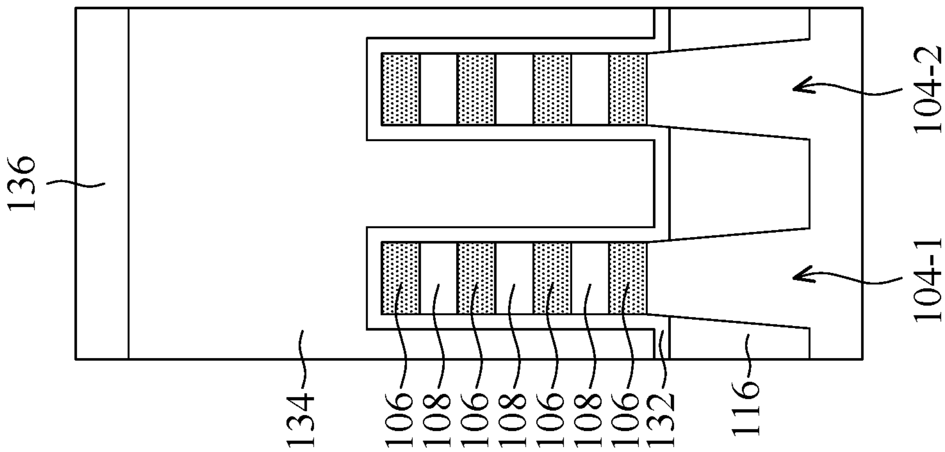
Figures 2, 2E, 3:
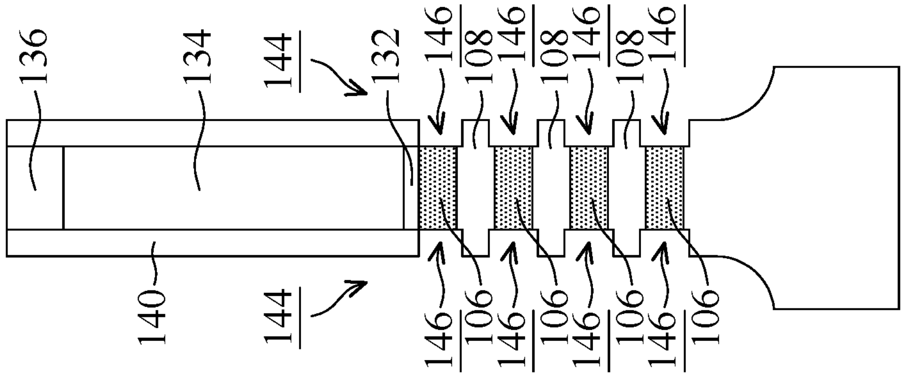
Figures 1, 2F:
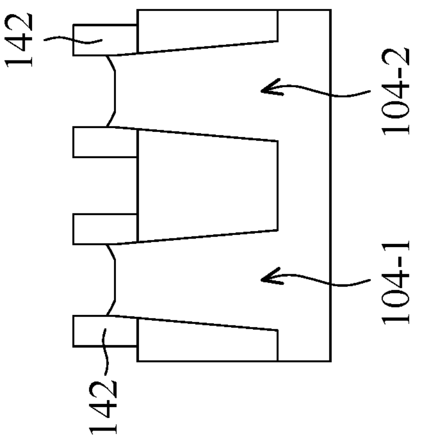
Figures 2, 2F:
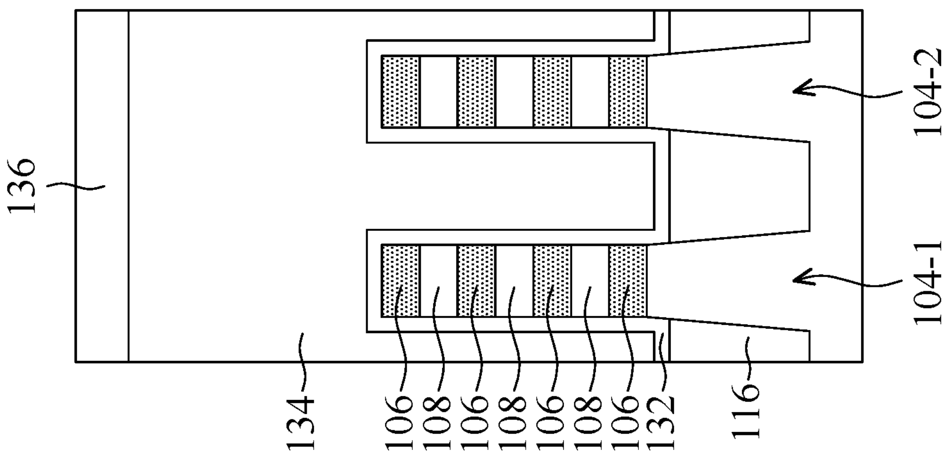
Figures 2, 2F, 3:
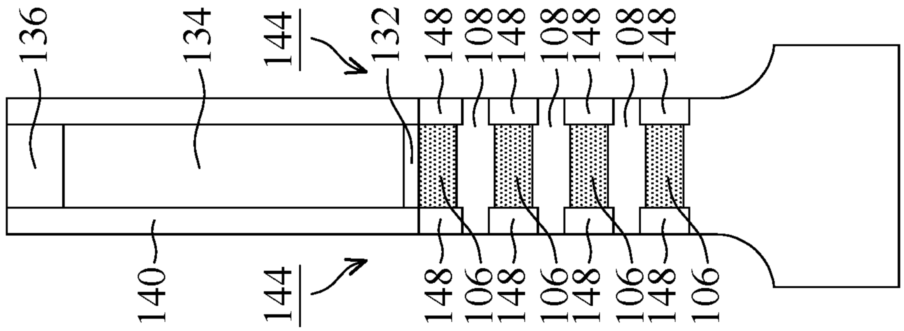
Figures 2, 2G, 3:
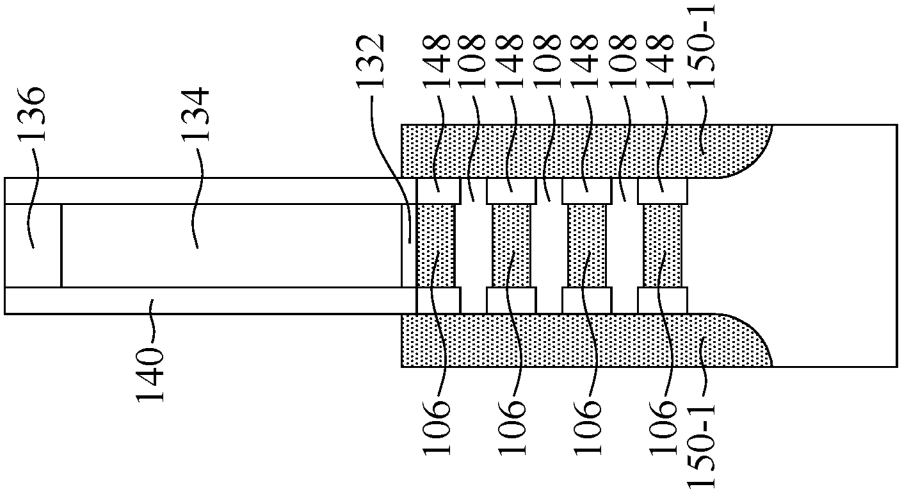
Figures 2, 2G:
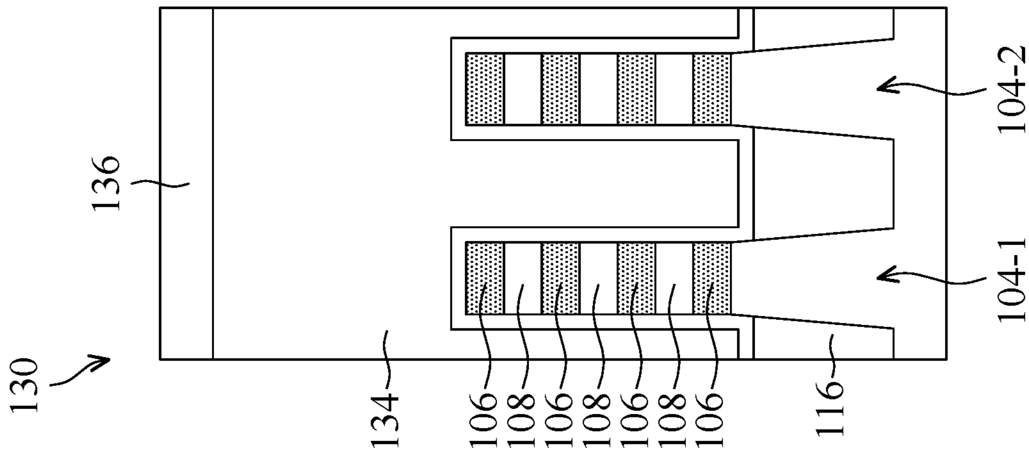
Figures 1, 2G:
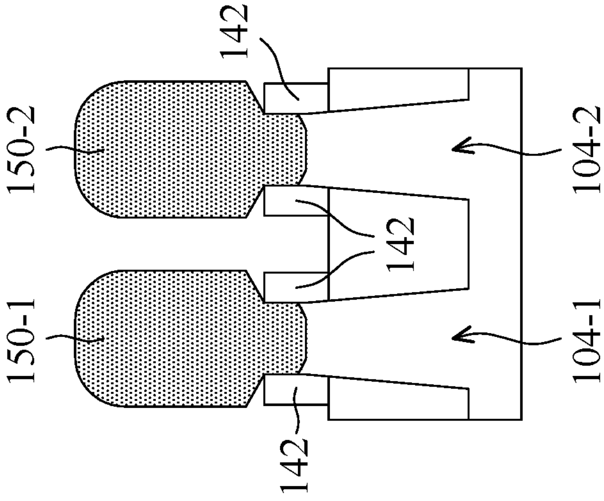
Figures 2, 2H, 3:
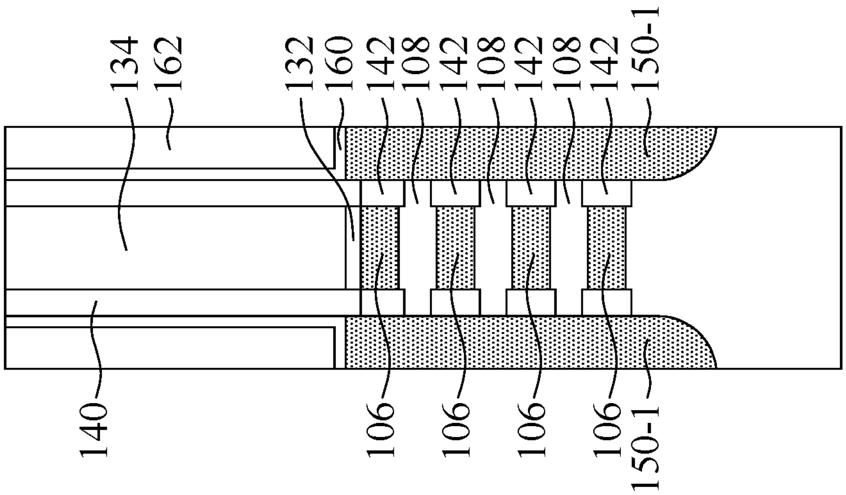
Figures 2, 2H:
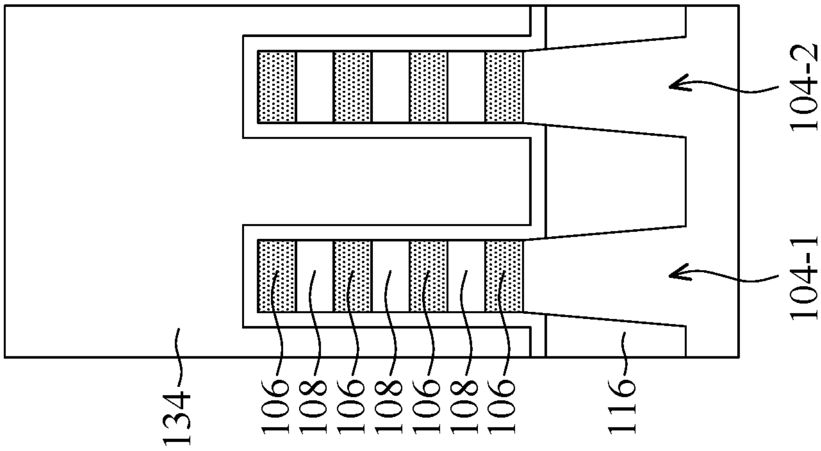
Figures 1, 2H:
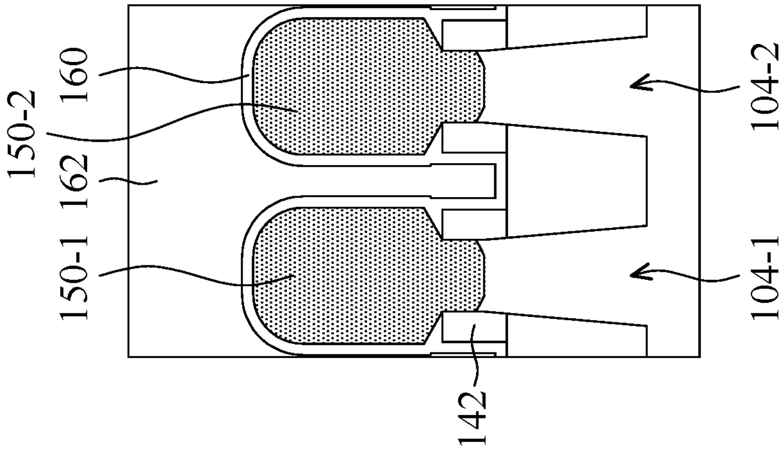

After the contact etch stop layer 160 and the interlayer dielectric layer 162 are deposited, a planarization process such as CMP or an etch-back process is performed until the dummy gate electrode layer 134 is exposed, as shown in FIGS. 2H-2 and 2H-3 in accordance with some embodiments.

Figures 2, 2I, 3:
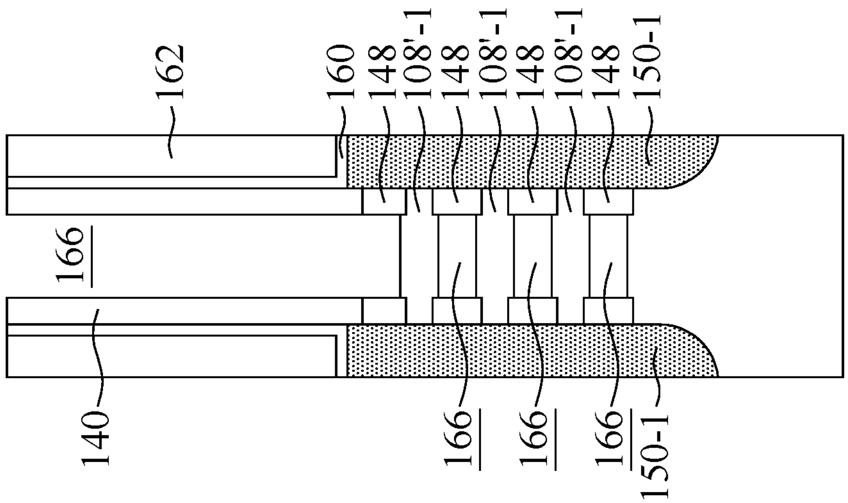
Figures 2, 2I:
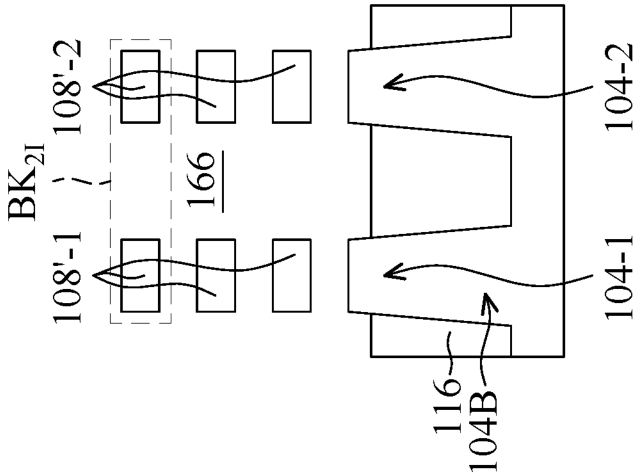
Figures 1, 2I:
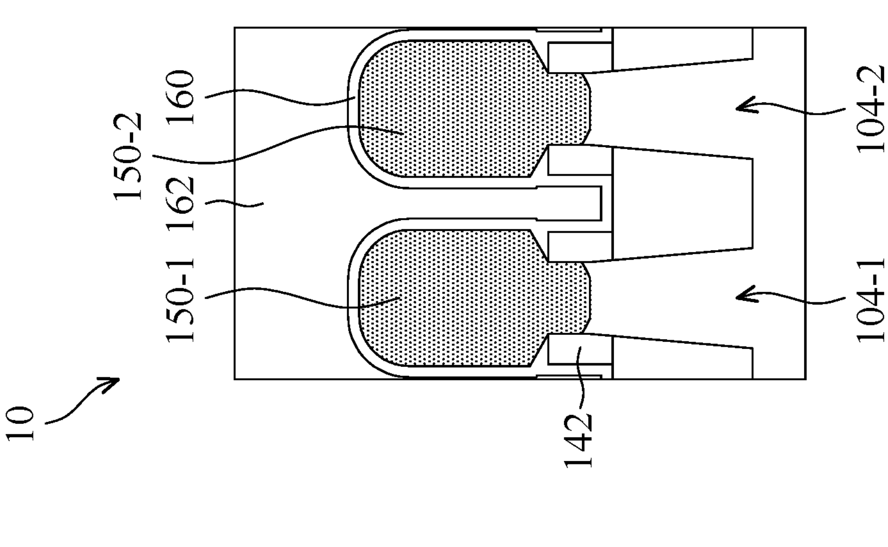

Next, the dummy gate structure 130 and the first semiconductor material layers 106 are removed to form a gate trench 166, as shown in FIGS. 2I-1, 2I-2, and 2I-3 in accordance with some embodiments. More specifically, the dummy gate structure 130 and the first semiconductor material layers 106 are removed to form channel structures (e.g. nanostructures) 108'-1 and 108'-2 with the second semiconductor material layers 108 of the fin structures 104-1 and 104-2 respectively in accordance with some embodiments. As shown in FIG. 2I-3, the channel structures 108'-1 and 108'-2 are vertically suspended over the substrate and spaced apart from each other in the Z direction in accordance with some embodiments. In addition, the channel structures 108'-1 and 108'-2 laterally extend between and interposing the source/drain structures 105-1 and 150-2 respectively in the X direction in accordance with some embodiments. Although not clearly shown in the figures, the channel structures 108'-1 and 108'-2 and the base fin structures 104B may have rounded corners.

The removal process may include one or more etching processes. For example, when the dummy gate electrode layer 134 may be made of polysilicon, a wet etchant such as a tetramethylammonium hydroxide (TMAH) solution may be used to selectively remove the dummy gate electrode layer 134. Afterwards, the dummy gate dielectric layer 132 may be removed using a plasma dry etching, a dry chemical etching, and/or a wet etching. The first semiconductor material layers 106 may be removed by performing a selective wet etching process, such as an APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

After the gate trench 166 is formed, a gate structure 168 is formed in the gate trench 166, as shown in FIGS. 2J-1, 2J-2, and 2J-3 in accordance with some embodiments. FIGS. 3A to 3H illustrate enlarged cross-sectional views of intermediate stages of forming the gate structure 168 of the semiconductor structure 100 (i.e. the regions in the block $BK_{2I}$ shown in FIG. 2I-2) in accordance with some embodiments.

Figure 3A:
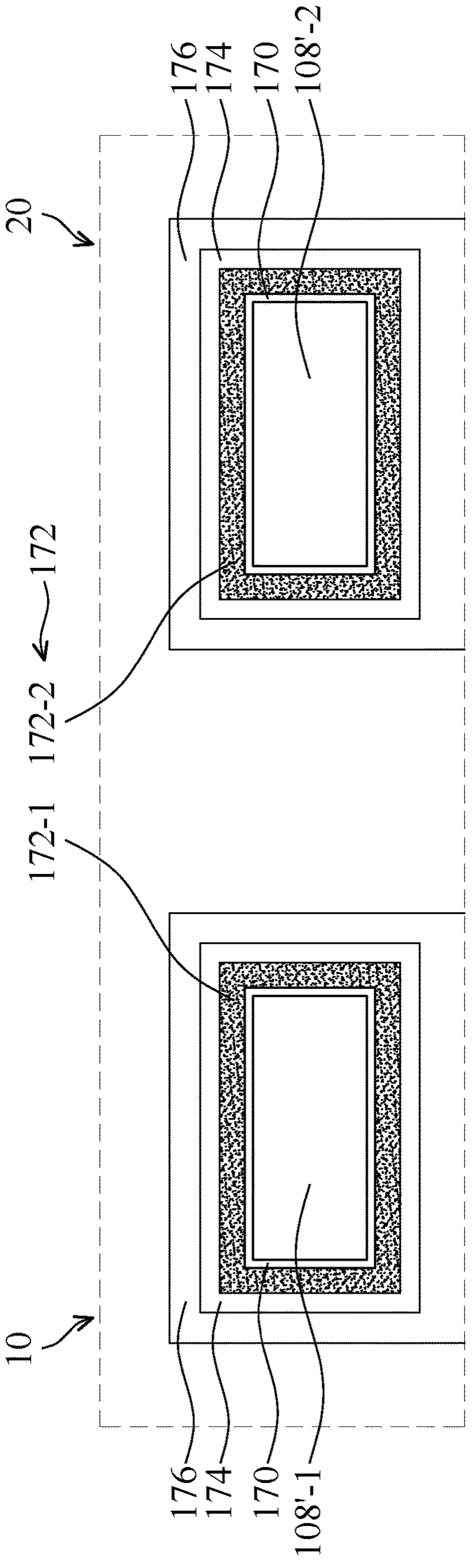
FIGS. 3A to 3H illustrate enlarged cross-sectional views of intermediate stages of manufacturing the gate structure of the semiconductor structure (i.e. the regions in the block $BK_{2I}$ shown in FIG. 2I-2) in accordance with some embodiments.

More specifically, after the channel structures 108'-1 and 108'-2 are formed, an interfacial layer 170, a gate dielectric layer 172, and a dipole layer 174 are formed to wrap the channel structures 108'-1 and 108'-2 and to cover the exposed top portions of the base fin structures 104B of the fin structures 104-1 and 104-2, as shown in FIG. 3A in accordance with some embodiments.

The interfacial layer 170 may be used to improve the interfaces between the channel structures 108'-1 and 108'-2 and dielectric layers formed afterwards. In addition, the interfacial layer 170 may be able to help suppressing the mobility degradation of charge carriers in the channel structures 108'-1 and 108'-2 that serve as channel regions of the transistors. In some embodiments, the interfacial layer 170 is an oxide layer formed by performing a thermal process. In some embodiments, the interfacial layer 170 has a thickness in a range from about 0.5 nm to about 1.5 nm.

After the interfacial layer 170 is formed, the gate dielectric layer 172 is conformally formed to cover the interfacial layers 170 and the bottom surface and the sidewalls of the gate trench 166 in accordance with some embodiments. In some embodiments, the gate dielectric layer 172 includes a first portion 172-1 wrapping around the channel structures 108'-1 and a second portion 172-2 wrapping around the channel structures 108'-2. In some embodiments, the gate dielectric layer 172 is made of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$—$Al_2O_3$ or LaO, other applicable high-k dielectric materials, or a combination thereof. In some embodiments, the gate dielectric layer 172 is formed using CVD, ALD, other applicable methods, or a combination thereof. In some embodiments, the gate dielectric layer 172 has a thickness in a range from about 1 nm to about 2 nm.

After the gate dielectric layer 172 is formed, the dipole layer 174 is formed over and in physical contact with the top surface of the gate dielectric layer 172 in both the first region 10 and the second region 20 in accordance with some embodiments. The dipole layer 174 is configured to modify the gate dielectric layer 172 to augment or reduce the effect of the voltage applied to a gate electrode in turning on or turning off the resulting transistors. That is, the threshold voltages of the resulting transistors may be adjusted. In some embodiments, the dipole layer 174 includes a metal element such as La, Y, Al, Sr, Er, Zn, Sc, Ti, Nb, or the like. In some embodiments, the dipole layer 174 has a thickness in a range from about 0.5 nm to about 2.5 nm.

After the interfacial layer 170, the gate dielectric layer 172, and the dipole layer 174 are formed to wrap the channel structures 108'-1 and 108'-2, a hard mask layer 176 is formed to cover the channel structures 108'-1 and 108'-2 in both the first region 10 and the second region 20, as shown in FIG. 3A in accordance with some embodiments. In some embodiments, the spaces between neighboring stacked channel structures 108'-1 and the spaces between neighboring stacked channel structures 108'-2 are completely filled with the hard mask layer 176 in accordance with some embodiments. In some embodiments, the hard mask layer 176 is made of oxides or nitrides, such as $SiO_x$, $AlO_x$, $ZrO_2$, SiN, TiN, or the like. In some embodiments, the hard mask layer 176 has a thickness in a range from about 1 nm to about 5 nm.

Figure 3B:
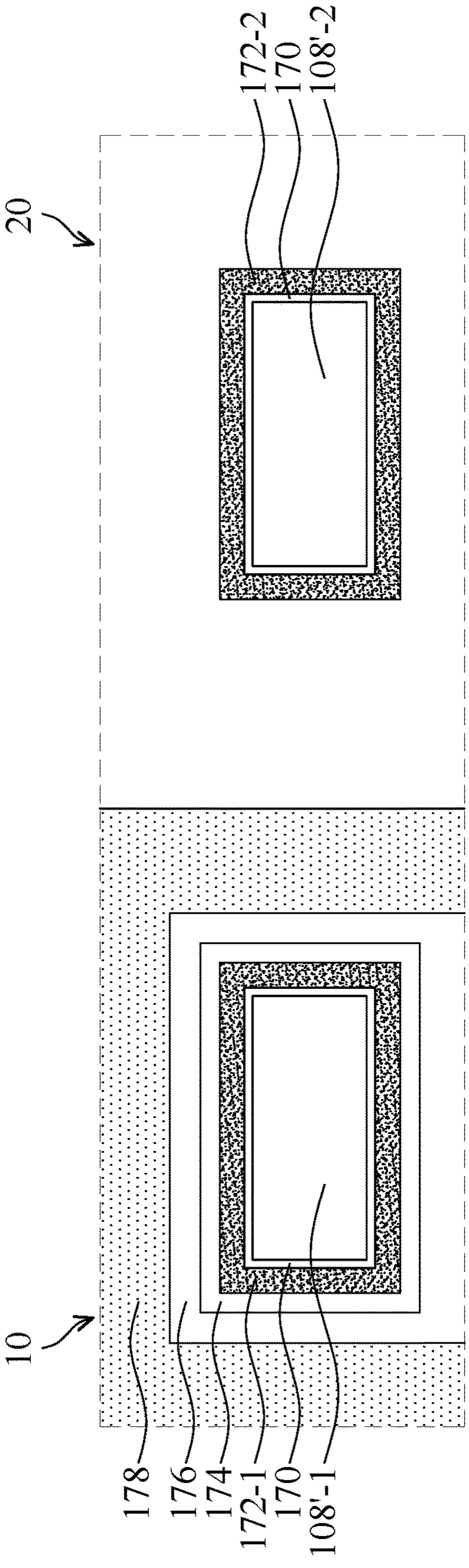
Figure 3C:
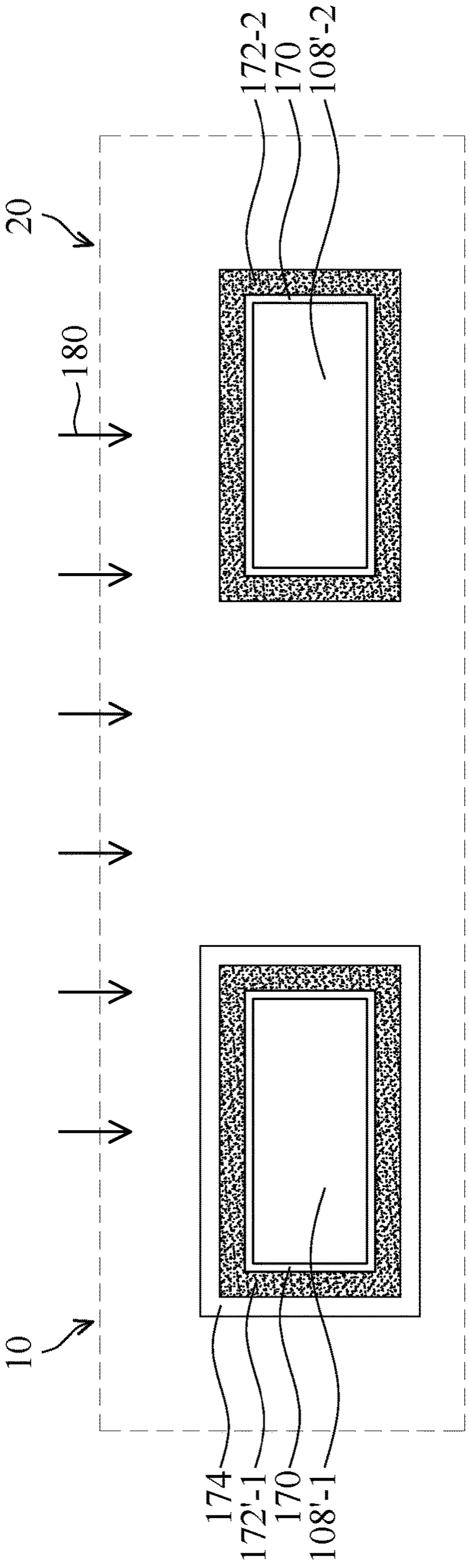

Next, a photoresist layer 178 is formed to cover the structure in the first region 10, and the hard mask layer 176 and the dipole layer 174 in the second region 20 not covered by the photoresist layer 178 are removed, as shown in FIG. 3B in accordance with some embodiments. After the dipole layer 174 in the second region 20 is removed, the photoresist layer 178 at the first region 10 is also removed, and a treatment process 180 is performed to form a modified first portion 172'-1 of the gate dielectric layer 172 in the first region 10, as shown in FIG. 3C in accordance with some embodiments. More specifically, the metal elements of the dipole layer 174 is driven (e.g. diffuse) into the first portion 172-1 of the gate dielectric layer 172 in the first region 10 to form the modified first portion 172'-1. The metal elements driven into the first portion 172-1 of gate dielectric layer 172 cause a dipole effect that augments or reduces the effect of the voltage applied to a gate electrode in turning on or turning off the transistor formed in the first region 10. That is, the effective work function of the resulting transistor is modulated, thereby increasing or decreasing the threshold voltage of the transistor formed in the first region 10. In some embodiments, by treating the first portion 172-1 of the gate dielectric layer 172 with the metal elements of the dipole layer 174 in the first region 10, the threshold voltage of the resulting transistor in the first region 10 is different from the threshold voltage of the resulting transistor in the second region 20.

Meanwhile, since the dipole layer 174 in the second region 20 has been removed before the treatment process 180, the second portion 172-2 of the gate dielectric layer 172 in the second region 20 is not treated (e.g. modified), and therefore the threshold voltage of the transistor in the second region 20 is different from the threshold voltage of the transistor in the first region 10 in accordance with some embodiments.

In some embodiments, the treatment process 180 is an annealing process. In some embodiments, the annealing process is performed at a temperature in a range of about 400° C. to about 1000° C. In some embodiments, the annealing process is performed for about 0.5 sec to about 30 sec.

Figure 3D:
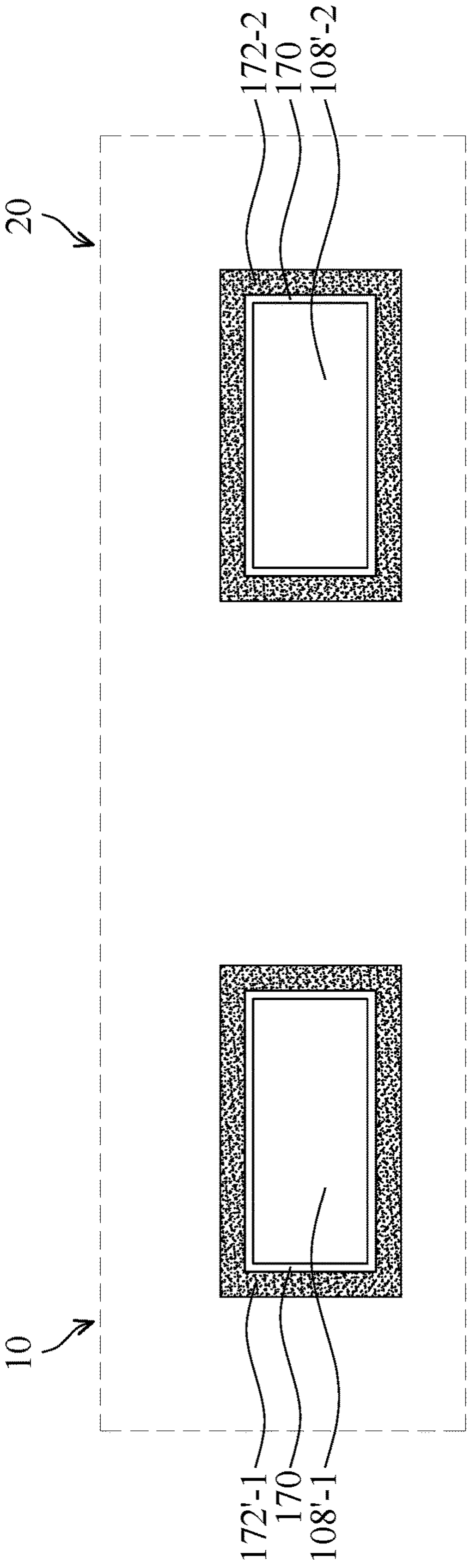

After the treatment process 180 is performed, the dipole layer 174 in the first region 10 is removed, as shown in FIG. 3D in accordance with some embodiments. The dipole layer 174 may be removed by performing an etching process, such as a dry etching process or a wet etching process.

Figure 3E:
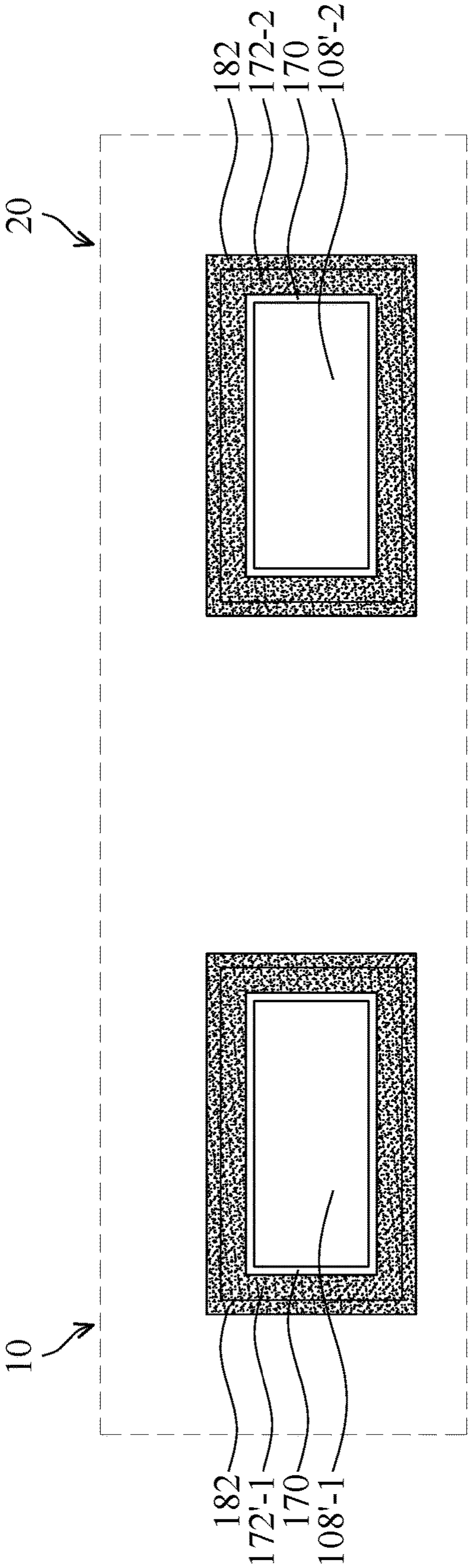

Next, an additional gate dielectric layer 182 is formed over the modified first portion 172'-1 of the gate dielectric layer 172 in the first region 10 and over the second portion 172-2 of the gate dielectric layer 172 in the second region 20, as shown in FIG. 3E in accordance with some embodiments. As described previously, the first portion 172-1 of the gate dielectric layer 172 is treated to adjust the threshold voltage of the resulting transistor in accordance with some embodiments. However, if the gate dielectric layer 172 is too thick, the modification of the first portion 172-1 of the gate dielectric layer 172 may be challenging. On the other hand, if the gate dielectric layer in the gate structure is not thick enough, the risk of electric leakage may be increased. Accordingly, a relatively thin gate dielectric layer 172 (i.e. being closely attached to the channel structures 108'-1) is formed and treated first to form the modified first portion 172'-1 of the gate dielectric layer 172, and the additional gate dielectric layer 182 is formed over the gate dielectric layer 172, so that the combination of the gate dielectric layers 172 and 182 may achieve the desired thickness.

In some embodiments, the sum of the thickness of the gate dielectric layer 172 and the thickness of the gate dielectric layer 182 is in a range from about 1 nm to about 5 nm. In some embodiments, the gate dielectric layer 182 is thinner than the gate dielectric layer 172. In some embodiments, the gate dielectric layer 182 is made of a dielectric material the same as that the gate dielectric layer 172 is made of, but the gate dielectric layer 182 does not contain the metal elements of the dipole layer 174.

In some embodiments, the gate dielectric layer 182 is made of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. In some embodiments, the gate dielectric layer 182 is formed using CVD, ALD, other applicable methods, or a combination thereof.

Figure 3F:
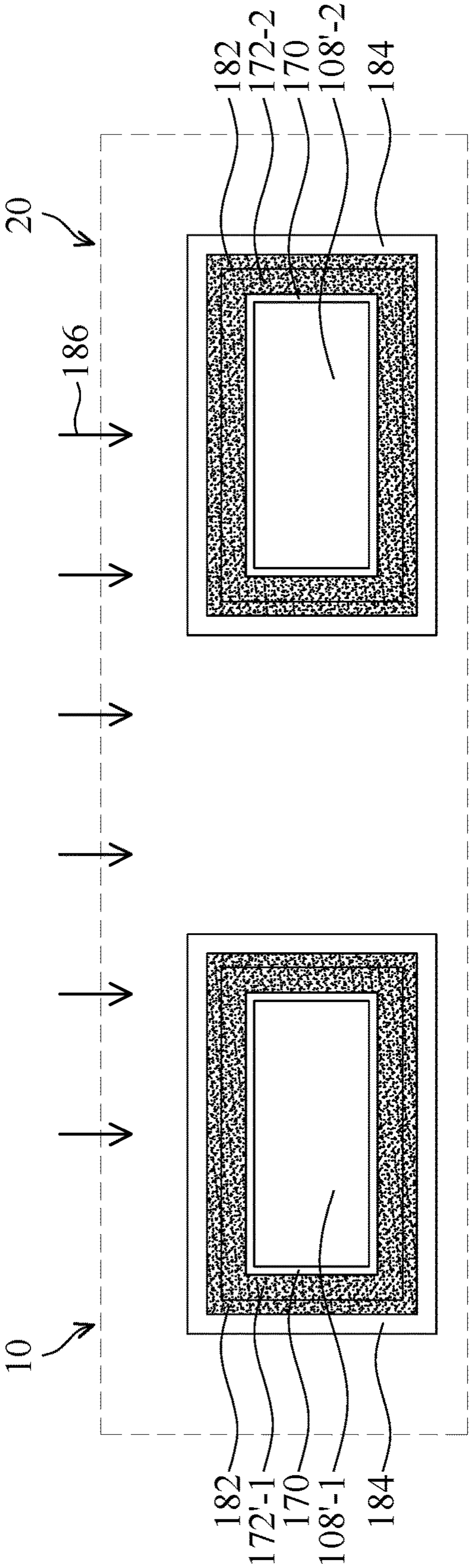

After the gate dielectric layer 182 is formed, a cap layer 184 is formed over the gate dielectric layer 182, and a post deposition annealing process 186 is performed, as shown in FIG. 3F in accordance with some embodiments. Since the gate dielectric layer 182 and the gate dielectric layer 172 are covered by the cap layer 184 during the post deposition annealing process 186, the gate dielectric layer 182 and the gate dielectric layer 172 can be densified during the post deposition annealing process 186. In some embodiments, the gate dielectric layers 172 and the gate dielectric layer 182 are made of the same dielectric material, and therefore no interface is shown between them after the post deposition annealing process 186 is performed. That is, the gate dielectric layers 172 and the gate dielectric layer 182 may form a gate dielectric structure having a first portion wrapping around the channel structures 108'-1 and a second portion wrapping around the channel structures 108'-2. In addition, a lower portion of the first portion of the gate dielectric structure (i.e. the modified first portion 172'-1 of the gate dielectric layer 172) includes the metal elements of the dipole layer 174, while an upper portion of the first portion and the whole second portion of the gate dielectric structure (i.e. the second portion 172-1 of the gate dielectric layer 172 and the gate dielectric layer 182) does not include the metal elements of the dipole layer 174 in accordance with some embodiments. In some embodiments, the concentration of the first metal element in the lower portion of the first portion of the gate dielectric layer is greater than the concentration of the first metal element in the upper portion of the first portion of the gate dielectric layer.

In some embodiments, the cap layer 184 is made of a metal containing material including a metal such as Ti, Ta, or the like. In some embodiments, the metal containing material further includes N and/or Si. In some embodiments, the cap layer 184 is made of TiN. In some embodiments, the cap layer 184 has a thickness in a range from about 1 nm to about 3 nm. In some embodiments, the post deposition annealing process 186 is performed at a temperature in a range from about 800° C. to about 1000° C. In addition, since the threshold voltage of the resulting transistor in the first region 10 can be achieved by the modification of the gate dielectric layer 172, the cap layer 184 may not need to be removed after the post deposition annealing process 186. Therefore, the gate dielectric layer 182 under the cap layer 184 will not be damaged due to the removal of the cap layer 184. Furthermore, the cap layer 184 may help to capture the oxygen in the interfacial layer 170, and therefore the interfacial layer 170 may become thinner.

Figure 3G:
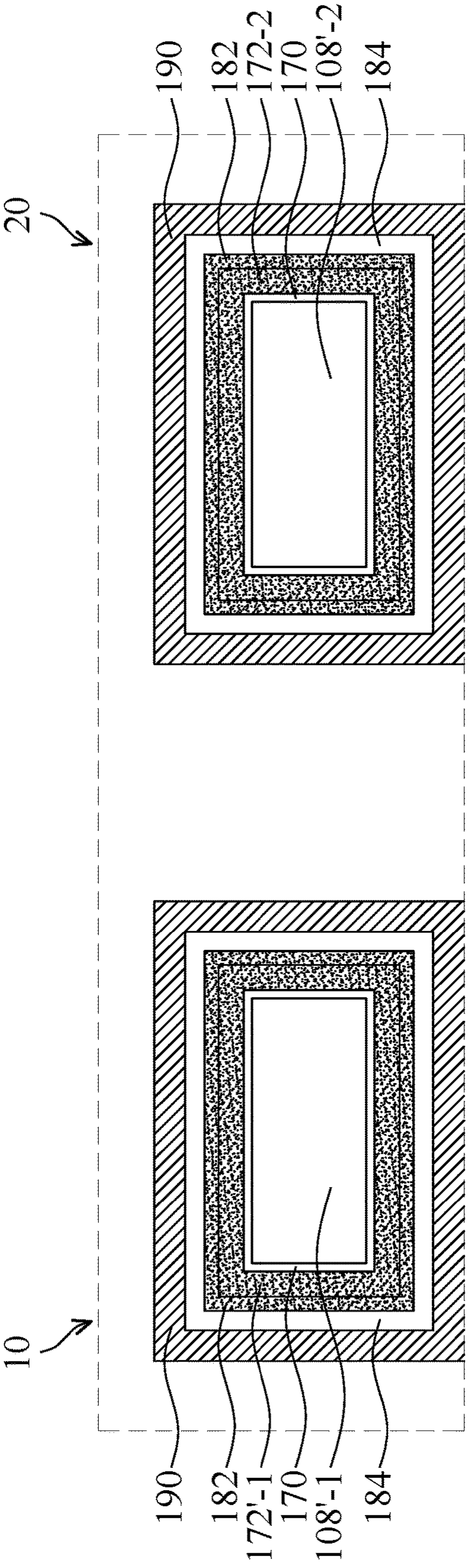

After the post deposition annealing process 186 is performed, a work function metal layer 190 is formed over the cap layer 184 in both the first region 10 and the second region 20, as shown in FIG. 3G in accordance with some embodiments. More specifically, the channel structures 108'-1 in the first region 10 and the channel structures 108'-2 in the second region 20 are both wrapped by the work function metal layer 190 in accordance with some embodiments. In some embodiments, the work function metal layer 190 is a p-type work function metal layer. In some embodiments, the work function metal layer 190 is made of titanium nitride, tantalum nitride, tungsten nitride, tantalum, or the like. As described previously, since the threshold voltage of the resulting transistor in the first region 10 can be adjusted by the modification of the gate dielectric layer 172, the resulting transistors in the first region 10 and the second regions 20 can have different threshold voltages without forming addition work function metal layers (e.g. additional n-type work function metal layers).

After the work function metal layer 190 is formed, a gate filling layer 192 is formed to completely fill the gate trench 166, and a polishing process is performed until the interlayer dielectric layer 162 is exposed, as shown in FIGS. 3H, 2J-1, 2J-2, 2J-3, 2J-4, and 2J-5 in accordance with some embodiments.

In some embodiments, the gate filling layer 192 are formed over the work function metal layer 190. In some embodiments, the gate filling layer 192 is made of a conductive material, such as tungsten, titanium, tantalum, cobalt, copper, or the like. In some embodiments, the gate filling layer 192 is formed using CVD, ALD, electroplating, another applicable method, or a combination thereof. In some embodiments, the polishing process is a CMP process. In some embodiments, the gate filling layer 192 includes tungsten and fluorine. In some embodiments, the fluorine in the gate filling layer 192 diffuses into the work function metal layer 190 and the gate dielectric layers 182 and 172. The risk of leakage of the gate dielectric layers 182 and 172 may be reduced due to the fluorine diffused therein.

Figures 2, 2J, 3:
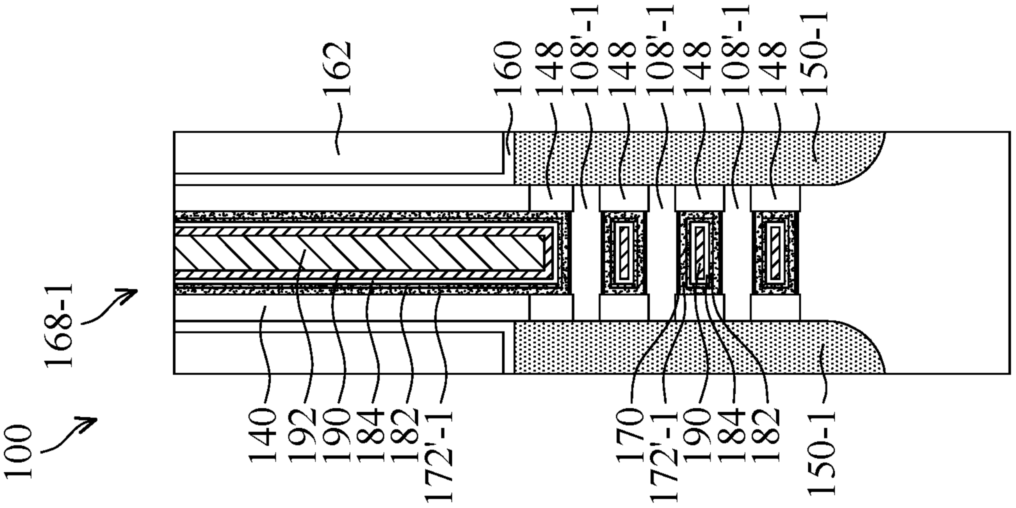
Figures 2, 2J:
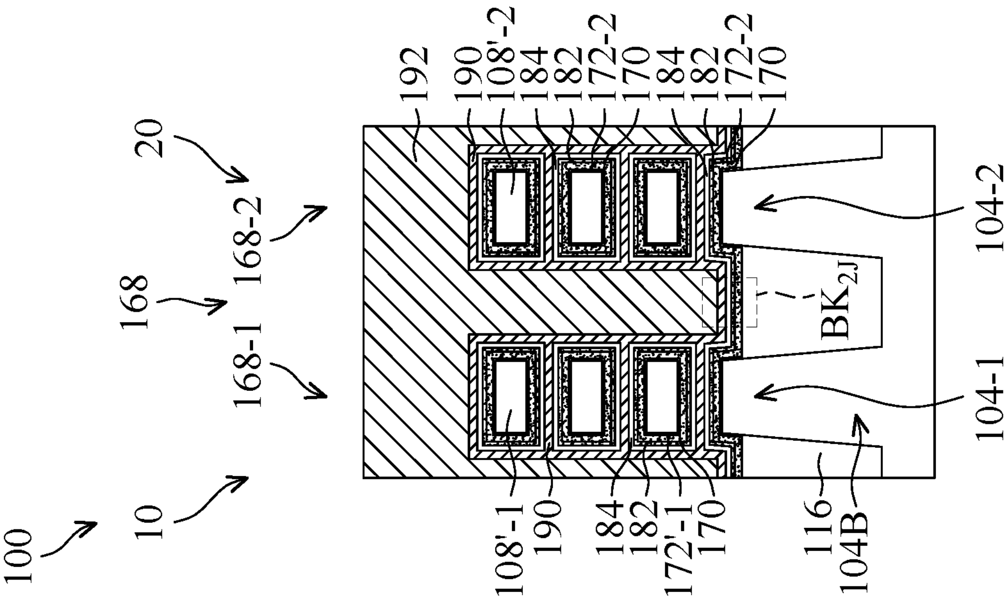
Figures 1, 2J:
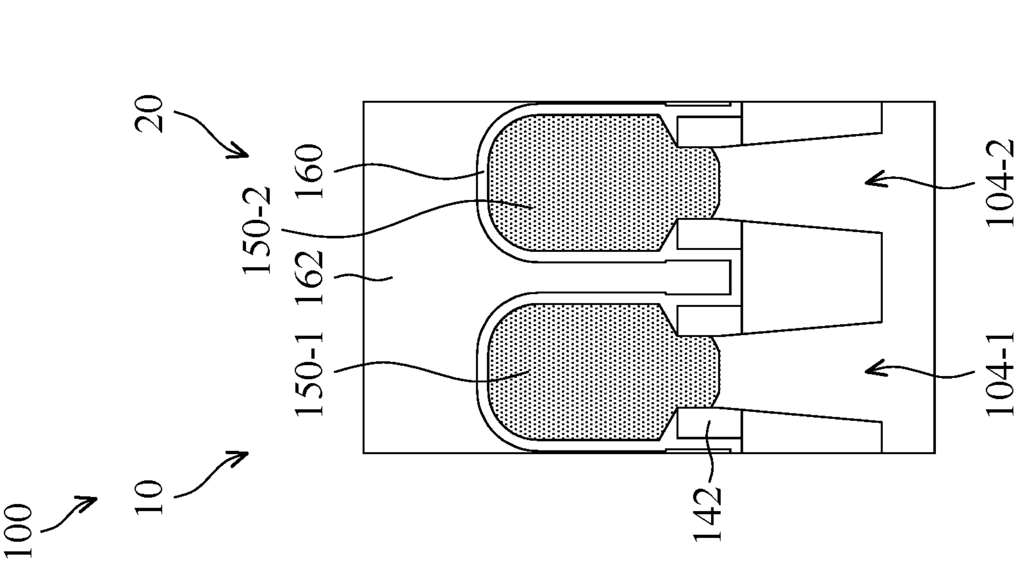

FIG. 2J-4 illustrates an enlarged cross-sectional view of the semiconductor structure 100 of block $BK_{2J}$ shown in FIG. 2J-2 in accordance with some embodiments. FIG. 2J-5 illustrates a diagrammatic top view of the semiconductor structure 100 in accordance with some embodiments. FIG. 2J-5 has been simplified for the sake of clarity to better understand the inventive concepts of the present disclosure. Additional features may be included in the semiconductor structure 100, and some of the features described below may be replaced, modified, or eliminated.

As shown in FIG. 2J-5, the semiconductor structure 100 includes a transistor T-1 in the first region 10 and a transistor T-2 in the second region 20 in accordance with some embodiments. In addition, the gate structure 168 extends over both the channel structures 108'-1 of the fin structure 104-1 in the first region 10 and the channel structures 108'-2 of the fin structure 104-2 in the second region 20 and is longitudinally oriented along the Y direction in accordance with some embodiments. In some embodiments, the transistor T-1 is an n-type transistor and the transistor T-2 is a p-type transistor.

In some embodiments, the transistor T-1 includes the channel structures 108'-1 separated from each other along Z direction, the source/drain structures 150-1 (e.g. n-type source/drain structures) attached to opposite sides of the channel structures 108'-1, and a first portion 168-1 of the gate structure 168 wrapping around the channel structures 108'-1. Similarly, the transistor T-2 includes the channel structures 108'-2, the source/drain structures 150-2 (e.g. p-type source/drain structures) attached to opposite sides of the channel structures 108'-2, and a second portion 168-2 of the gate structure 168 wrapping around the channel structures 108'-2.

As described previously, although the transistors T-1 and T-2 have different conductivity types and different threshold voltages, both the first portion 168-1 and the second portion 168-2 of the gate structure 168 have the same and single work function metal layer 190 (e.g. p-type work function metal layer) and the same gate filling layer 192 in accordance with some embodiments. In some embodiments, the distance between the gate filling layer 192 and a top surface of a topmost structure of the channel structures 108'-1 in the Z direction is substantially equal to the distance between the gate filling layer 192 and a top surface of a topmost structure of the channel structures 108'-2 in the Z direction.

In some embodiments, the work function metal layer 190 and the gate filling layer 192 continuously extend from the transistor T-1 in the first region 10 to the transistor T-2 in the second region 20. That is, there are no different types of work function metal layers stacked on each other, nor boundaries of two kinds of work function metal layers at the boundary of the transistors T-1 and T-2 in accordance with some embodiments. Therefore, the boundary effect due to metal diffusion in different types of the work function metal layers may be prevented.

In addition, the threshold voltages of the transistors T-1 and T-2 may be different from each other by forming the modified first portion 172'-1 of the gate dielectric layer 172. In some embodiments, the gate dielectric layer 172 is an oxide layer, and therefore the metal elements therein will not be easily diffused. That is, although the modified first portion 172'-1 of the gate dielectric layer 172 in the first region 10 and the second portion 172-2 of the gate dielectric layer 172 in the second region 20 have a boundary therebetween, as shown in FIG. 2J-5, the boundary effect may not occur or may be less serious.

Furthermore, since the threshold voltages of the transistors T-1 and T-2 are tuned by treating the first portion 172-1 of the gate dielectric layer 172, the formation of multiple work function metal layers may no longer required. That is, there may be more the space for forming the gate filling layer 192, and the performance of the transistors T-1 and T-2 may therefore be improved.

Figure 3H:
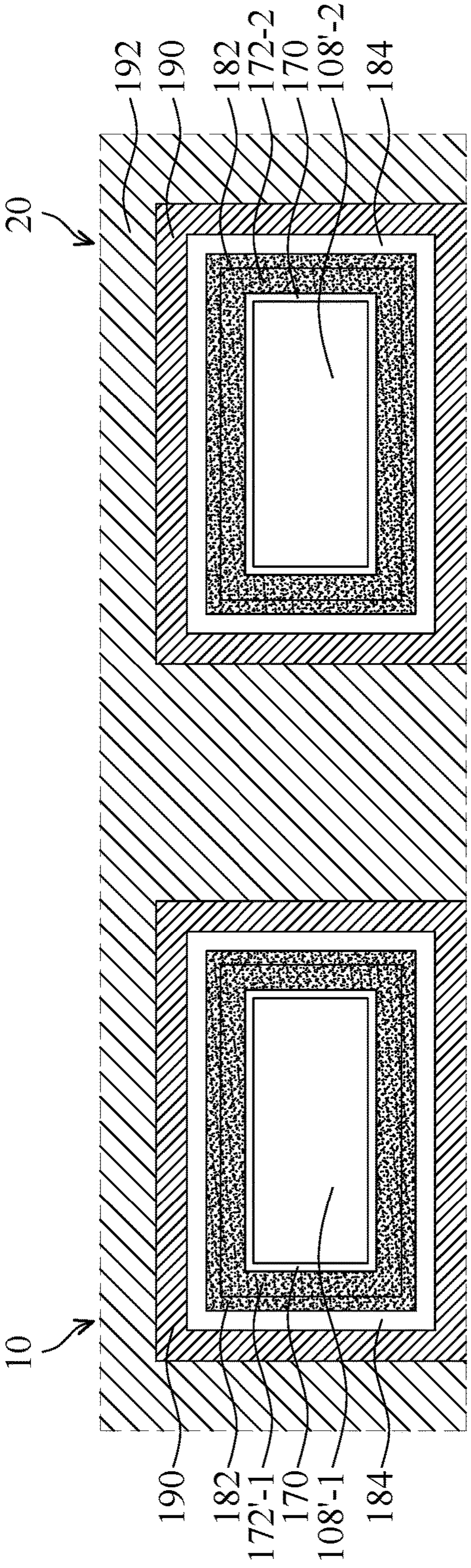
Figure 3H:
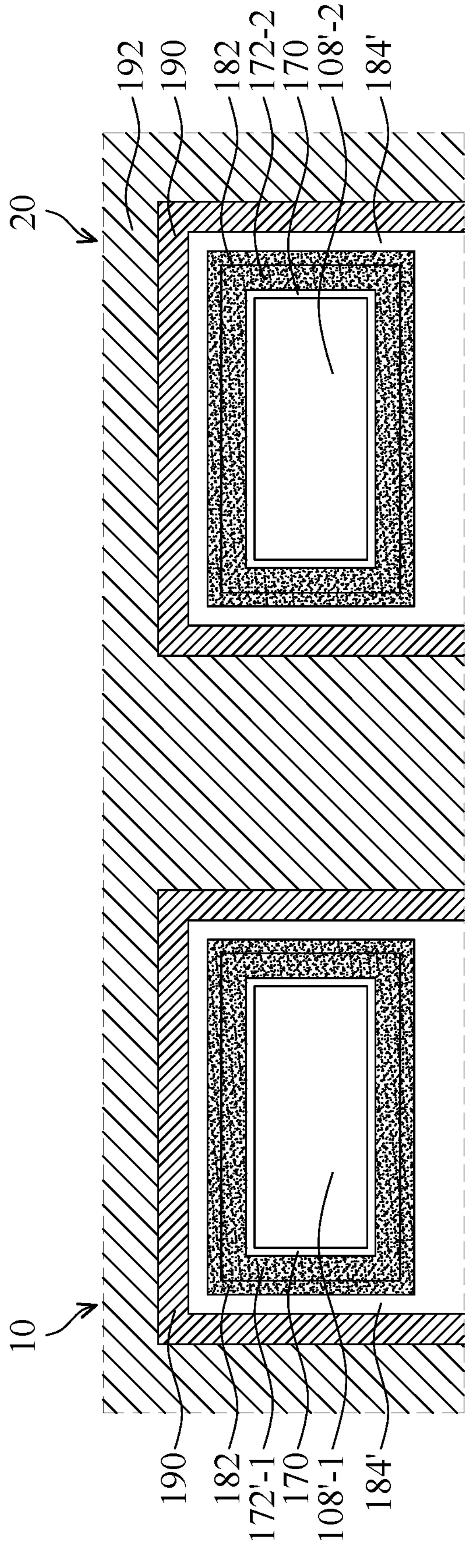

FIGS. 2J'-2 and 2J'-3 illustrate the cross-sectional views of an semiconductor structure 100' shown along line $Y_{MG}$-$Y_{MG}$' (i.e. in the Y direction) and X-X' (i.e. in the X direction) in FIG. 1C, respectively, in accordance with some embodiments. FIG. 3H' illustrates the enlarged cross-sectional view of the semiconductor structure 100' in accordance with some embodiments. The semiconductor structure 100' may be similar to the semiconductor structure 100 described previously, except the cap layer 184 between the channel structures 108'-1 and 108'-2 is merged in accordance with some embodiments. That is, the work function metal layer 190 does not extend between the channel structures 108'-1 and 108'-2 in accordance with some embodiments. In some embodiments, the thickness of the cap layer 184 in the semiconductor structure 100' is greater than about 3 nm. Processes and materials for forming the semiconductor structure 100' may be similar to, or the same as, those for forming the semiconductor structure 100 described previously and are not repeated herein.

Figure 4A:
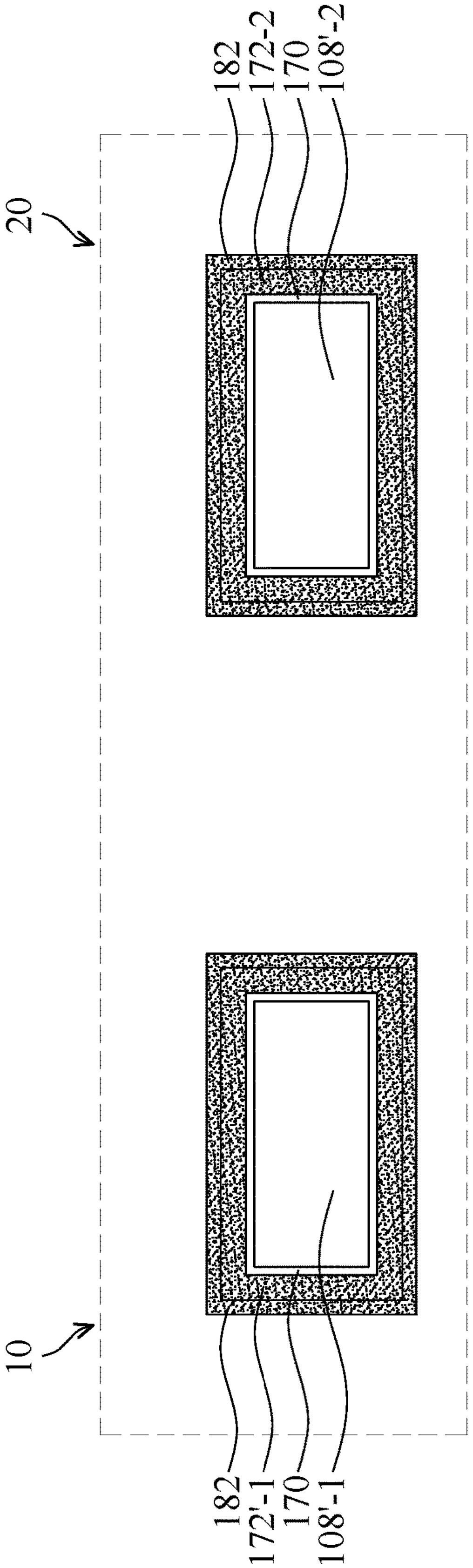
FIGS. 4A and 4B illustrate enlarged cross-sectional views of intermediate stages of manufacturing a semiconductor structure in accordance with some embodiments.
Figure 4B:
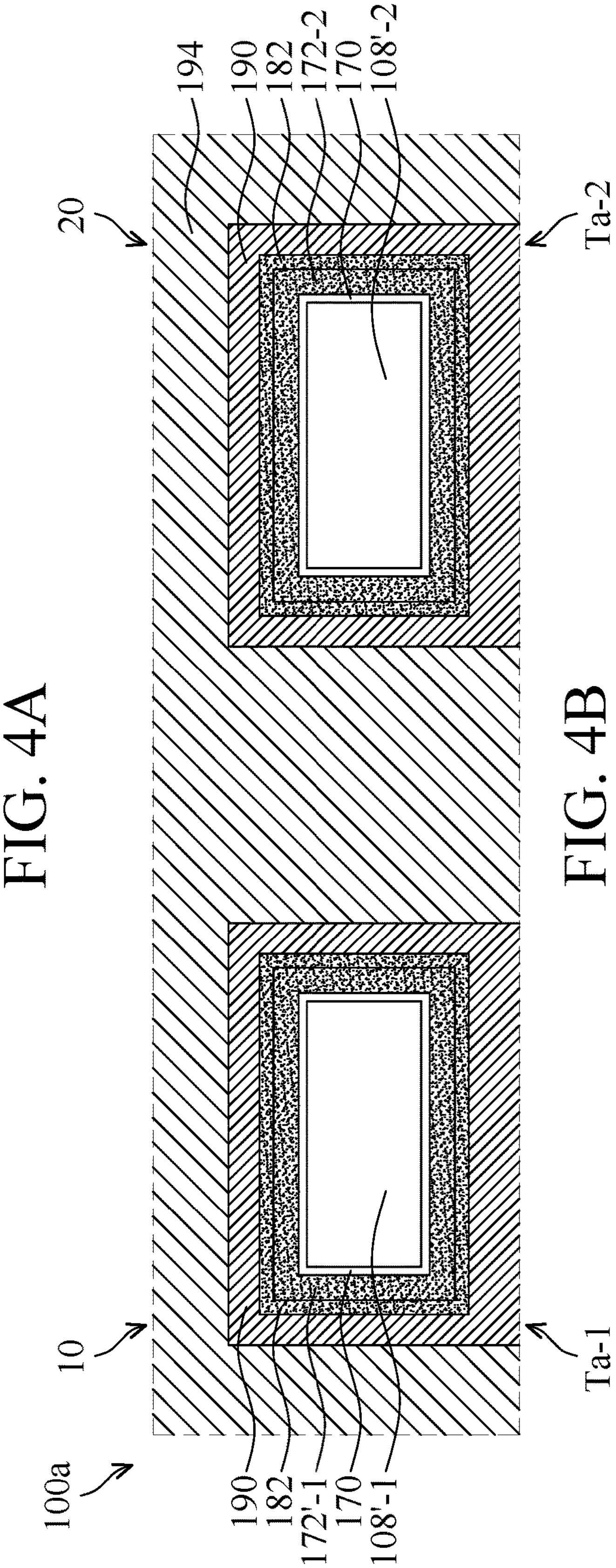

FIGS. 4A and 4B illustrate enlarged cross-sectional views of intermediate stages of manufacturing a semiconductor structure 100*a* in accordance with some embodiments. The semiconductor structure 100*a* may be similar to the semiconductor structure 100 described previously, except the cap layer 184 is removed in accordance with some embodiments. Processes and materials for forming the semiconductor structure 100*a* may be similar to, or the same as, those for forming the semiconductor structure 100 described previously and are not repeated herein. For example, other elements in the semiconductor structure 100*a* not shown in FIG. 4B may be similar to, or the same as, those shown in FIGS. 2J-1, 2J-2, 2J-3, 2J-4, and 2J-5 described previously in accordance with some embodiments.

More specifically, the processes shown in FIGS. 2A-1 to 2I-1, 2A-2 to 2I-2, 2A-3 to 2I-3, and 3A to 3F may be performed. After the post deposition annealing process 186 (not shown in FIG. 4A, see FIG. 3F) is performed, the cap layer 184 (not shown in FIG. 4A, see FIG. 3F) is removed, as shown in FIG. 4A in accordance with some embodiments. After the cap layer 184 is removed, the processes shown in FIGS. 3G and 3H are performed to form the semiconductor structure 100*a* including transistor Ta-1 and Ta-2. Since the gate dielectric layer 172 is covered by the additional gate dielectric layer 182, the gate dielectric layer 172 will not be damaged by the removal of the cap layer 184. In addition, the space for forming the work function metal layer 190 and the gate filling layer 192 may be increased.

FIGS. 5A to 5G illustrate enlarged cross-sectional views of intermediate stages of manufacturing semiconductor structure 100*b* in accordance with some embodiments. Processes and materials for forming the semiconductor structure 100*b* may be similar to, or the same as, those for forming the semiconductor structure 100 described previously and are not repeated herein. For example, other elements in the semiconductor structure 100*b* not shown in FIG. 5G may be similar to, or the same as, those shown in FIGS. 2J-1, 2J-2, 2J-3, 2J-4, and 2J-5 described previously in accordance with some embodiments.

Figure 5A:
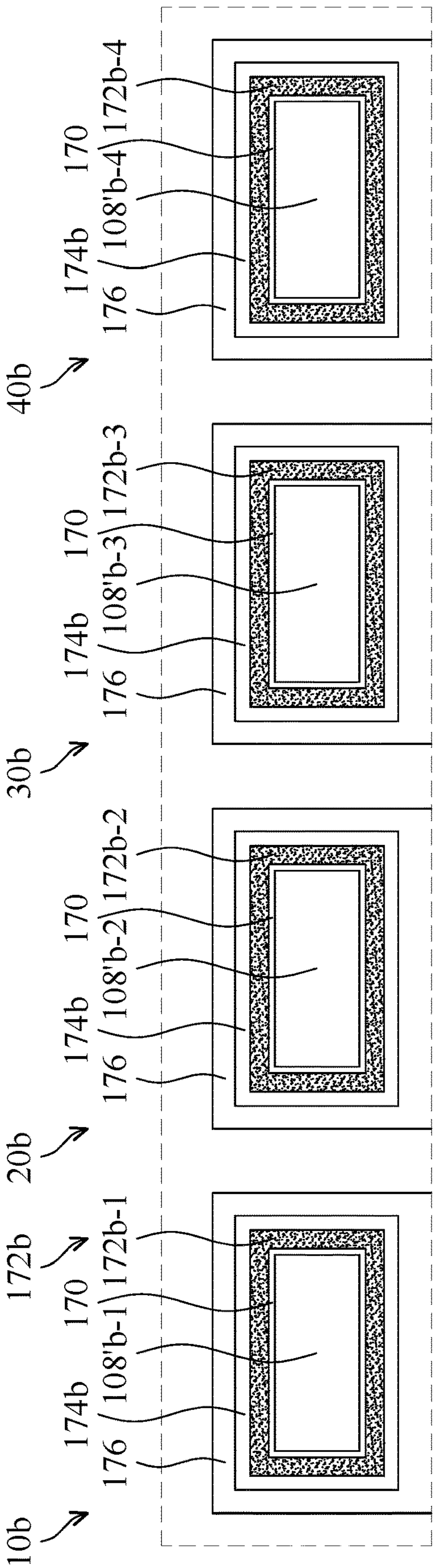
FIGS. 5A to 5G illustrate enlarged cross-sectional views of intermediate stages of manufacturing a semiconductor structure in accordance with some embodiments.

More specifically, channel structures 108'*b*-1, 108'*b*-2, 108'*b*-3, and 108'*b*-4 are formed in the regions 10*b*, 20*b*, 30*b*, and 40*b*, respectively, as shown in FIG. 5A in accordance with some embodiments. After the channel structures 108'*b*-1, 108'*b*-2, 108'*b*-3, and 108'*b*-4 are formed, the interfacial layer 170, a gate dielectric layer 172*b*, a dipole layer 174*b*, and the hard mask layer 176 are formed to cover the channel structures 108'*b*-1, 108'*b*-2, 108'*b*-3, and 108'*b*-4 in the regions 10*b*, 20*b*, 30*b*, and 40*b*, as shown in FIG. 5A in accordance with some embodiments. In addition, the gate dielectric layer 172*b* includes portions 172*b*-1, 172*b*-2, 172*b*-3, and 172*b*-4 wrapping around the channel structures 108'*b*-1, 108'*b*-2, 108'*b*-3, and 108'*b*-4 respectively in accordance with some embodiments.

Figure 5B:
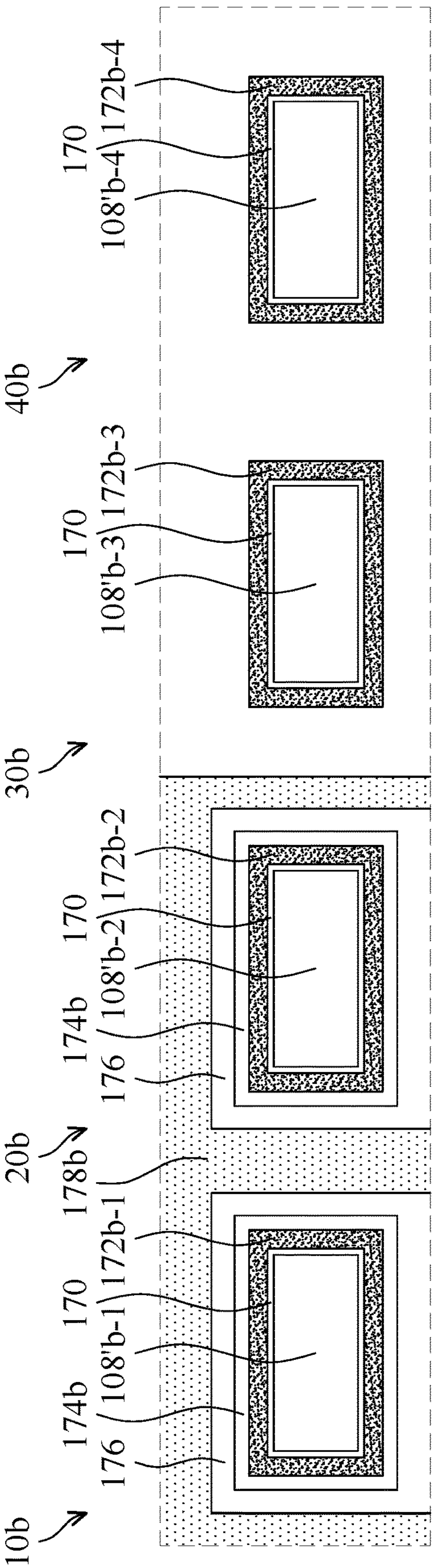

Next, a photoresist layer 178*b* is formed in the regions 10*b* and 20*b*, while the regions 30*b* and 40*b* are exposed in accordance with some embodiments. Afterwards, the portions of the hard mask layer 176 and the dipole layer 174*b* in the regions 30*b* and 40*b* are removed, as shown in FIG. 5B in accordance with some embodiments.

Figure 5C:
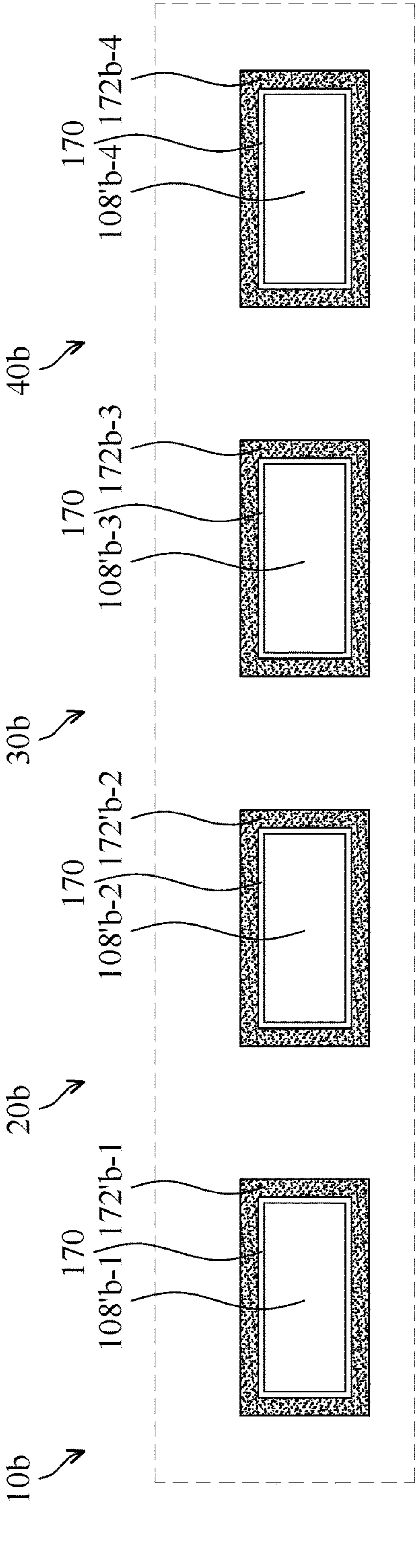

After the portions of the dipole layer 174*b* in the regions 30*b* and 40*b* are removed, the photoresist layer 178*b* and the portions of the hard mask layer 176 at regions 10*b* and 20*b* are also removed in accordance with some embodiments. Afterwards, the treatment process (e.g. the treatment process 180 described previously) is performed to form modified portions 172'*b*-1 and 172*b*'-2 in the regions 10*b* and 20*b*, while the portions 172*b*-3 and 172*b*-4 remain the non-treated since remaining portions of the dipole layer 174*b* are spaced apart from the portions 172*b*-3 and 172*b*-4 during the treatment process. In some embodiments, first metal elements in the dipole layer 174*b* are driven into the portions 172*b*-1 and 172*b*-2 of the gate dielectric layer 172*b*. After the treatment process is performed, the portions of the dipole layer 174*b* at the regions 10*b* and 20*b* are removed, as shown in FIG. 5C in accordance with some embodiments.

Figure 5D:
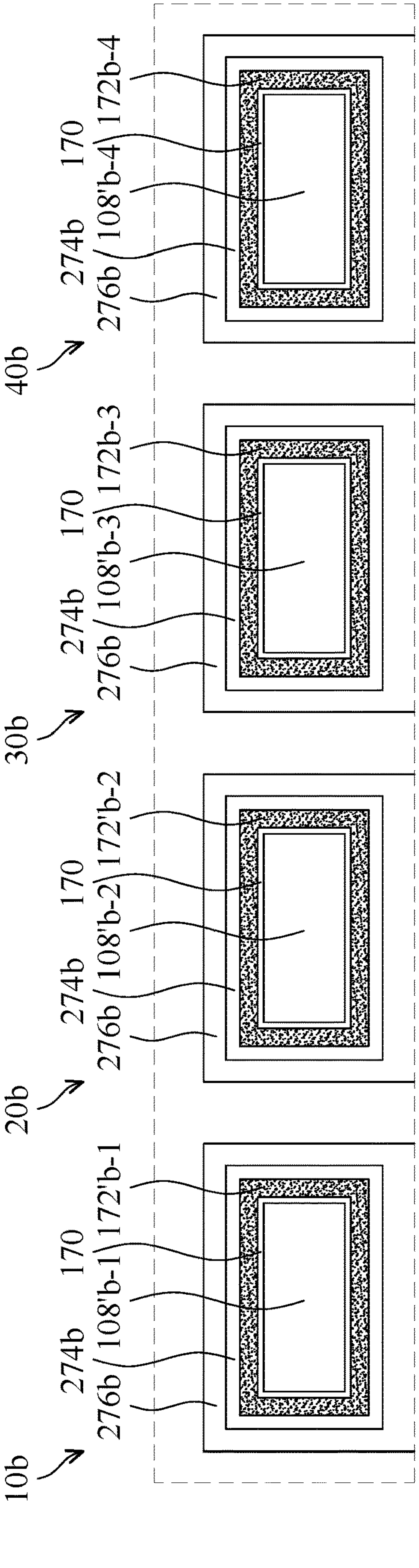

Next, another dipole layer 274*b* and another hard mask layer 276*b* are formed over the regions 10*b*, 20*b*, 30*b*, and 40*b*, as shown in FIG. 5D in accordance with some embodiments. The dipole layer 274*b* is configured to modify the gate dielectric layer 272*b*. In some embodiments, the dipole layer 274*b* includes a second metal element such as La, Y, Al, Sr, Er, Zn, Sc, Ti, Nb, or the like. In some embodiments, the dipole layer 274*b* has a thickness in a range from about 0.5 nm to about 2.5 nm. In some embodiments, the dipole layer 174*b* and the dipole layer 274*b* include different metal elements.

Figure 5E:
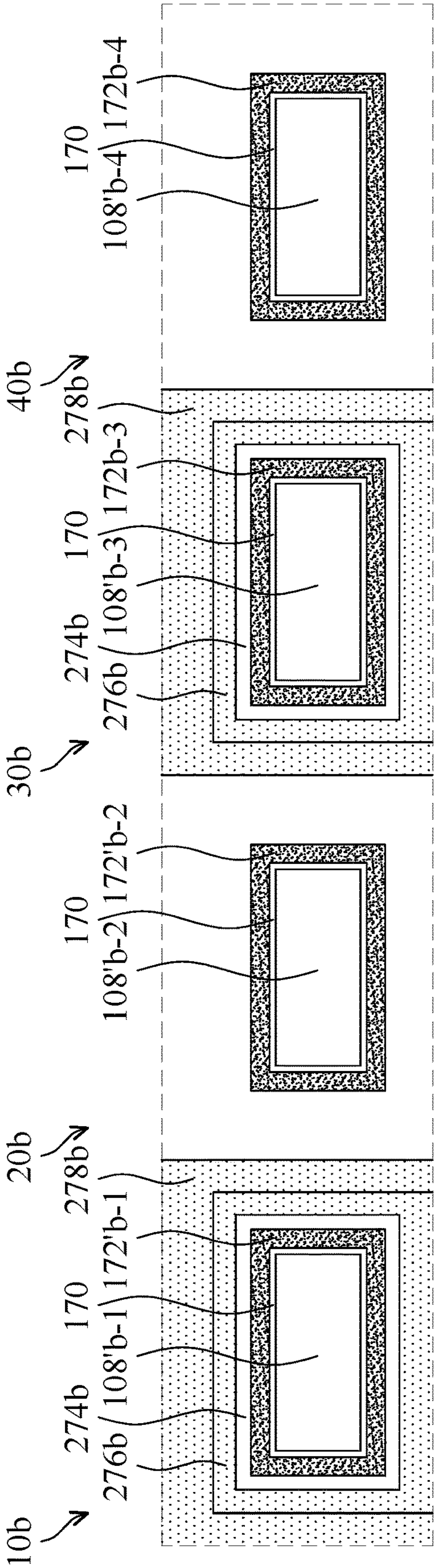
Figure 5F:
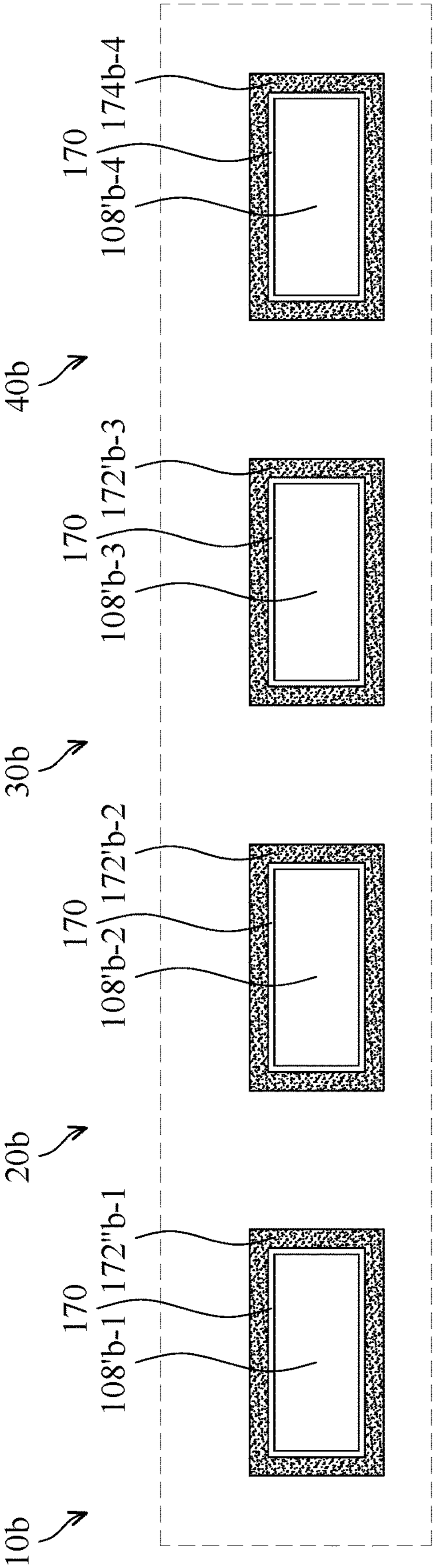

Afterwards, a photoresist layer **278*b* is formed over the regions 10*b* and 30*b*, while the regions 20*b* and 40*b* are exposed, and the portions of the hard mask layer 276*b* and the dipole layer 274*b* at the regions 20*b* and 40*b* are removed, as shown in FIG. 5E in accordance with some embodiments. After the portions of the dipole layer 274*b* at the regions 20*b* and 40*b* are removed, the photoresist layer 278*b* and the portions of the hard mask layer 276*b* are removed, and a treatment process (e.g. the treatment process 180 described previously) is performed to form modified portions 172"*b*-1 and 172'*b*-3 in the regions 10*b* and 30*b*, as shown in FIG. 5F in accordance with some embodiments. In some embodiments, the second metal elements in the dipole layer 274*b* are driven into the portions 172'*b*-1 and 172*b*-3 to form the modified portions 172"*b*-1 and 172'*b*-3. In some embodiments, the second metal elements in the dipole layer 274*b* are different from the first metal elements in the dipole layer 174*b***.

Figure 5G:
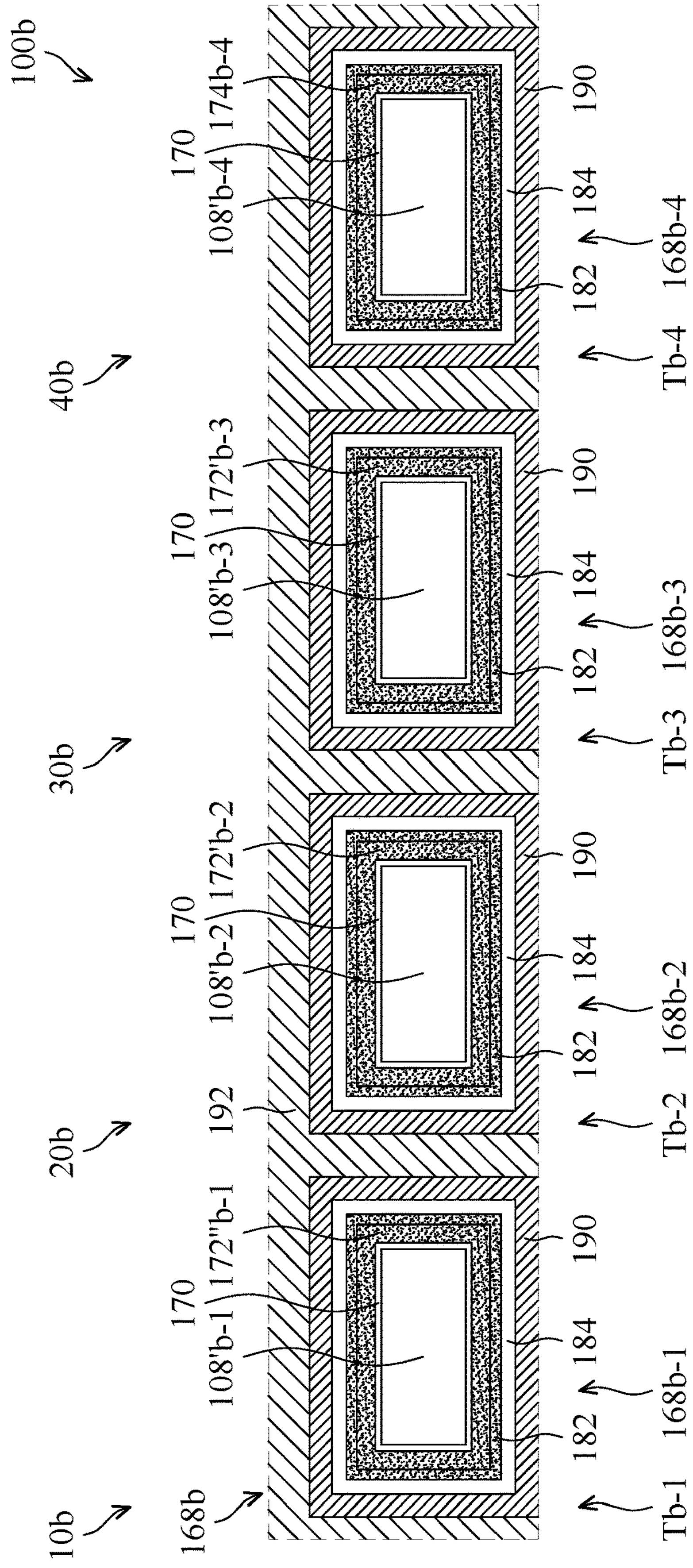

Next, the processes shown in FIGS. 3E to 3H and described previously are performed to form a gate structure **168*b* of the semiconductor structure 100*b*, as shown in FIG. 5G in accordance with some embodiments. In some embodiments, the gate structure 168*b* includes a portion 168*b*-1 wrapping around the channel structures 108'*b*-1, a portion 168*b*-2 wrapping around the channel structures 108'*b*-2, a portion 168*b*-3 wrapping around the channel structures 108'*b*-3, and a portion 168*b*-4 wrapping around the channel structures 108'*b*-4. In addition, all of the portions 168*b*-1, 168*b*-2, 168*b*-3, and 168*b*-4 include the same and single work function metal layer 190** in accordance with some embodiments.

In some embodiments, the semiconductor structure **100*b* includes transistors Tb-1, Tb-2, Tb-3, and Tb-4 in the regions 10*b*, 20*b*, 30*b*, and 40*b* respectively. As described above, two treatment processes are performed, and therefore the portion 172*b*-1 of the gate dielectric layer 172*b* in the region 10*b* is treated with both the first metal elements in the dipole layer 174*b* and the second metal elements in the dipole layer 274*b* in accordance with some embodiments. In addition, the portion 172*b*-2 of the gate dielectric layer 172*b* in the region 20*b* is treated with the first metal elements in the dipole layer 174*b* in accordance with some embodiments. The portion 172*b*-3 of the gate dielectric layer 172*b* in the region 30*b* is treated with the second metal elements in the dipole layer 274*b*, and the portion 172*b*-4 of the gate dielectric layer 172*b* in the region 40*b* is not treated in accordance with some embodiments. That is, the modified portion 172"*b*-1 includes both first metal elements and the second metal elements, the modified portion 172'*b*-2 includes the first metal elements but with no second metal elements, the modified portion 172'*b*-3 includes the second metal elements but with no first metal elements, and the portion 172*b*-4 does not include the first metal elements and the second metal elements. In some embodiments, the threshold voltage of the transistor Tb-1 is smaller than the threshold voltage of the transistor Tb-2. In some embodiments, the threshold voltage of the transistor Tb-3 is greater than the threshold voltage of the transistor Tb-4**.

Processes and materials for forming the channel structures **108'*b*-1, 108'*b*-2, 108'*b*-3, and 108'*b*-4, the gate dielectric layer 172*b*, the dipole layers 174*b* and 274*b*, the photoresist layers 178*b* and 278*b*, the hard mask layer 276, and the gate structure 168*b* may be similar to, or the same as, those for forming the channel structures 108'-1 and 108'-2, the gate dielectric layer 172, the dipole layer 174, the photoresist layer 178, the hard mask layer 176, and the gate structure 168 described previously and are not repeated herein. Furthermore, in some other embodiments, the cap layer 184 of the semiconductor structure 100*b* may be removed, similar to the semiconductor structure 100*a*** described previously.

Figures 2, 2J, 3, 4:
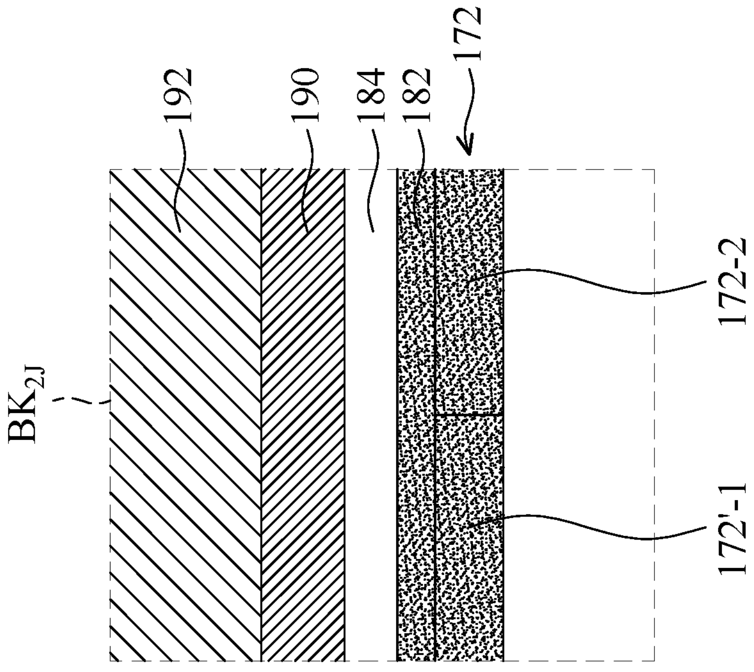
Figures 2, 2J, 3, 4, 5:
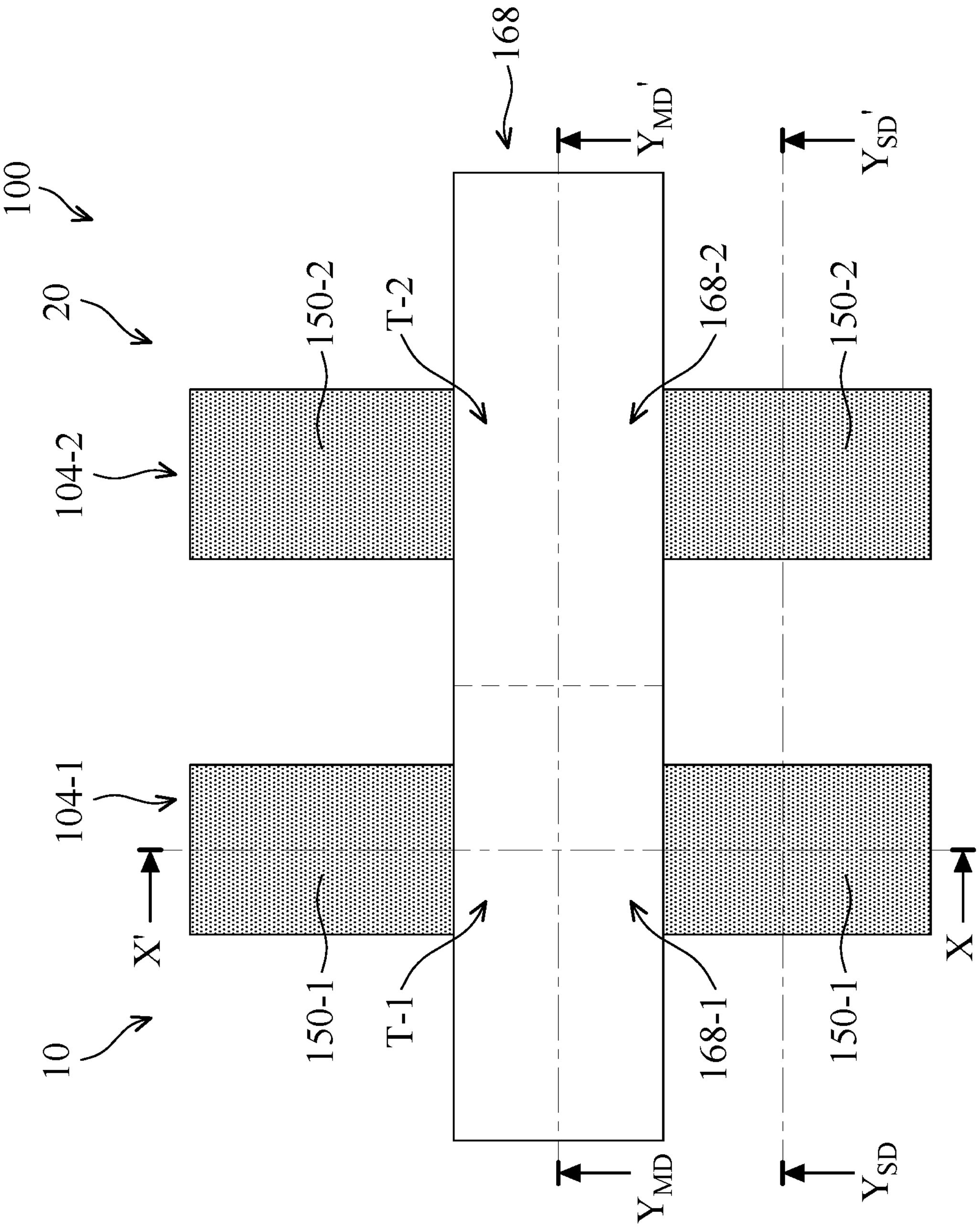
Figure 2J:
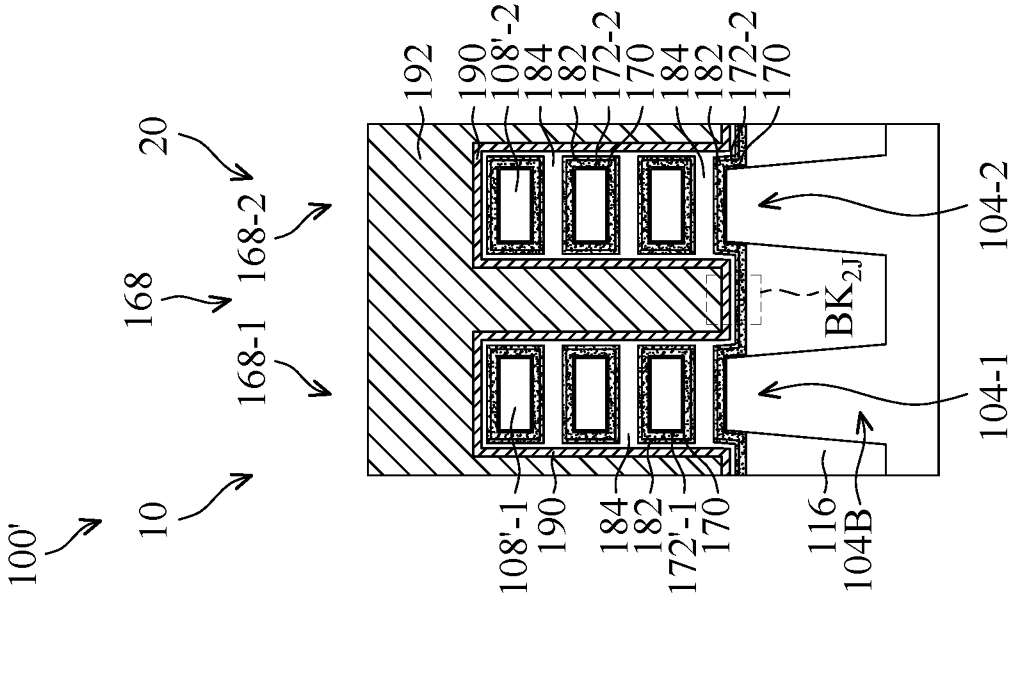
Figure 2J:
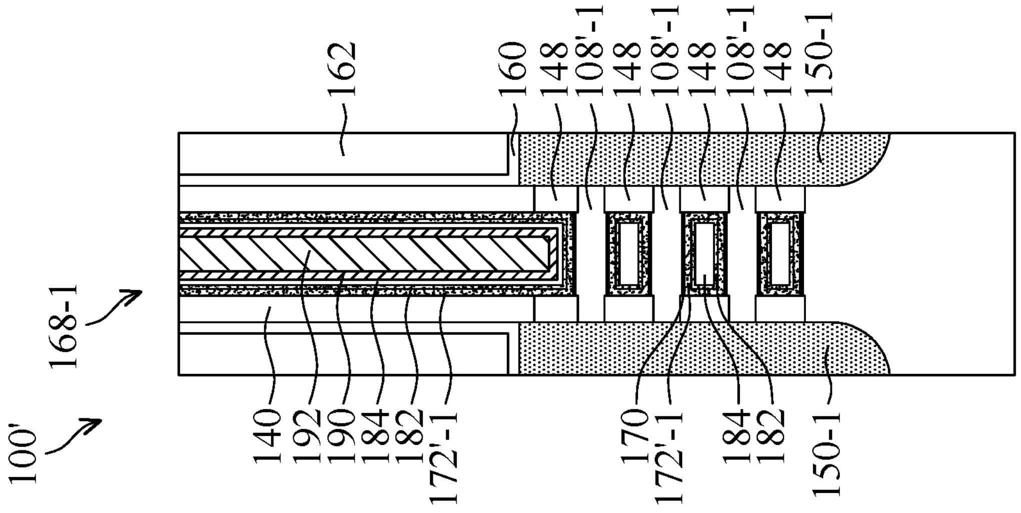
Figures 1, 6A:
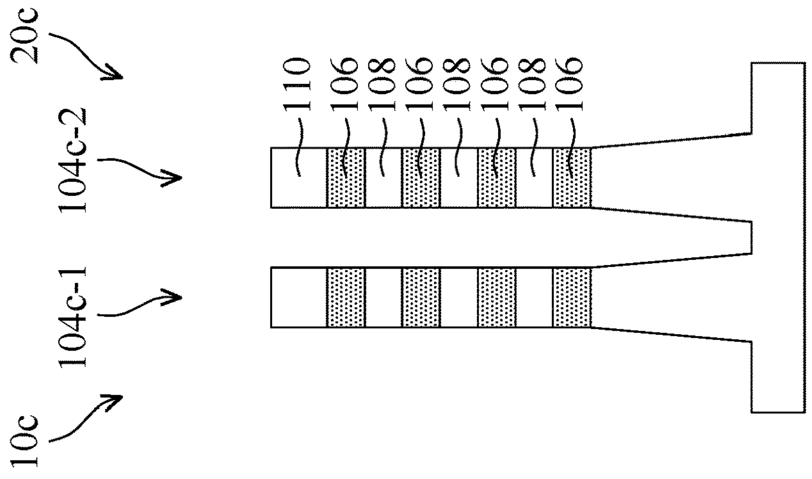
Figures 2, 6A:
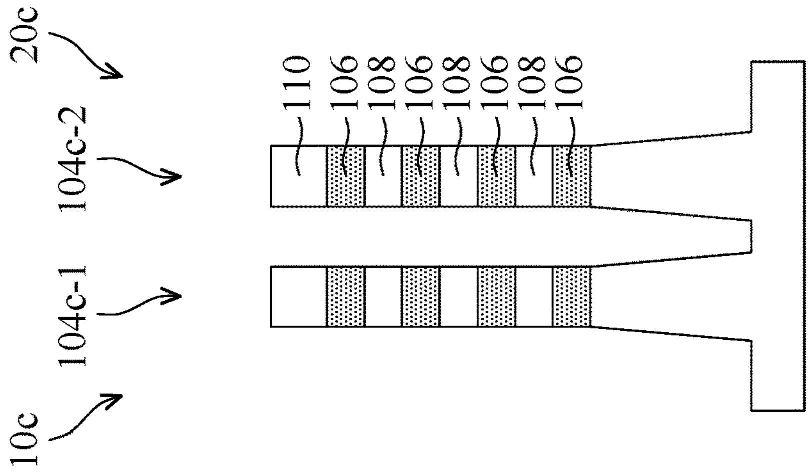
Figures 3, 6A:
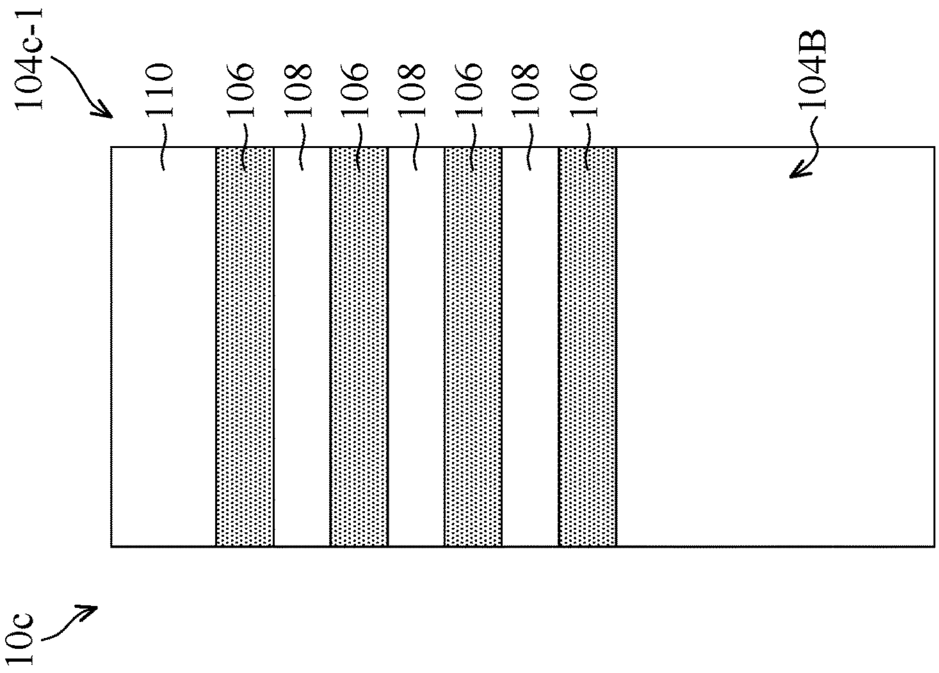
Figures 3, 6B:
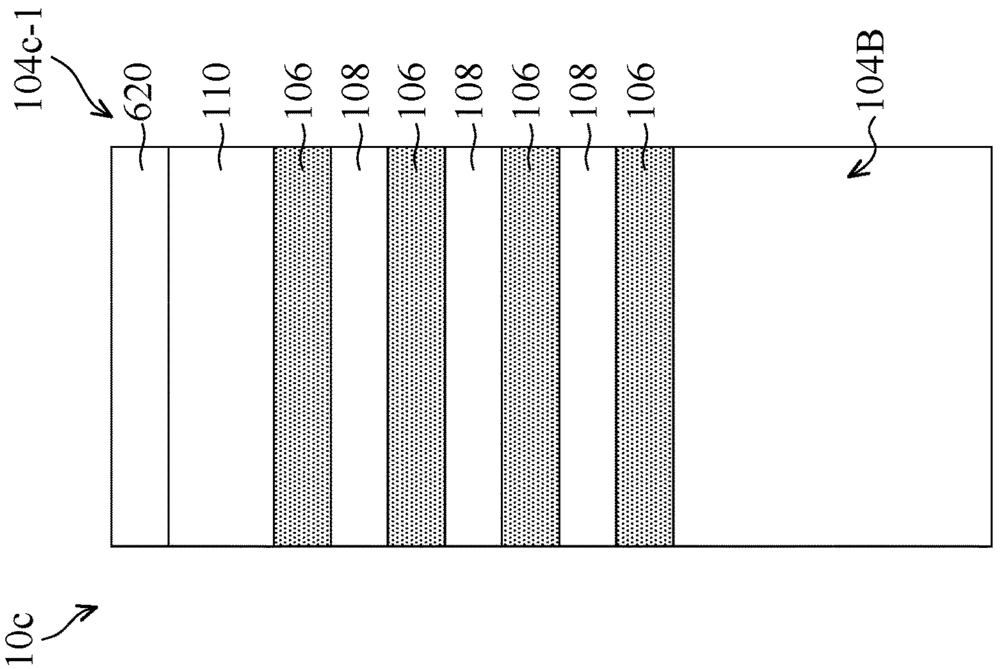
Figures 2, 6B:
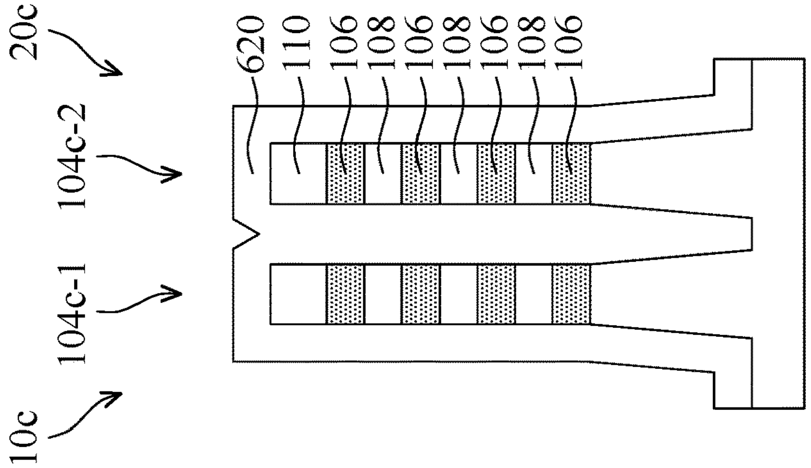
Figures 1, 6B:
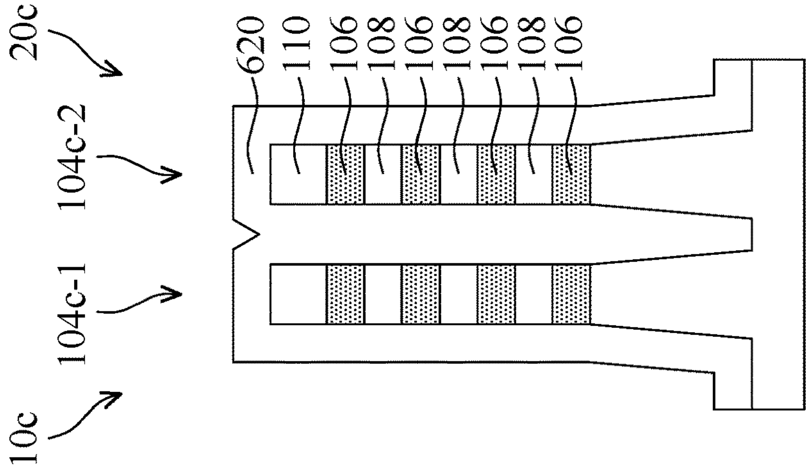
Figures 1, 6C:
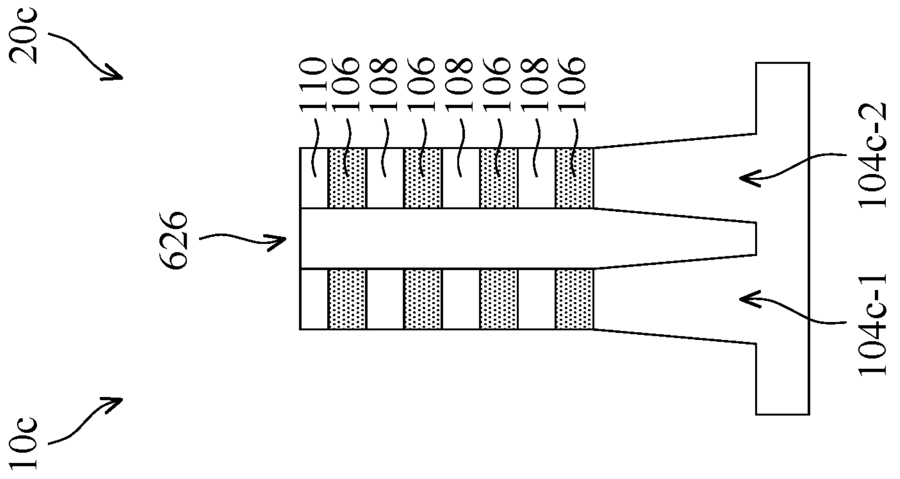
Figures 2, 6C:
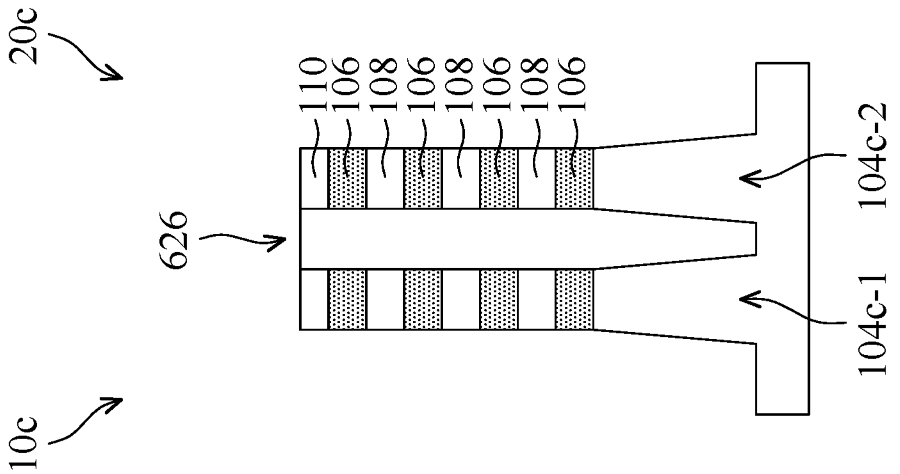
Figures 3, 6C:
Figures 1, 6D:
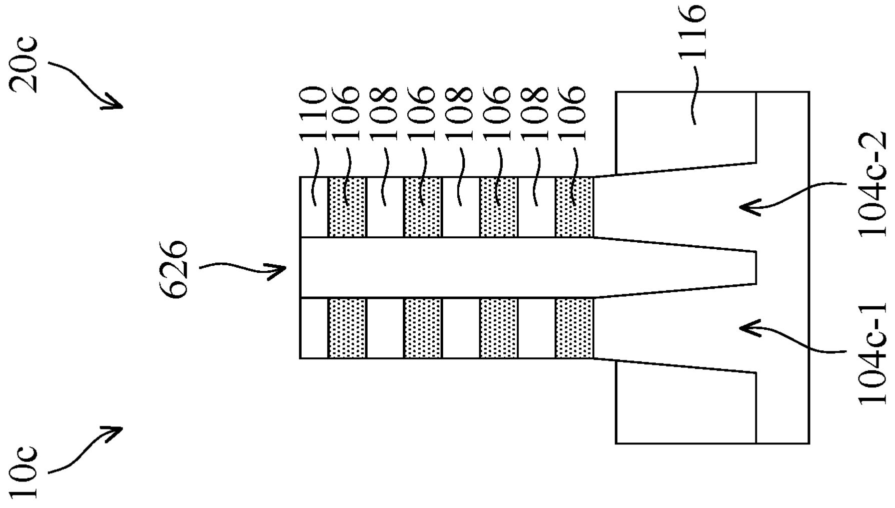
Figures 2, 6D:
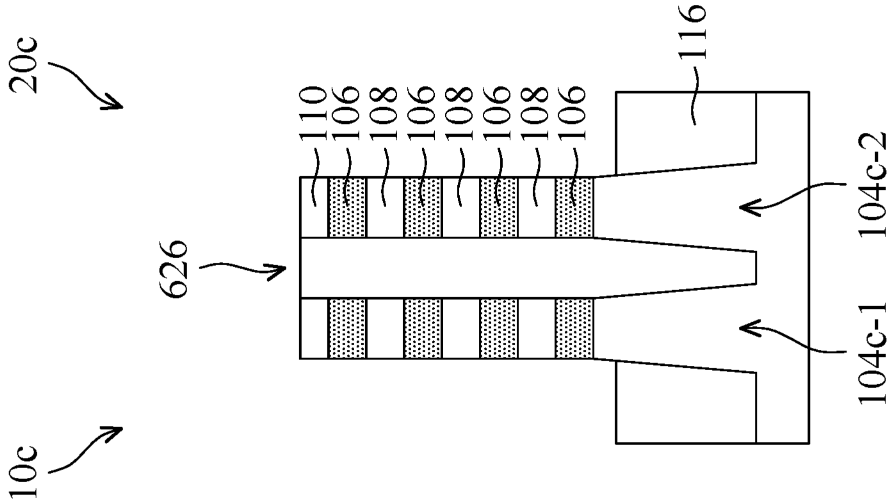
Figures 3, 6D:
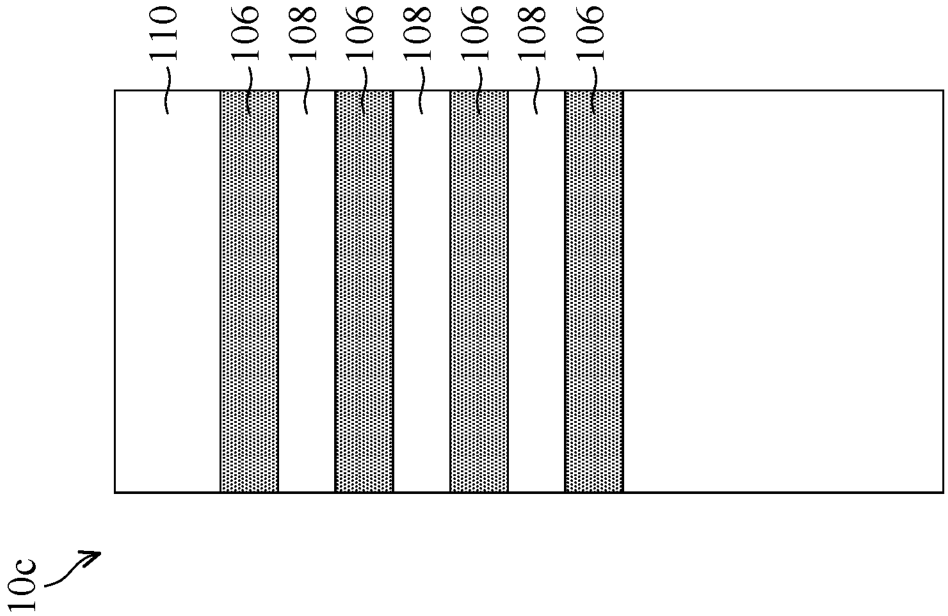
Figures 1, 6E:
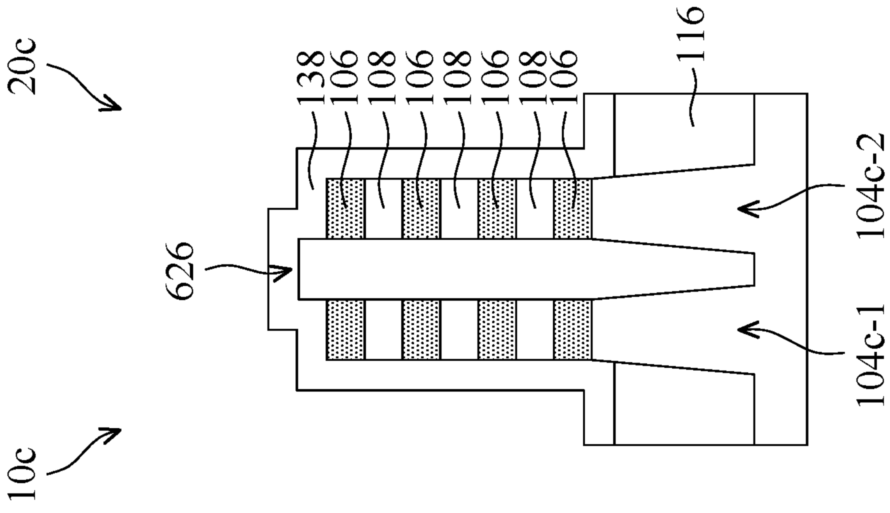
Figures 2, 6E:
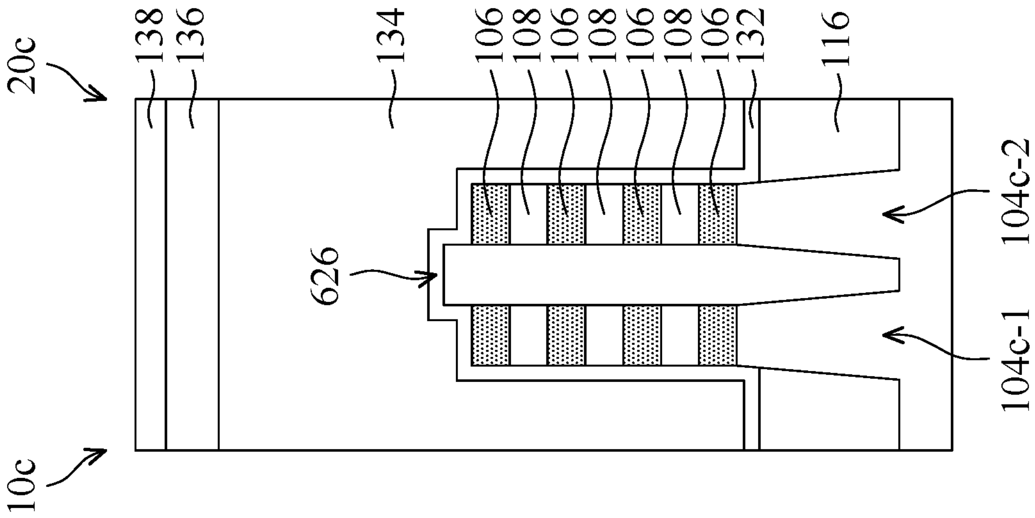
Figures 3, 6E:
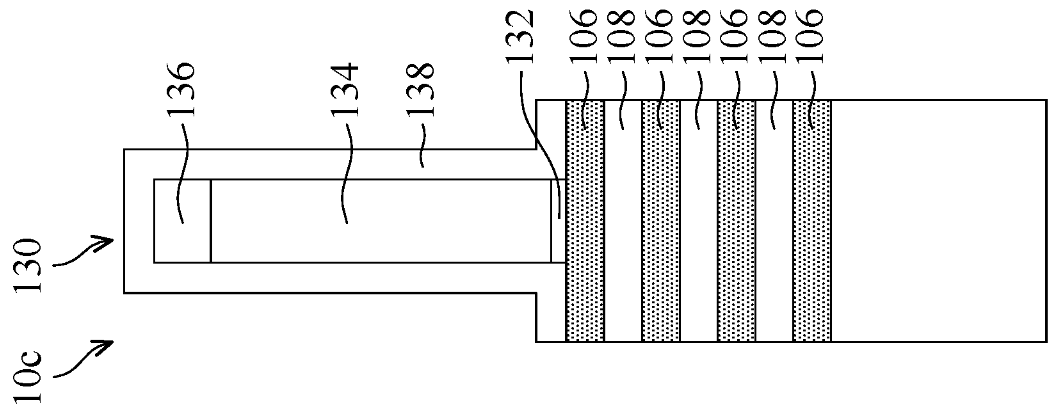
Figures 1, 6F:
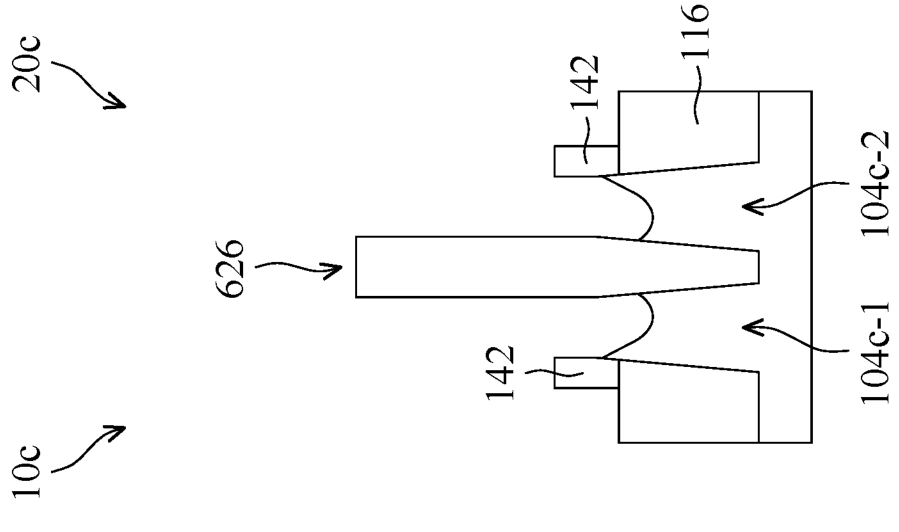
Figures 2, 6F:
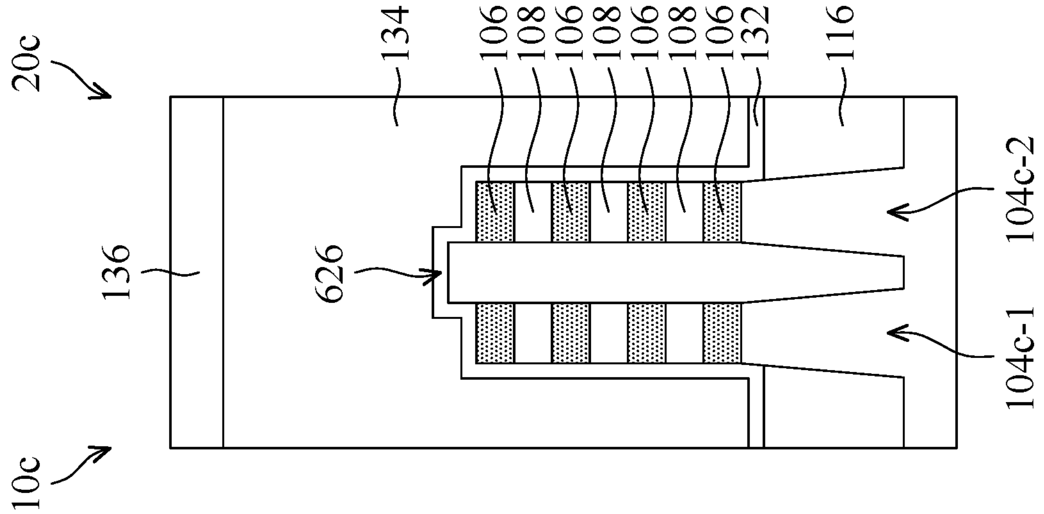
Figures 3, 6F:
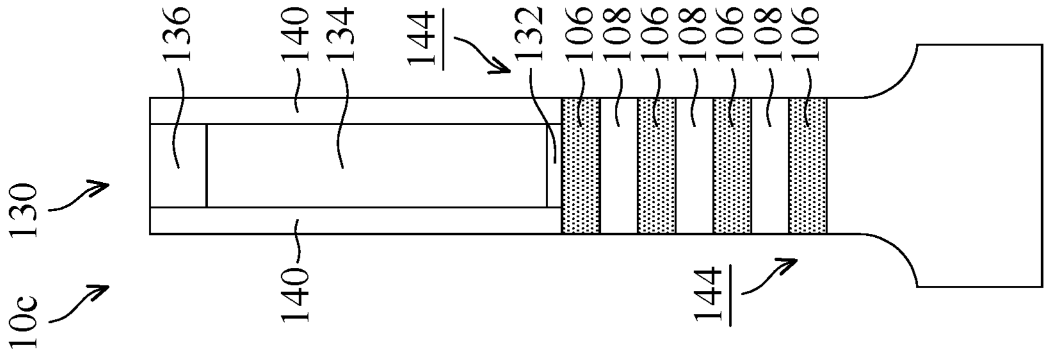
Figures 1, 6G:
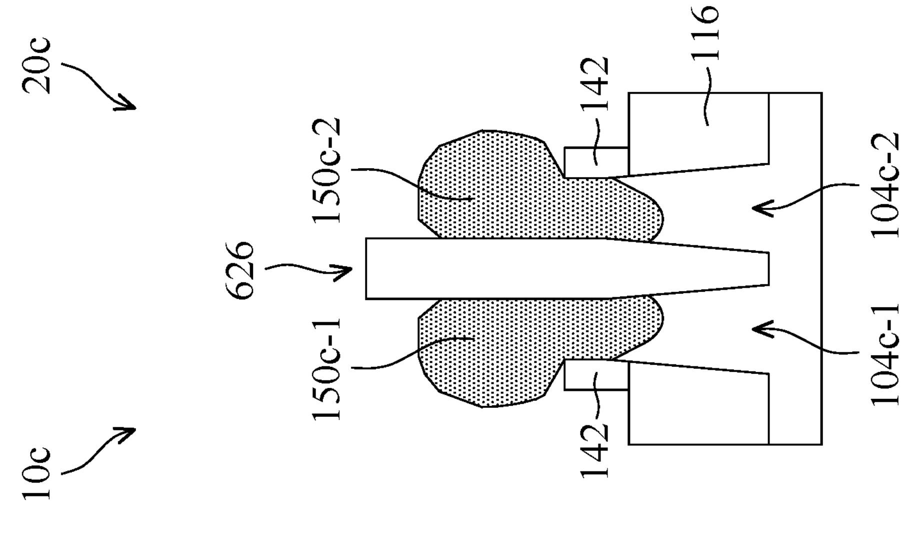
Figures 2, 6G:
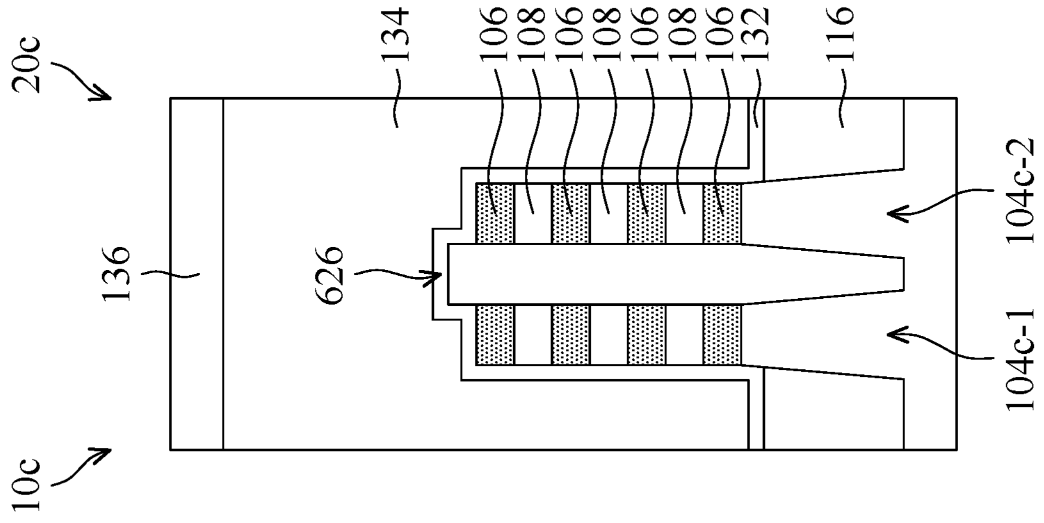
Figures 3, 6G:
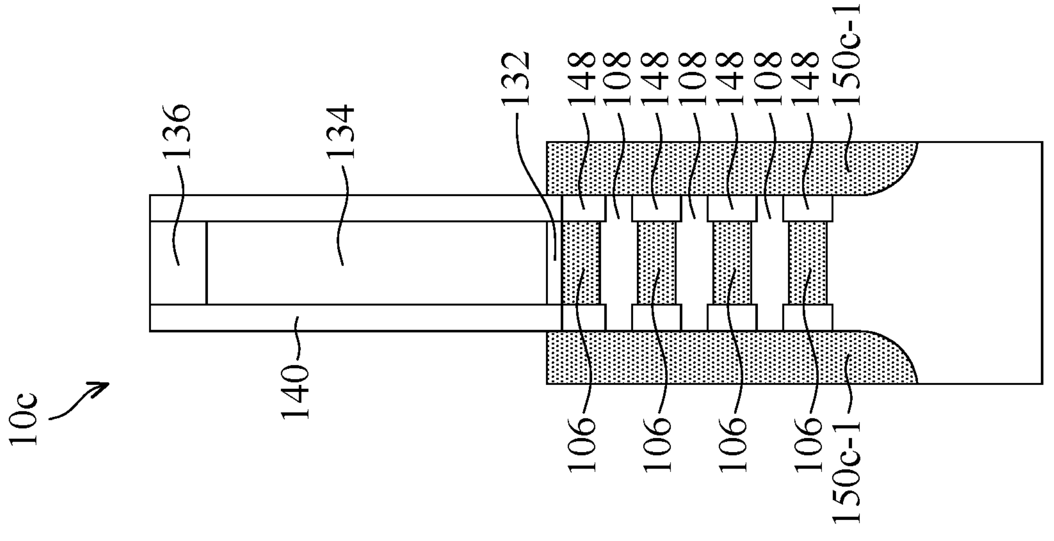
Figures 3, 6H:
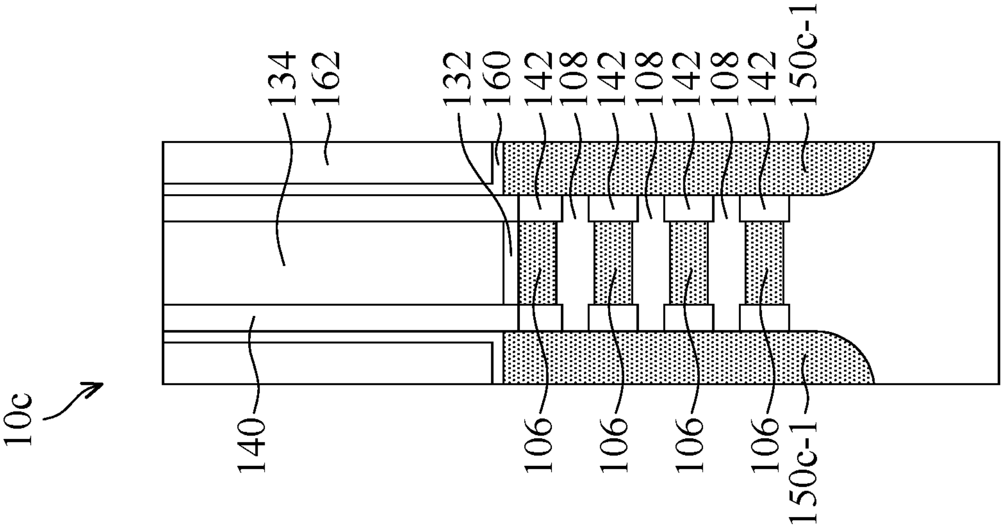
Figures 2, 6H:
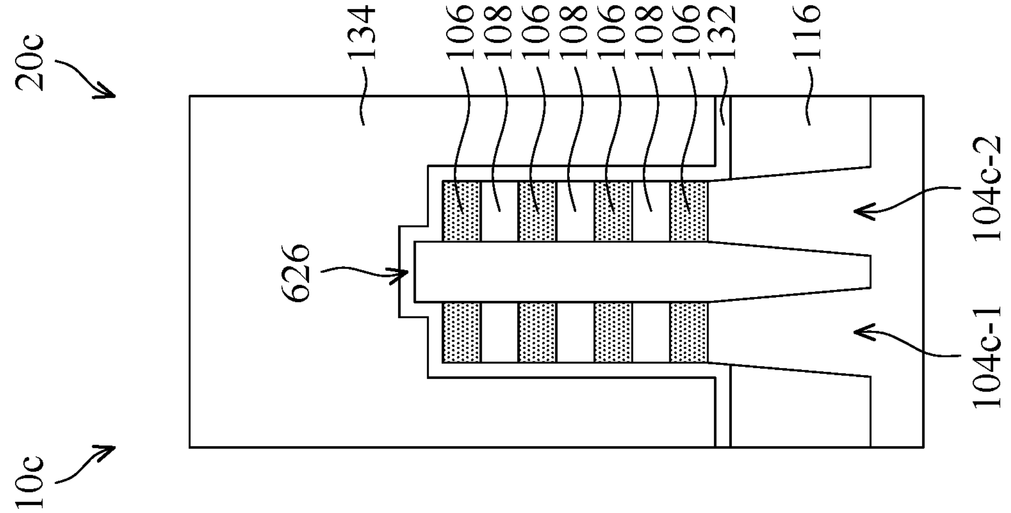
Figures 1, 6H:
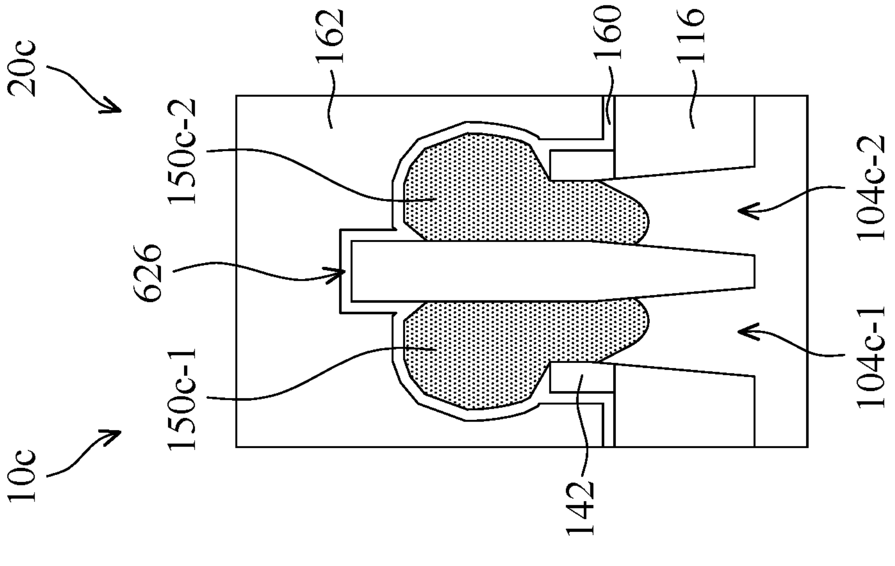
Figures 1, 6I:
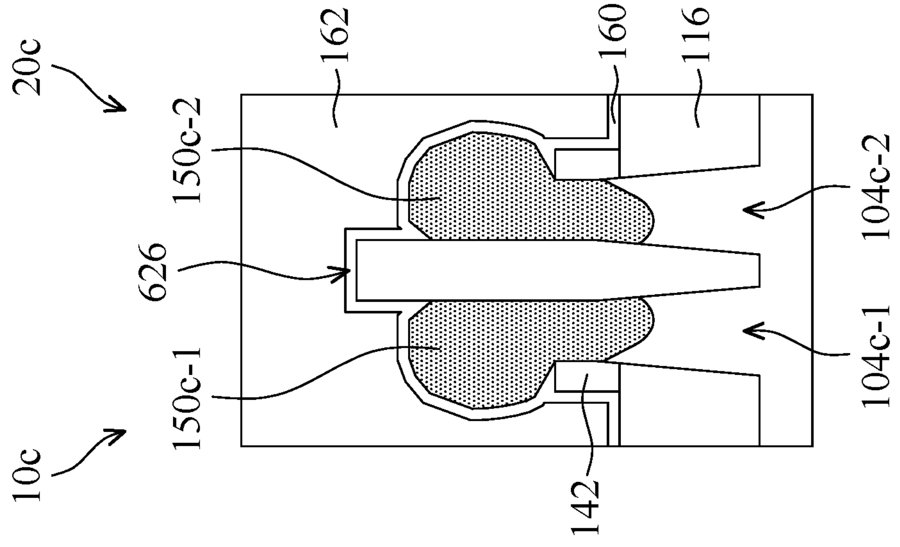
Figures 2, 6I:
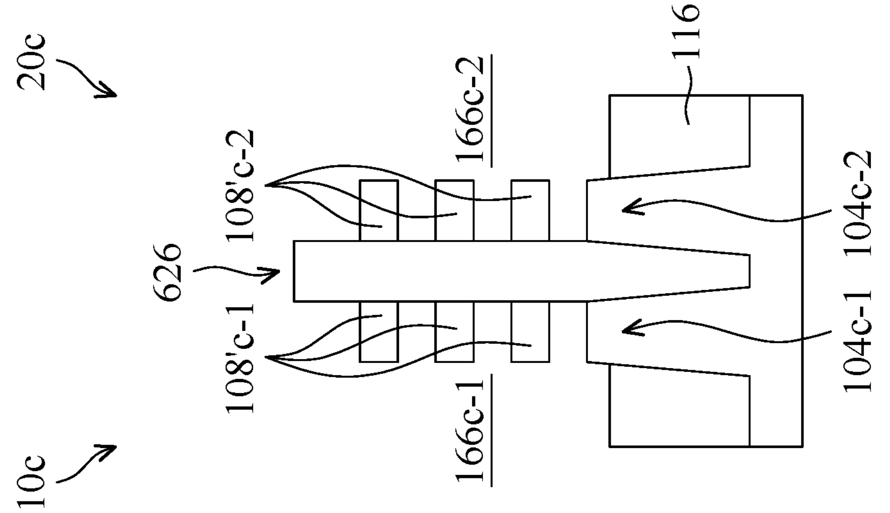
Figures 3, 6I:
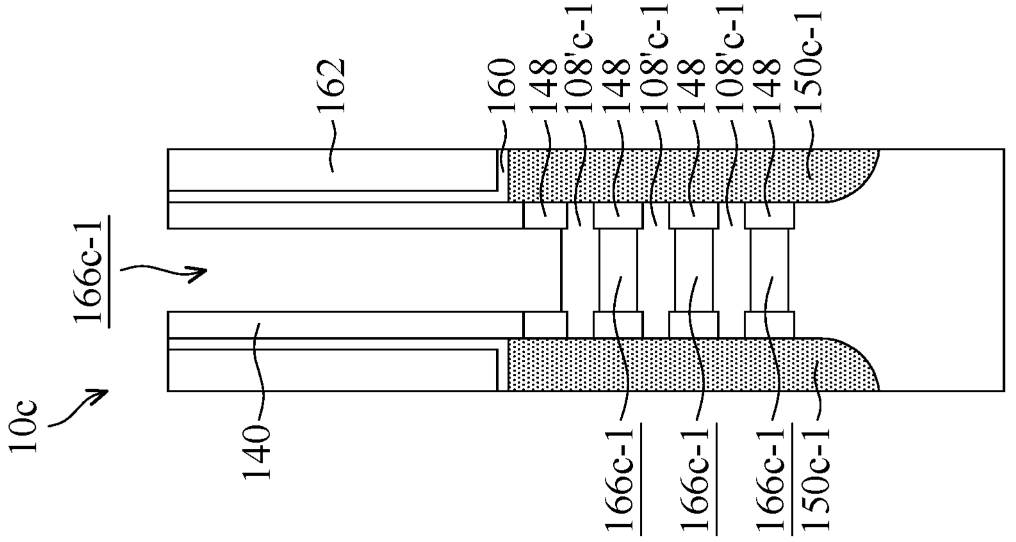
Figures 3, 6J:
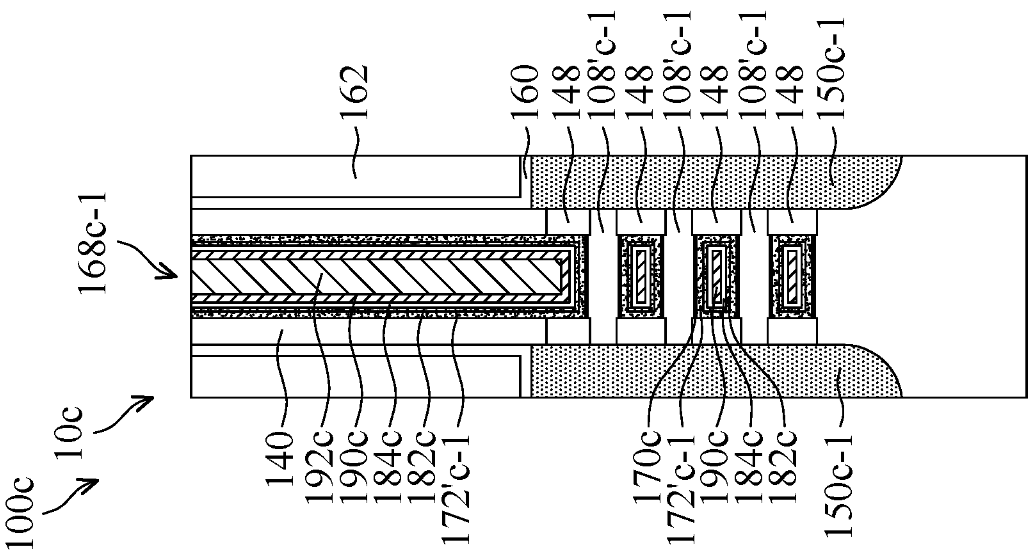
Figures 2, 6J:
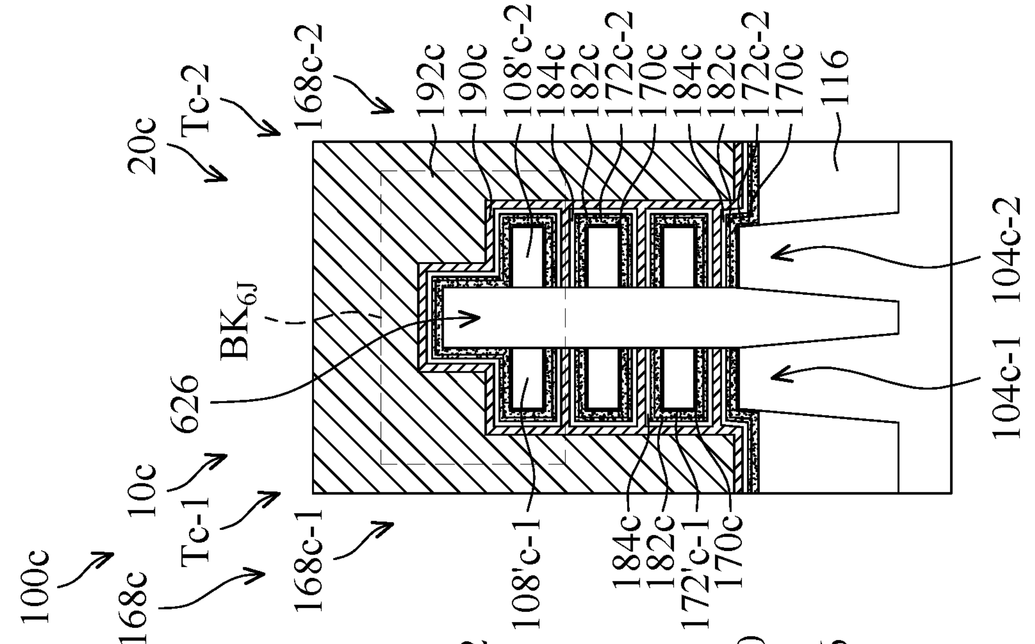
Figures 1, 6J:
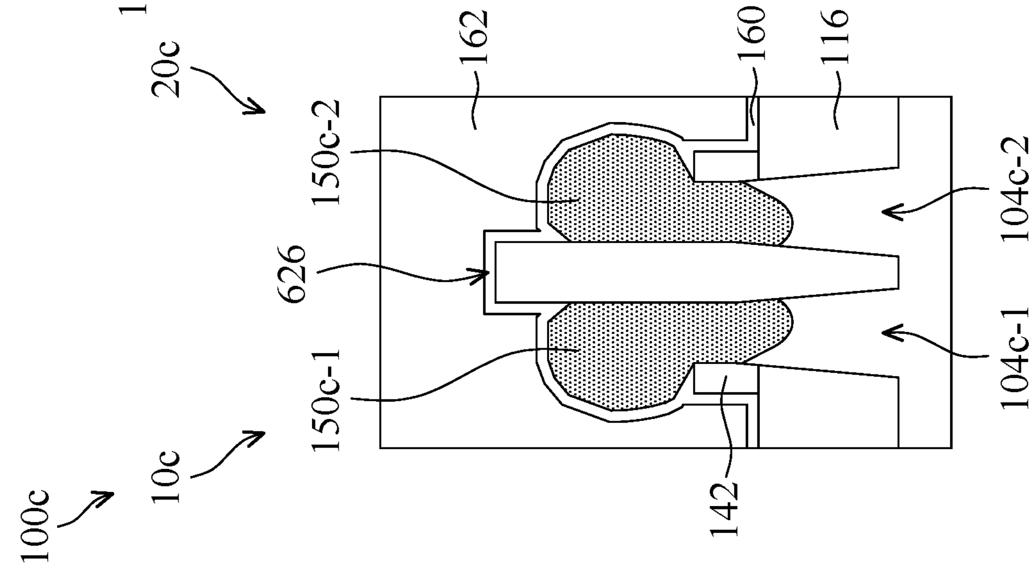
Figures 4, 6J:
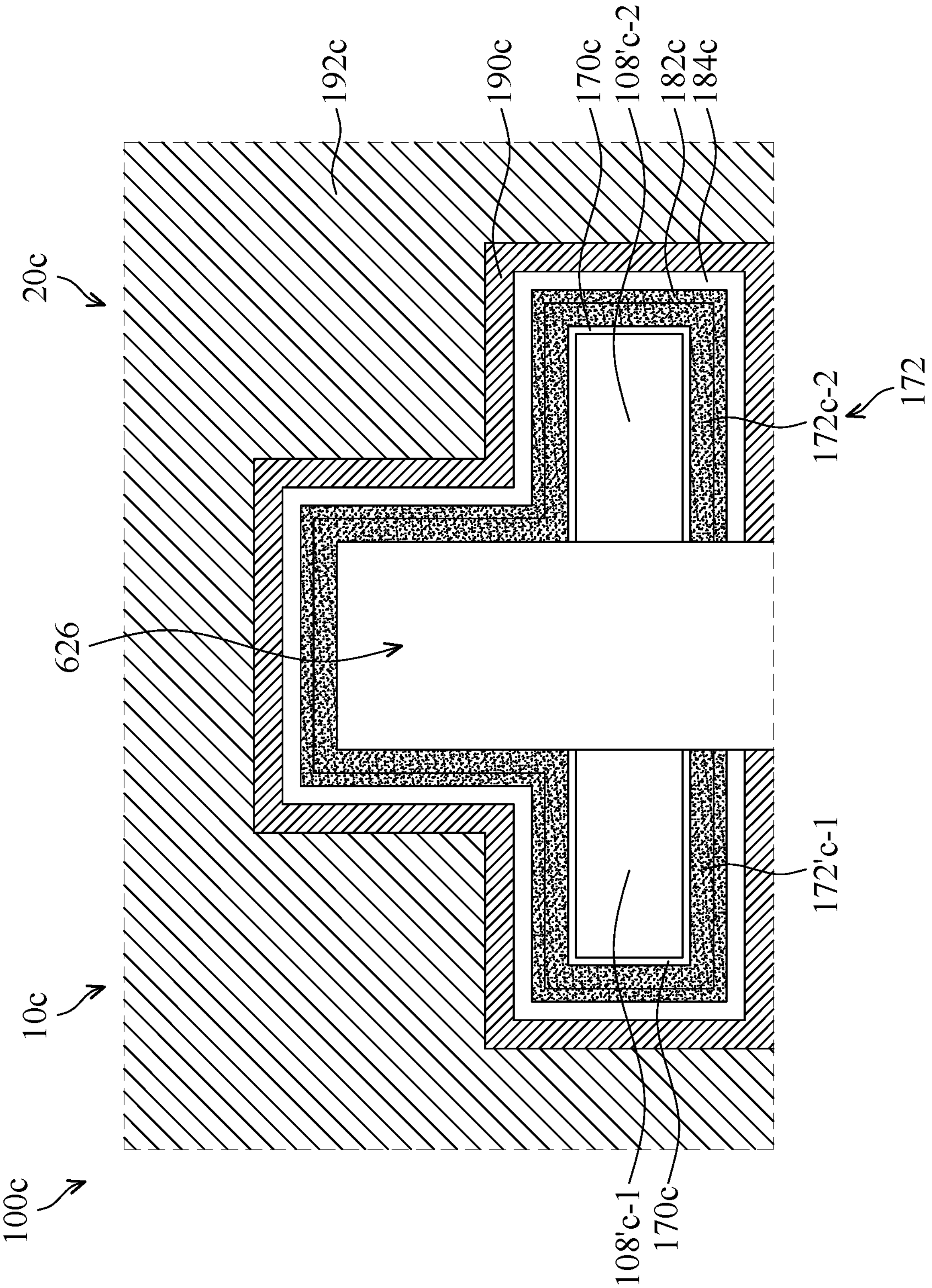
Figures 5, 6J:
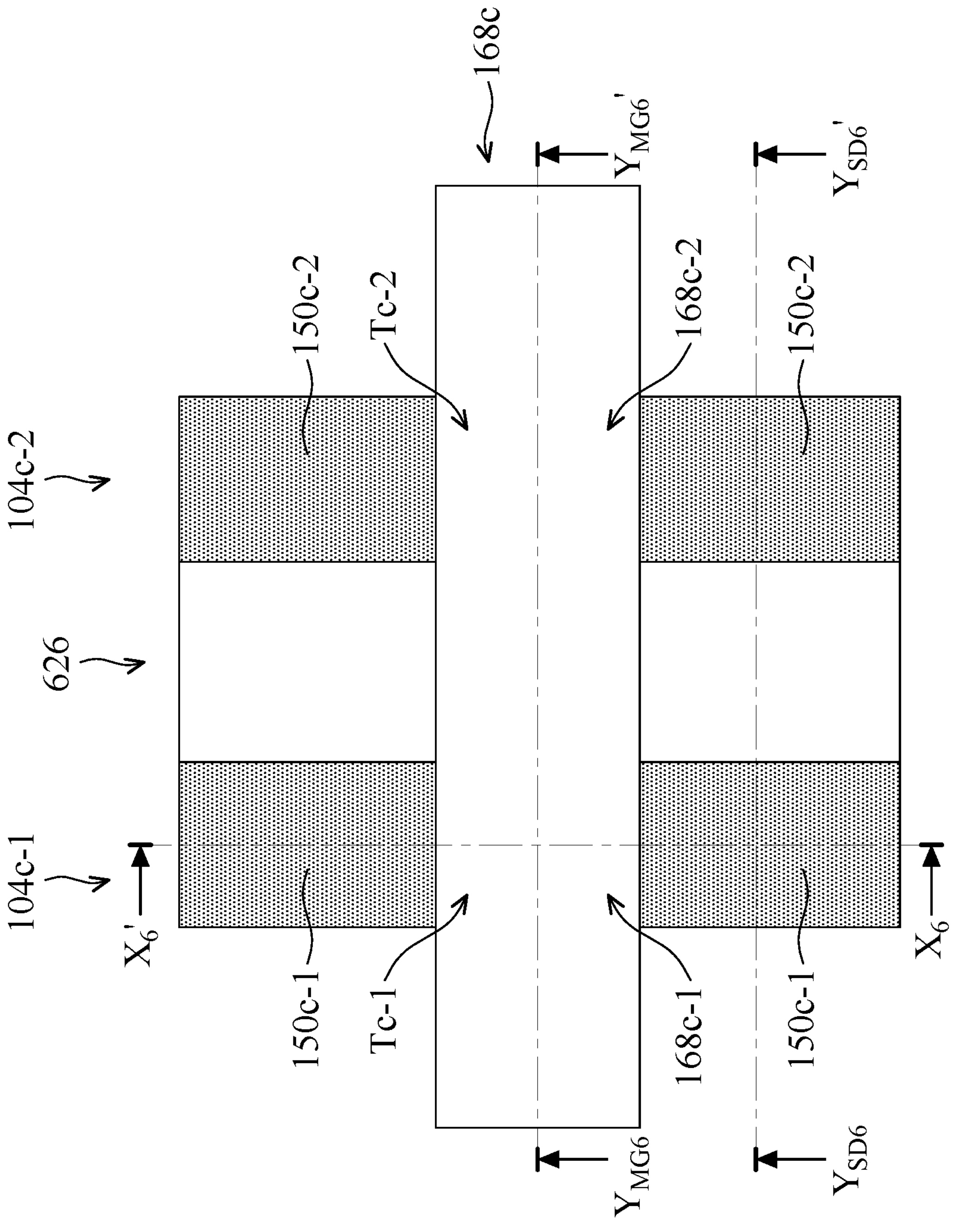
Figure 6J:
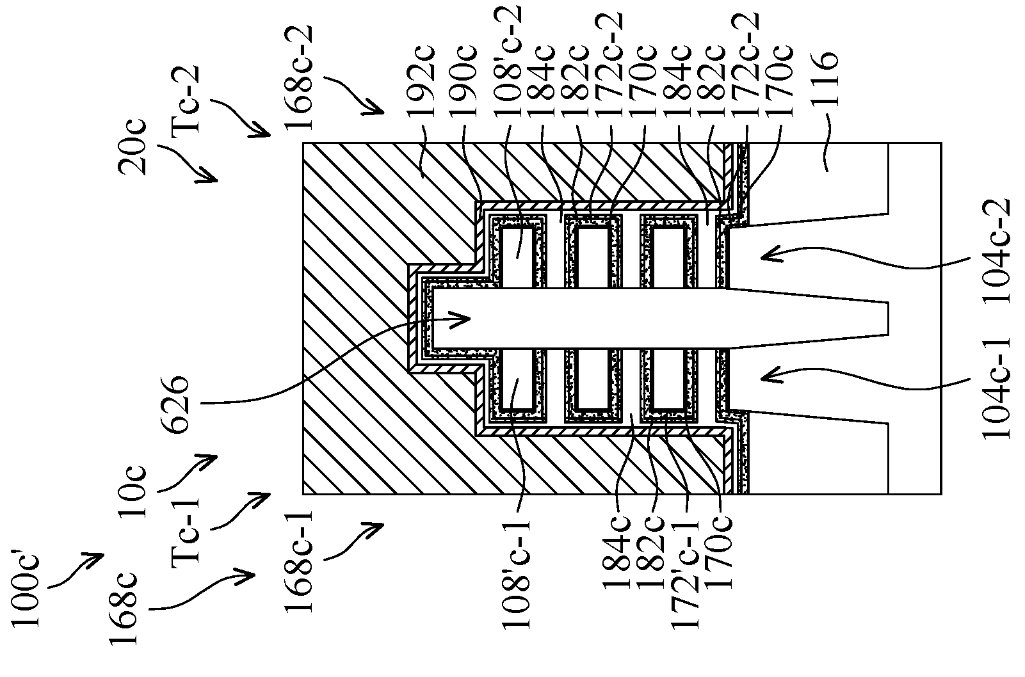
Figure 6J:
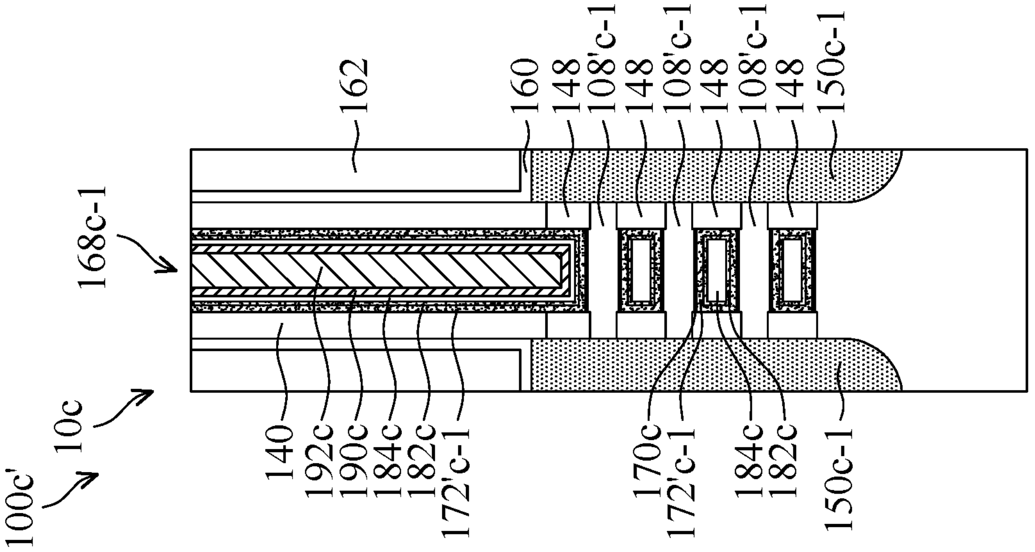

FIGS. 6A-1 to 6J-1, 6A-2 to 6J-2, and 6A-3 to 6J-3 illustrate cross-sectional views of intermediate stages of manufacturing a semiconductor structure **100*c* in accordance with some embodiments. FIG. 6J-4 illustrates an enlarged cross-sectional view of the semiconductor structure 100*c* of block $BK_{6J}$ shown in FIG. 6J-2 in accordance with some embodiments. FIG. 6J-5 illustrates a diagrammatic top view of the semiconductor structure 100*c* in accordance with some embodiments. FIG. 6J-5 has been simplified for the sake of clarity to better understand the inventive concepts of the present disclosure. More specifically, FIGS. 6A-1 to 6J-1, 6A-2 to 6J-2, and 6A-3 to 6J-3 illustrate the cross-sectional views of intermediate stages of manufacturing the semiconductor structure 100*c* shown along line $Y_{SD6}$-$Y_{SD6}$' (i.e. in the Y direction), $Y_{MG6}$-$Y_{MG6}$' (i.e. in the Y direction), and $X_6$-$X_6$' (i.e. in the X direction) in FIG. 6J-5**, respectively, in accordance with some embodiments.

The semiconductor structure **100*c* may be similar to the semiconductor structure 100 described previously, except a dielectric wall structure is formed in accordance with some embodiments. Some processes and materials for forming the semiconductor structure 100*c* may be similar to, or the same as, those for forming the semiconductor structure 100** described previously and are not repeated herein.

First, the processes shown in FIGS. 1A and 1B described previously are performed to form the semiconductor stack over the substrate 102, and the semiconductor stack is patterned with the mask structure 110 to form a fin structures **104*c*-1 in a first region 10*c* and a fin structure 104*c*-2 in a second region 20*c*, as shown in FIGS. 6A-1, 6A-2, and 6A-3** in accordance with some embodiments.

After the fin structures **104*c*-1 and 104*c*-2 are formed, a dielectric layer 620 is formed to cover the fin structures 104*c*-1 and 104*c*-2, as shown in FIGS. 6B-1, 6B-2, and 6B-3 in accordance with some embodiments. As shown in FIGS. 6B-1 and 6B-2, the lateral space between the fin structures 104*c*-1 and 104*c*-2 are completely filled with the dielectric layer 620 in accordance with some embodiments. In some embodiments, the dielectric layer 620 includes one or multiple dielectric materials, such as $SiO_2$, SiN, SiCN, SiOC, SiOCN, $HfO_2$, $ZrO_2$, HfAlOx, HfSiOx, $Al_2O_3$, or the like. The dielectric materials may be deposited using CVD, PVD, ALD, HDPCVD, MOCVD, RPCVD, PECVD, LPCVD, ALCVD, APCVD, other applicable methods, or combinations thereof. In some embodiments, the dielectric layer 620** includes a high k shell layer and a low k core layer formed over the high k shell layer.

Next, an etching process is performed to form a dielectric wall structure 626 interposing the fin structures **104*c*-1 and 104*c*-2, as shown in FIGS. 6C-1, 6C-2, and 6C-3 in accordance with some embodiments. In some embodiments, the portions of the dielectric layer 620 outside the space between the fin structures 104*c*-1 and 104*c*-2 are removed during the etching process. In some embodiments, the etching process is performed without using a mask structure. More specifically, since the space between the fin structures 104*c*-1 and 104*c*-2 is completely filled by the dielectric layer 620, the removal of the dielectric layer 620 in the space may be much slower than that in other places. That is, the removal of the dielectric layer 620 in other regions is much easier and faster than the removal of the dielectric layer 620 in the space between the fin structures 104*c*-1 and 104*c*-2, since the top and sidewall surfaces of the dielectric layer 620 in other regions are largely exposed. Therefore, the dielectric layer 620 formed in the wider spaces can be completely removed, while the dielectric layer 620 formed in the region between the fin structures 104*c*-1 and 104*c*-2 are only partially removed during the etching process. In some embodiments, the mask structures 110 formed over the fin structures 104*c*-1 and 104*c*-2** are also partially etched during the etching process.

After the dielectric wall structure 626 is formed, the isolation structure 116 is formed around the fin structures 104*c*-1 and 104*c*-2, as shown in FIGS. 6D-1, 6D-2, and 6D-3 in accordance with some embodiments. Afterwards, the dummy gate structure 130 is formed across the fin structures 104*c*-1 and 104*c*-2 and the dielectric wall structure 626, as shown in FIGS. 6E-1, 6E-2, and 6E-3 in accordance with some embodiments. After the dummy gate structure 130 is formed, the spacer layer 138 is formed to cover the top surfaces and the sidewalls of the dummy gate structures 130 and the fin structures 104*c*-1 and 104*c*-2 and the top surface of the dielectric wall structure 626, as shown in FIGS. 6E-1, 6E-2, and 6E-3 in accordance with some embodiments.

After the spacer layer 138 is formed, an etching process is performed to form the gate spacers 140 and the fin spacers 142 with the spacer layer 138 and to form the source/drain recesses 144 in the fin structures 104*c*-1 and 104*c*-2, as shown in FIGS. 6F-1, 6F-2, and 6F-3 in accordance with some embodiments. In some embodiments, during the etching process for forming the source/drain recesses 144, the dielectric wall structure 626 at the source/drain regions is also slightly etched.

After the source/drain recesses 144 are formed, the inner spacers 148 are formed between the second semiconductor material layers 108, and source/drain structures 150*c*-1 and 150*c*-2 are formed in the source/drain recesses 144, as shown in FIGS. 6G-1, 6G-2, and 6G-3 in accordance with some embodiments. The source/drain structures described herein may refer to a source or a drain, individually or collectively dependent upon the context.

In some embodiments, the source/drain structures 150*c*-1 and 150*c*-2 and the source/drain structures 150-1 and 150-2 have different shapes. More specifically, the source/drain structures 150*c*-1 and 150*c*-2 are sandwiched between one fin spacer 142 and the dielectric wall structure 626 with the dielectric wall structure 126 being higher than the fin spacer 142 in accordance with some embodiments. Therefore, the source/drain structures 150*c*-1 and 150*c*-2 have asymmetry shapes in the cross-sectional view in the Y direction in accordance with some embodiments. The source/drain structure 150*c*-1 has a first side and a second side opposite the first side and has a substantially straight sidewall at the second side in accordance with some embodiments. The substantially straight sidewall of the source/drain structure 150*c*-1 is in direct contact with a first sidewall of the dielectric wall structure 626 in accordance with some embodiments. Meanwhile, a sidewall of the source/drain structure 150*c*-1 at the first side extends laterally outside the sidewall of the fin structure 104*c*-1 and further extends outside the sidewalls of the fin spacers 142 in accordance with some embodiments.

Similarly, the source/drain structure 150*c*-2 has a first side and a second side opposite the first side. In some embodiments, a substantially straight sidewall of the source/drain structure 150*c*-2 at the first side is in direct contact with a second sidewall of the dielectric wall structure 626 in accordance with some embodiments. Meanwhile, a sidewall of the source/drain structure 150*c*-2 at the second side extends laterally outside the sidewall of the fin structure 104*c*-2 and further extends outside the sidewalls of the fin spacers 142 in accordance with some embodiments. In some embodiments, the top surface of the dielectric wall structure 626 is higher than the topmost portions of the source/drain structures 150*c*-1 and 150*c*-2.

In some embodiments, the source/drain structures 150*c*-1 and 150*c*-2 are made of different types of the source/drain materials. In some embodiments, the source/drain structures 150*c*-1 are made of n-type epitaxial materials and the source/drain structures 150*c*-2 are made of p-type epitaxial materials.

After the source/drain structures 150*c*-1 and 150*c*-2 are formed, the contact etch stop layer (CESL) 160 is conformally formed to cover the source/drain structures 150*c*-1 and 150*c*-2, and the interlayer dielectric (ILD) layer 162 is formed over the contact etch stop layers 160, as shown in FIGS. 6H-1, 6H-2, and 6H-3 in accordance with some embodiments. In some embodiments, the contact etch stop layer 160 is in direct contact with the sidewalls of the dielectric wall structures 626. After the contact etch stop layer 160 and the interlayer dielectric layer 162 are deposited, a planarization process such as CMP or an etch-back process is performed until the dummy gate electrode layer 134 is exposed in accordance with some embodiments.

Next, the dummy gate structures 130 and the first semiconductor material layers 106 are removed to form gate trenches 166*c*-1 and 166*c*-2, as shown in FIGS. 6I-1, 6I-2, and 6I-3 in accordance with some embodiments. More specifically, the dummy gate structures 130 and the first semiconductor material layers 106 are removed to form channel structures (e.g. nanostructures) 108'*c*-1 and 108'*c*-2 with the second semiconductor material layers 108 of the fin structures 104*c*-1 and 104*c*-2 in accordance with some embodiments. Although not clearly shown in the figures, the channel structures 108'*c*-1 and 108'*c*-2 and the base fin structures 104B may have rounded corners.

As shown in FIG. 6I-2, the top surface and the bottom surface of each of the channel structures 108'*c*-1 and 108'*c*-2 are exposed by the gate trenches 166*c*-1 and 166*c*-2, but not all lateral sidewalls of the channel structures 108'*c*-1 and 108'*c*-2 are exposed by the gate trenches 166*c*-1 and 166*c*-2 in accordance with some embodiments. That is, one sidewall of each of the channel structures 108'*c*-1 and 108'*c*-2 is attached to the dielectric wall structure 626 and is not exposed by the gate trenches 166*c*-1 and 166*c*-2, and other three lateral sidewalls of each of the channel structures 108'*c*-1 and 108'*c*-2 are exposed by the gate trenches 166*c*-1 and 166*c*-2 in accordance with some embodiments. In the cross-sectional view along the Y direction, only one sidewall of each of the channel structures 108'*c*-1 and 108'*c*-2 is exposed by the gate trenches 166*c*-1 and 166*c*-2 in accordance with some embodiments.

In addition, the portions of the first sidewall of the dielectric wall structure 626 not attached to the channel structures 108'*c*-1 are exposed by the gate trench 166*c*-1, and the portions of the second sidewall of the dielectric wall structure 626 not attached to the channel structures 108'*c*-2 are exposed by the gate trench 166*c*-2 in accordance with some embodiments.

Next, a gate structure 168*c* is formed in the gate trenches 166*c*-1 and 166*c*-2, as shown in FIGS. 6J-1, 6J-2, 6J-3, 6J-4, and 6J-5 in accordance with some embodiments. More specifically, the processes shown in FIGS. 3A to 3H may be performed to form the gate structure 168*c*. In some embodiments, an interfacial layer 170*c* is formed over the exposed portions of the channel structures 108'*c*-1 and 108'*c*-2 and the base fin structure 104B. Afterwards, a gate dielectric layer 172*c* is formed over the interfacial layer 170*c* and over the dielectric wall structure 262 in accordance with some embodiments.

In addition, the gate dielectric layer 172*c* includes a modified portion 172'*c*-1 around the channel structures 108'*c*-1 in the first region 10*c* and a portion 172*c*-2 around the channel structures 108'*c*-2 in the second region 20 in accordance with some embodiments. In some embodiments, the modified portion 172'*c*-1 of the gate dielectric layer 172*c* partially covers and in direct contact with the first sidewall and the top surface of the dielectric wall structure 626. On the other hand, the portion 172*c*-2 of the gate dielectric layer 172*c* partially covers and in direct contact with the second sidewall and the top surface of the dielectric wall structure 626 in accordance with some embodiments. As shown in FIG. 6J-4, a boundary between the modified portion 172'*c*-1 and the portion 172*c*-2 is located over the top surface of the dielectric wall structure 626 in accordance with some embodiments. The modified portion 172'*c*-1 treated with the metal elements may be formed by performing the processes shown in FIGS. 3A to 3D described previously and are not repeated herein.

After the modified portion 172'*c*-1 is formed, the processes shown in FIGS. 3E to 3H may be performed to form the gate structure 168*c*. That is, a gate dielectric layer 182*c*, a cap layer 184*c*, a work function metal layer 190*c*, and a gate filling layer 192*c* are formed in accordance with some embodiments. In addition, all of the gate dielectric layer 182*c*, the cap layer 184*c*, the work function metal layer 190*c*, and the gate filling layer 192*c* continuously extend from the channel structures 108'*c*-1 to the channel structures 108'*c*-2 and passing through the top surface of the dielectric wall structure 626 in accordance with some embodiments. In some embodiments, the semiconductor structure 100*c* includes a transistor Tc-1 including a portion 168*c*-1 of the gate structure 168*c* formed around the channel structures 108'*c*-1 and a transistor Tc-2 including a portion 168*c*-2 of the gate structure 168*c* formed around the channel structures 108'*c*-2.

As shown in FIG. 6J-2, the dielectric wall structure 626 interposes the channel structures 108'*c*-1 and 180'*c*-2 in accordance with some embodiments. In addition, the dielectric wall structure 626 is substantially parallel to the fin structures 104*c*-1 and 104*c*-2 and longitudinally oriented along the X direction, as shown in FIG. 6J-5 in accordance with some embodiments.

Processes and materials for forming the fin structures 104*c*-1 and 104*c*-2, the source/drain structures 150*c*-1 and 150*c*-2, the gate trenches 166*c*-1 and 166*c*-2, the channel structures 108'*c*-1 and 108'*c*-2, the gate structure 168*c*, the interfacial layer 170*c*, the gate dielectric layer 172*c*, the gate dielectric layer 182*c*, the cap layer 184*c*, the work function metal layer 190*c*, and the gate filling layer 192*c* may be similar to, or the same as, those for forming the fin structures 104-1 and 104-2, the source/drain structures 150-1 and 150-2, the gate trenches 166-1 and 166-2, the channel structures 108'-1 and 108'-2, the gate structure 168, the interfacial layer 170, the gate dielectric layer 172, the gate dielectric layer 182, the cap layer 184, the work function metal layer 190, and the gate filling layer 192 described previously and are not repeated herein.

Moreover, in some other embodiments, the cap layer 184*c* of the semiconductor structure 100*c* may be removed, similar to the semiconductor structure 100*a* described previously. Furthermore, the gate dielectric layer 172 may be treated according to the processes shown in FIGS. 5A to 5G in accordance with some embodiments. For example, the portion 172*c*-1 of the gate dielectric layer 172 may be modified twice, similar to, or the same as, the portion 172*b*"-1 of the semiconductor structure 100*b*. For example, the portion 172*c*-2 of the gate dielectric layer 172 may also be treated, similar to, or the same as, the portion 172"*b*-1 or 172'*b*-3 of the semiconductor structure 100*b*.

FIGS. 6J'-2 and 6J'-3 illustrate cross-sectional views of a semiconductor structure 100*c*' in accordance with some embodiments. The semiconductor structure 100*c*' may be similar to the semiconductor structure 100*c* described previously, except the cap layer 184 between the channel structures 108'*c*-1 and 108'*c*-2 is merged in accordance with some embodiments. That is, the work function metal layer 190*c* does not extend between the channel structures 108'*c*-1 and 108'*c*-2 in accordance with some embodiments. In some embodiments, the thickness of the cap layer 184*c* in the semiconductor structure 100*c*' is greater than about 3 nm. Processes and materials for forming the semiconductor structure 100*c*' may be similar to, or the same as, those for forming the semiconductor structure 100*c* described previously and are not repeated herein.

Figures 3, 7A:
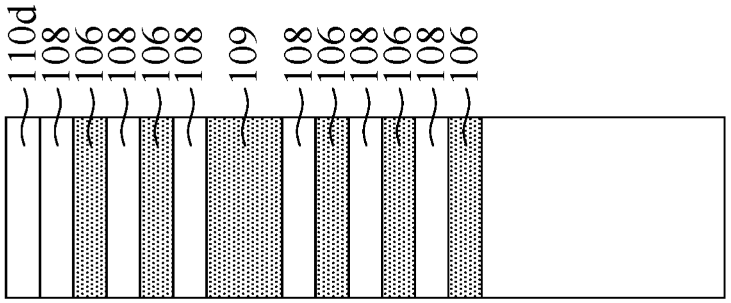
Figures 2, 7A:
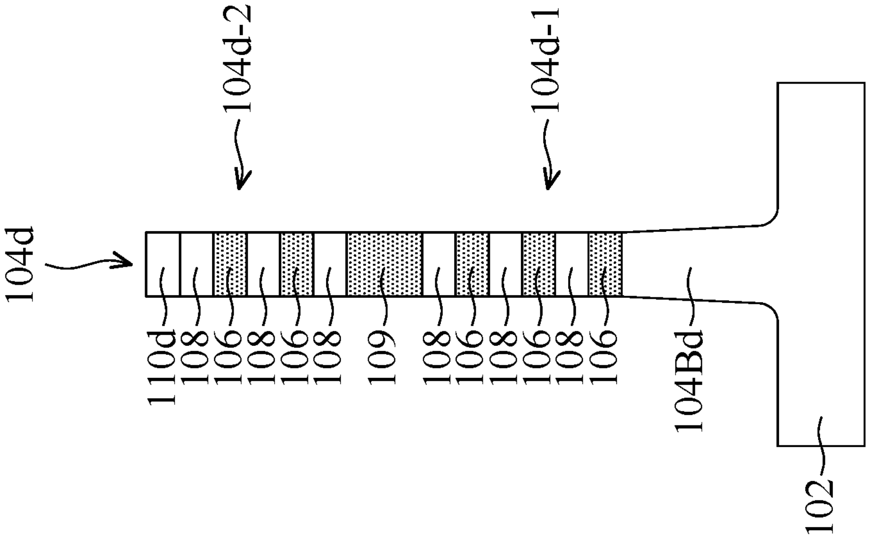
Figures 1, 7A:
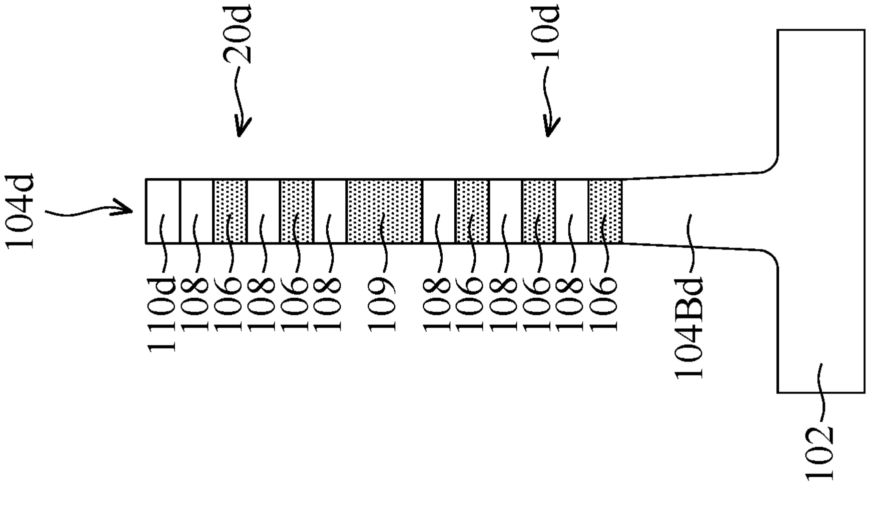
Figures 1, 7B:
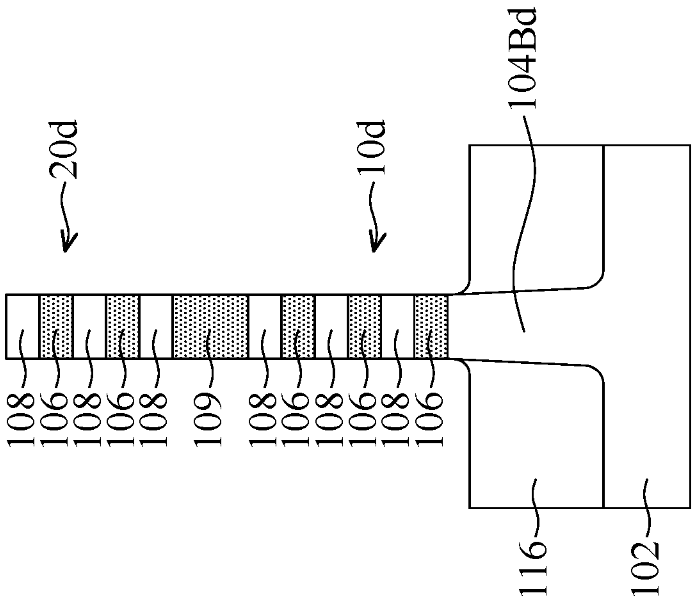
Figures 2, 7B:
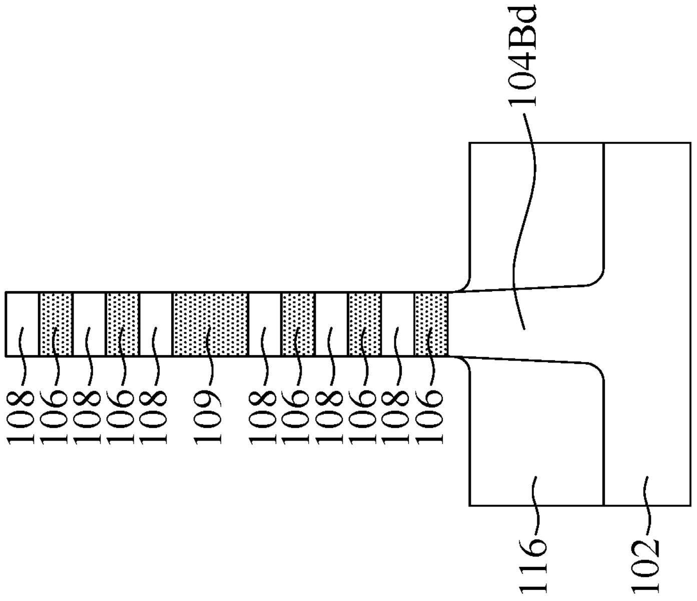
Figures 3, 7B:
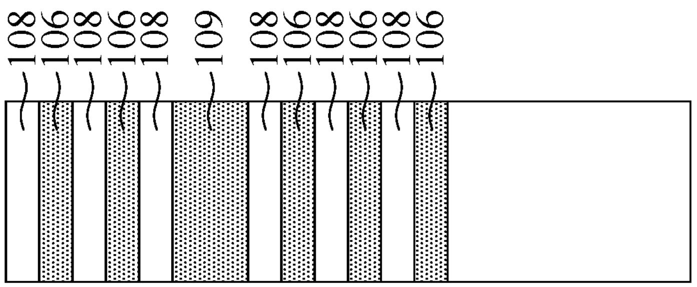
Figures 1, 7C:
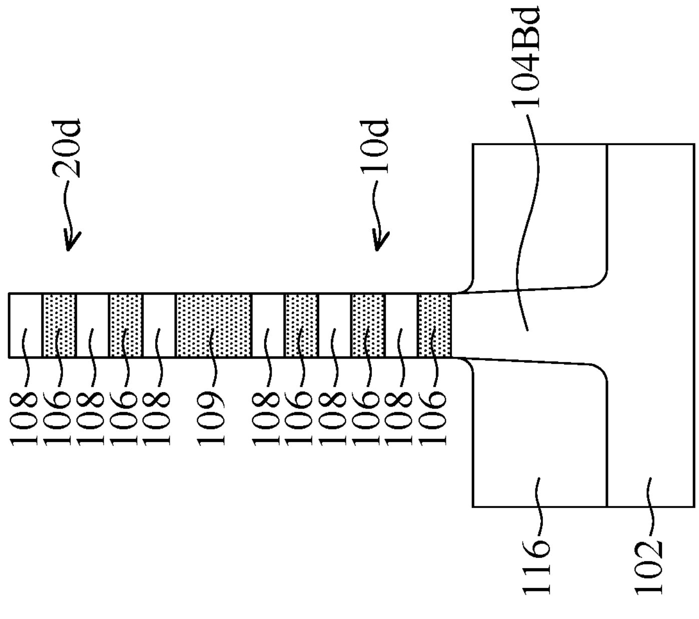
Figures 2, 7C:
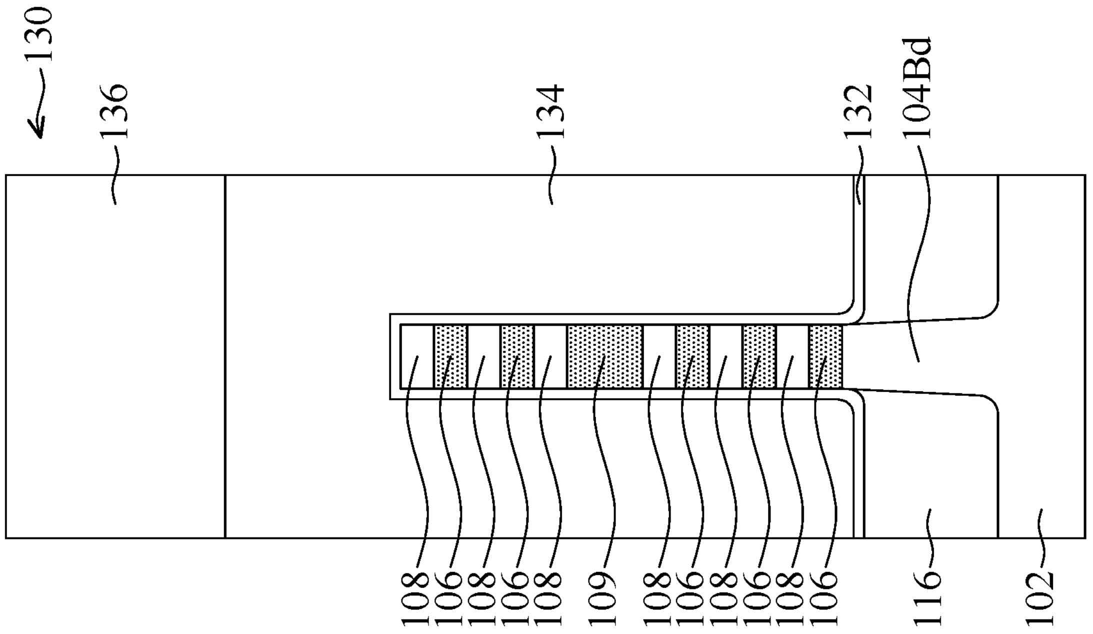
Figures 3, 7C:
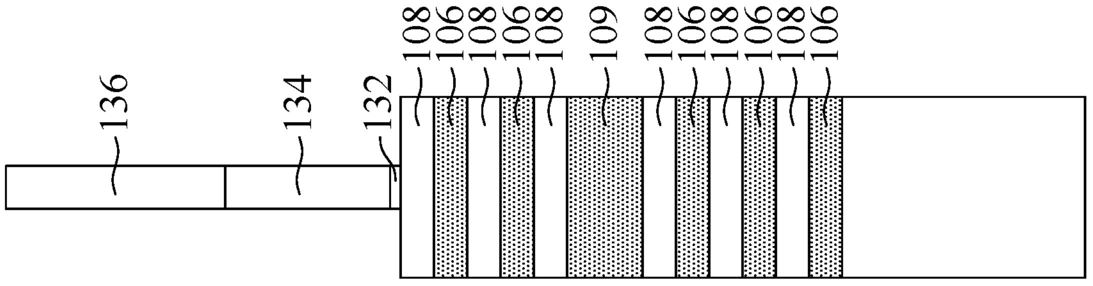
Figures 1, 7D:
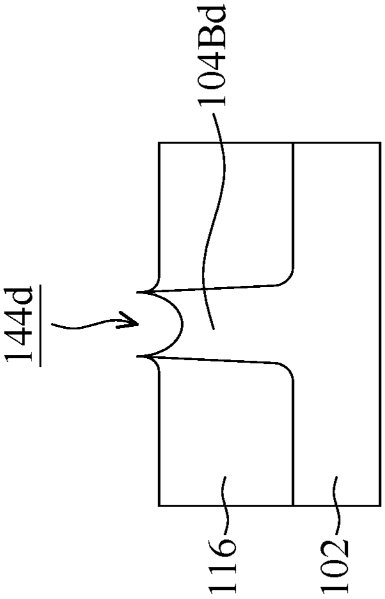
Figures 2, 7D:
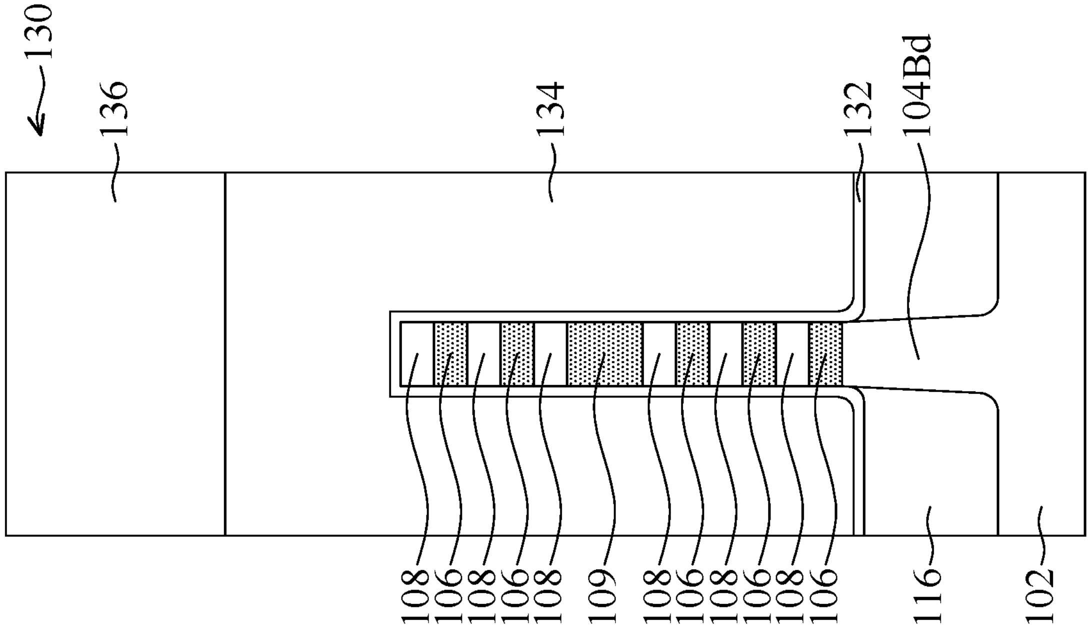
Figures 3, 7D:
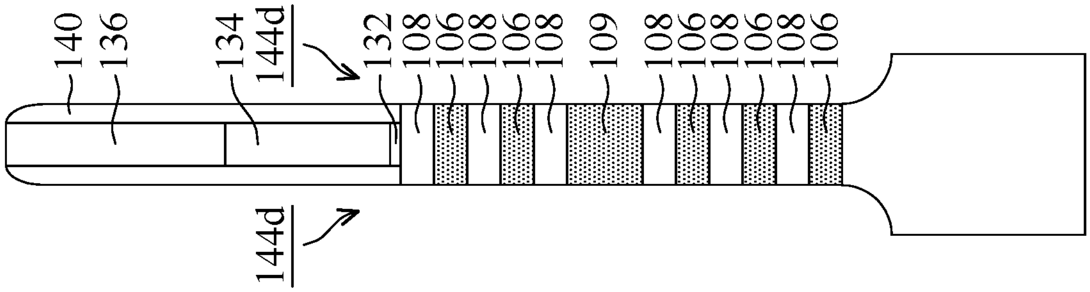
Figures 3, 7E:
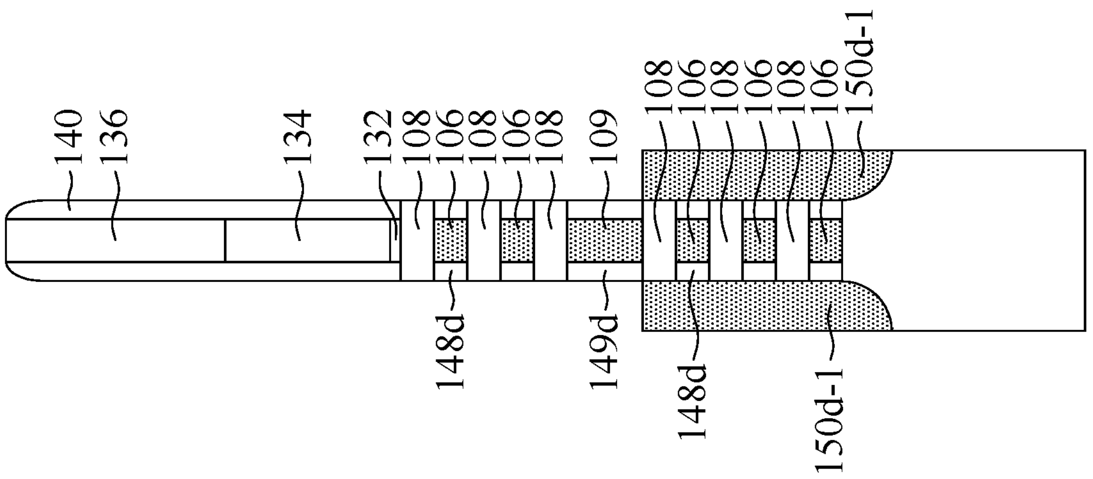
Figures 2, 7E:
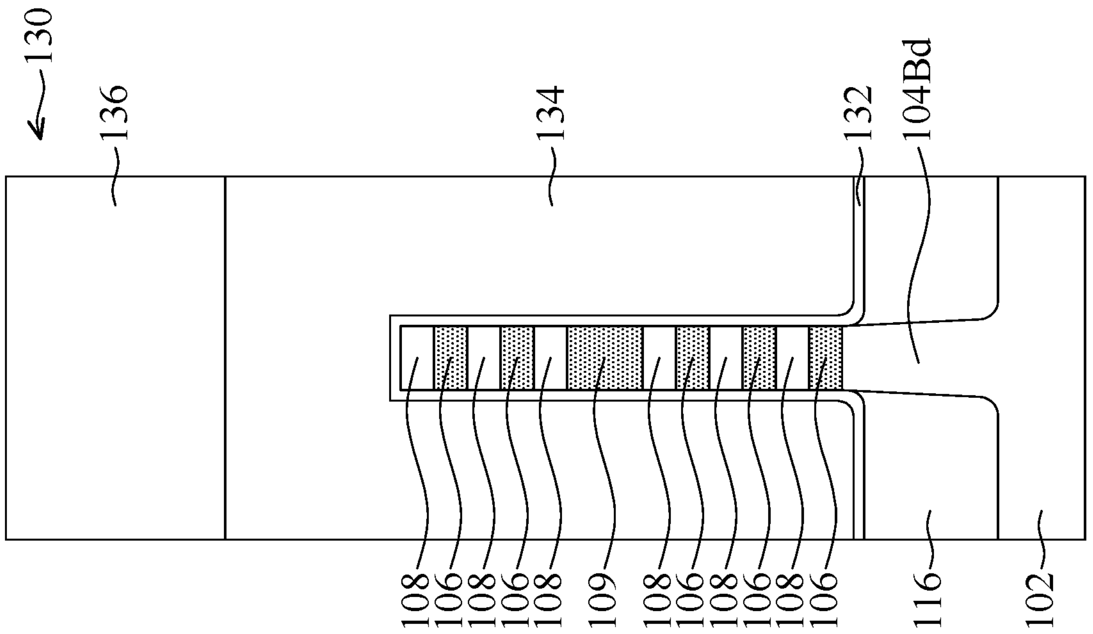
Figures 1, 7E:
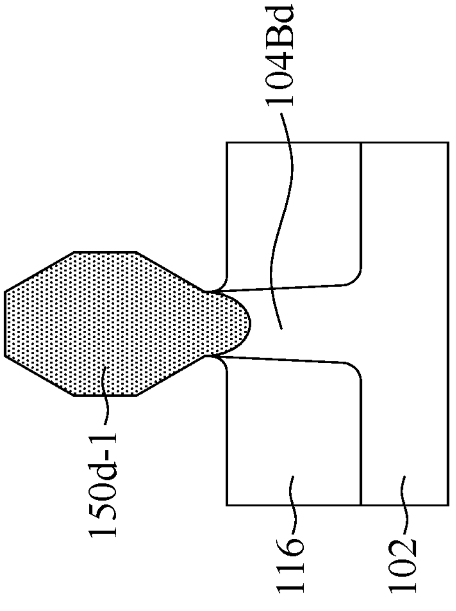
Figures 3, 7F:
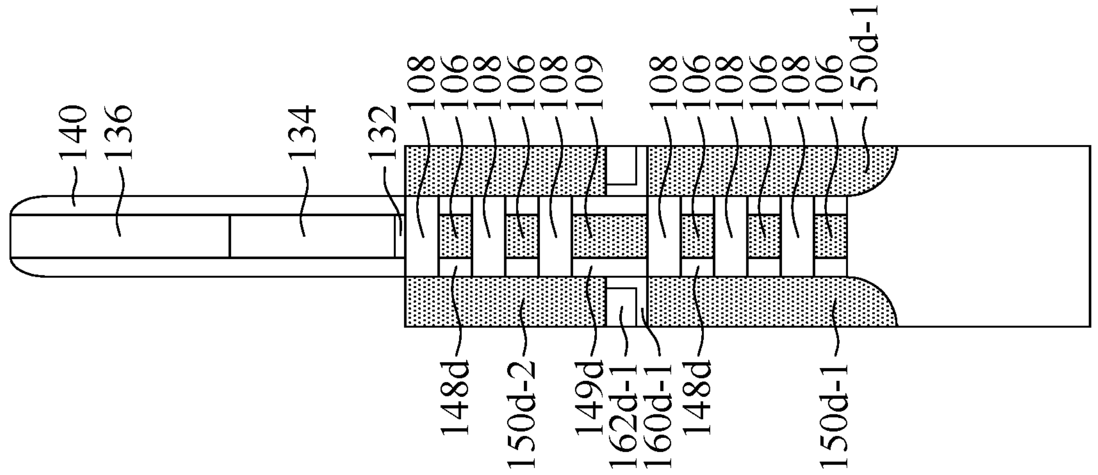
Figures 2, 7F:
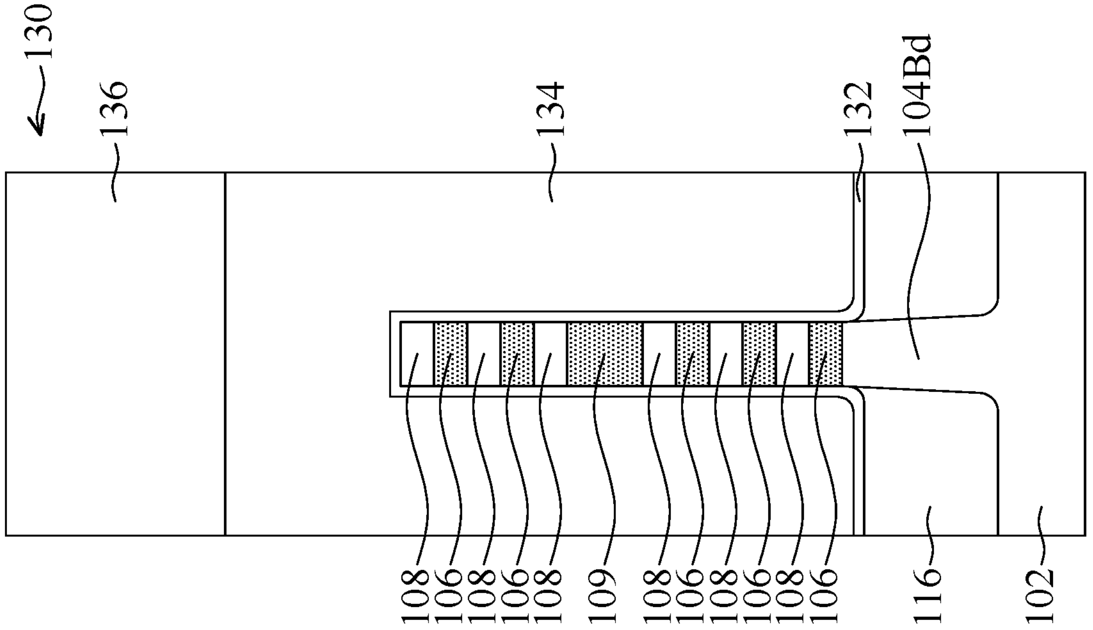
Figures 1, 7F:
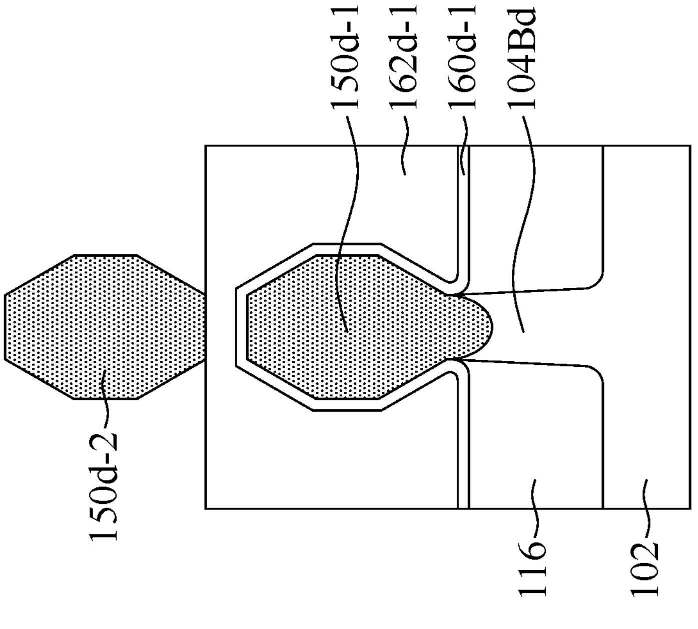
Figures 3, 7G:
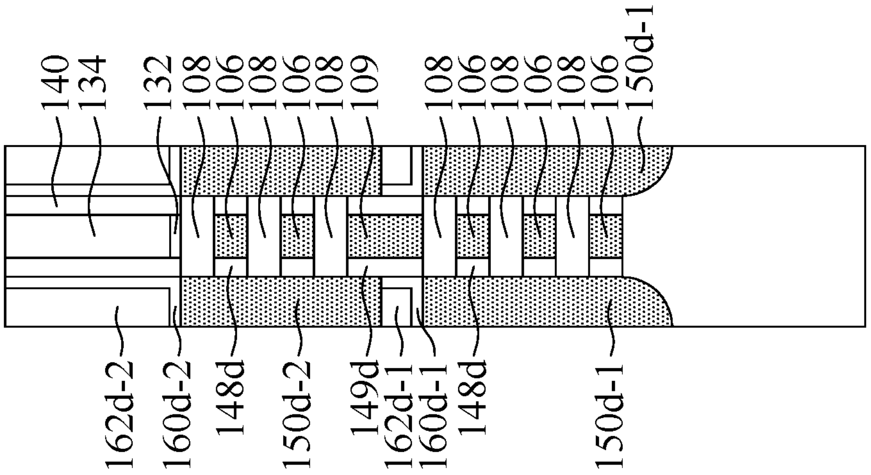
Figures 2, 7G:
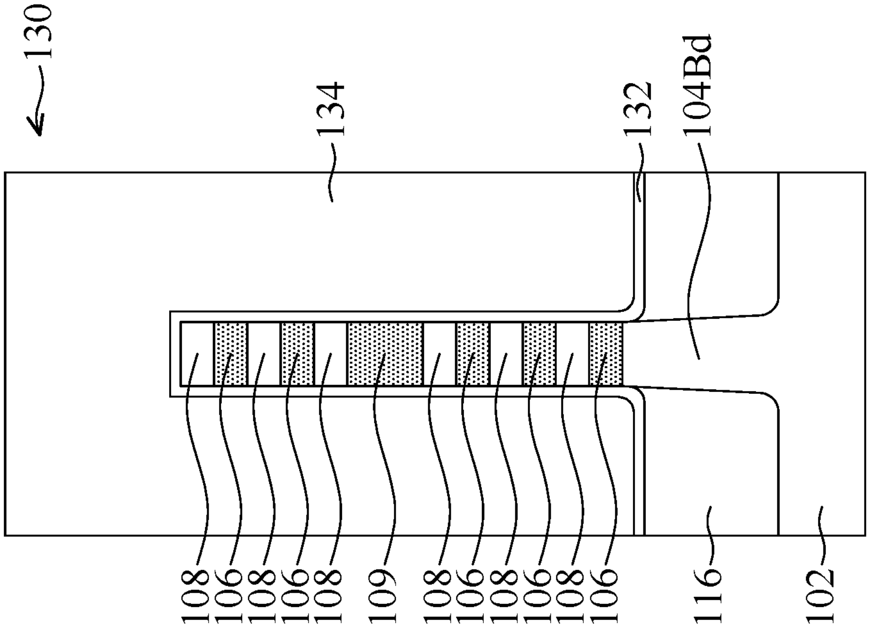
Figures 1, 7G:
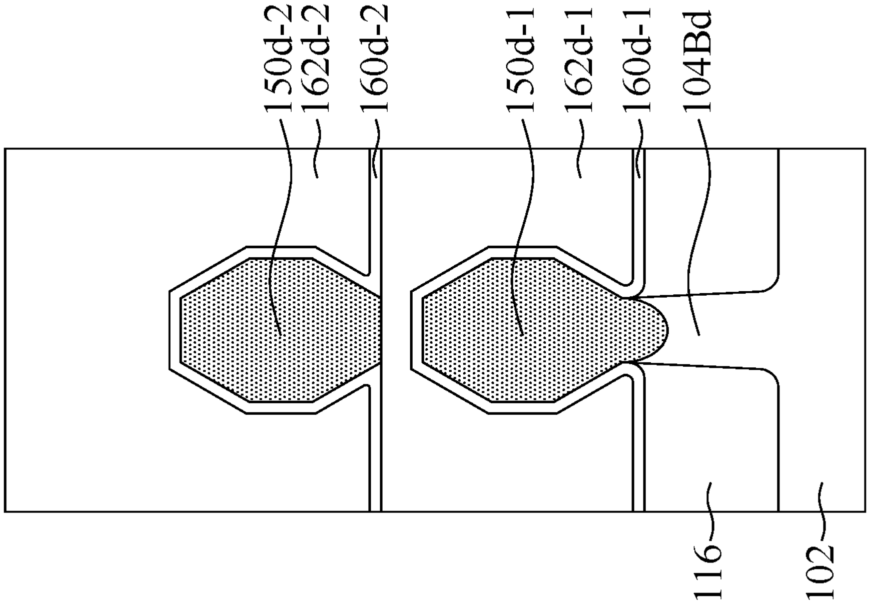
Figures 1, 7H:
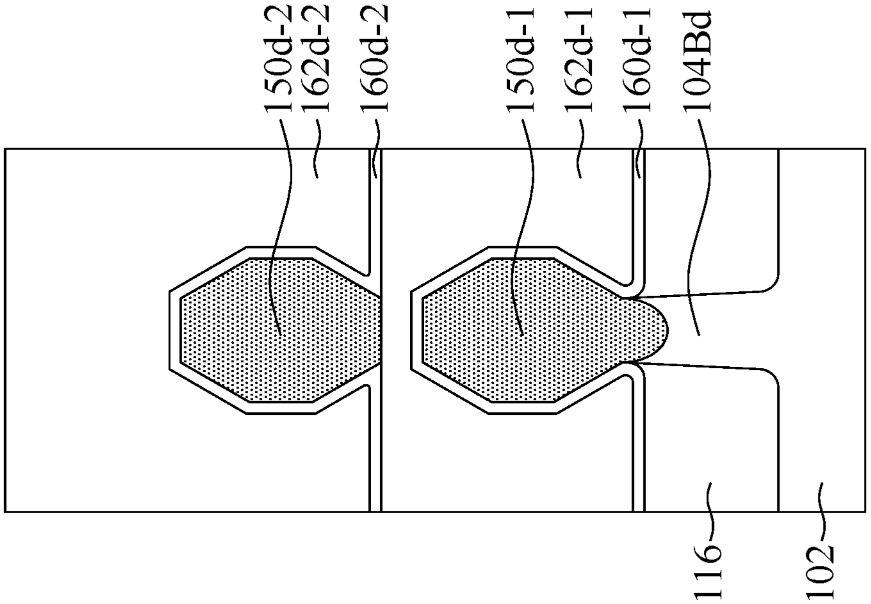
Figures 2, 7H:
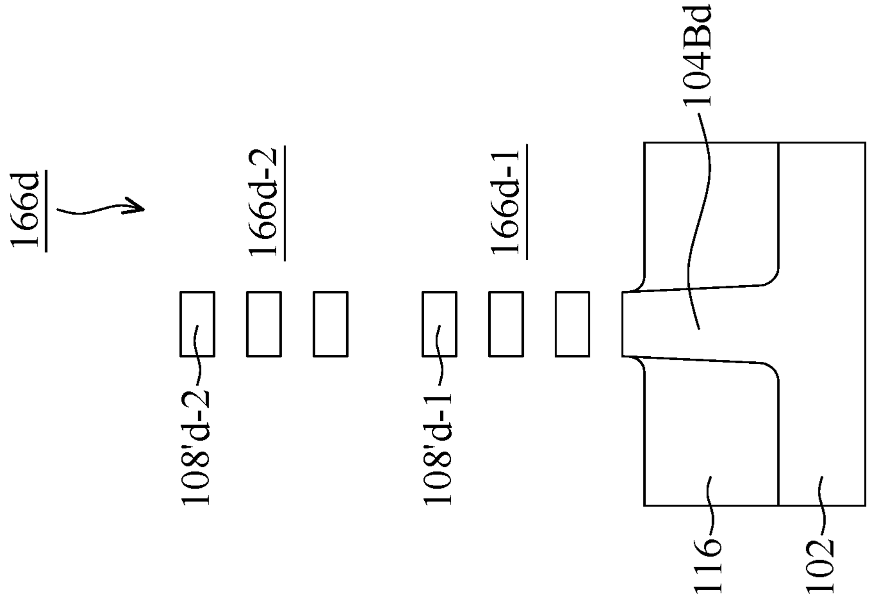
Figures 3, 7H:
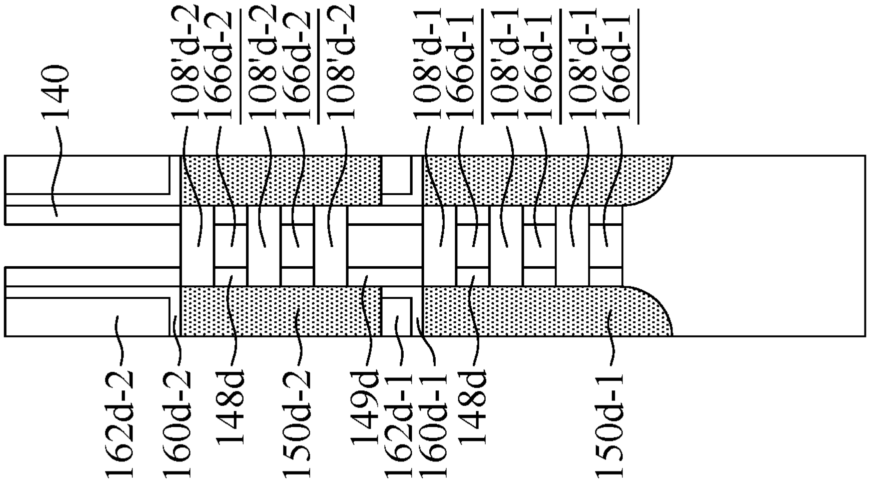
Figures 3, 7I:
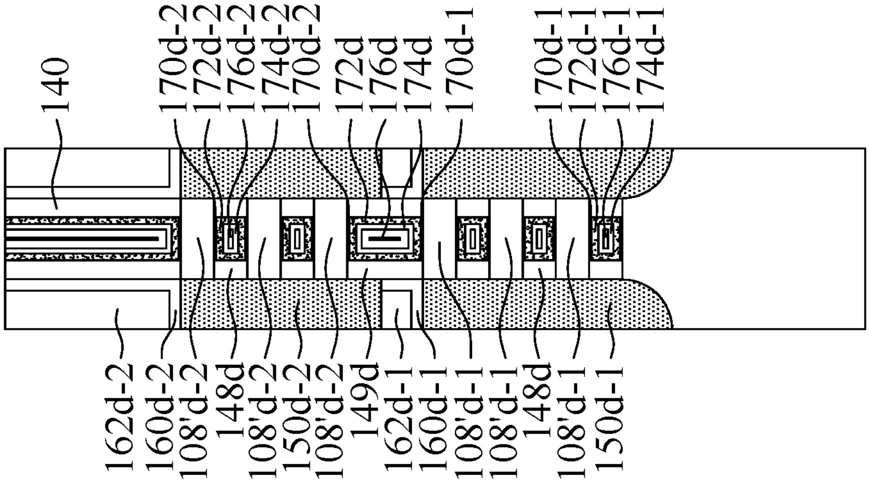
Figures 2, 7I:
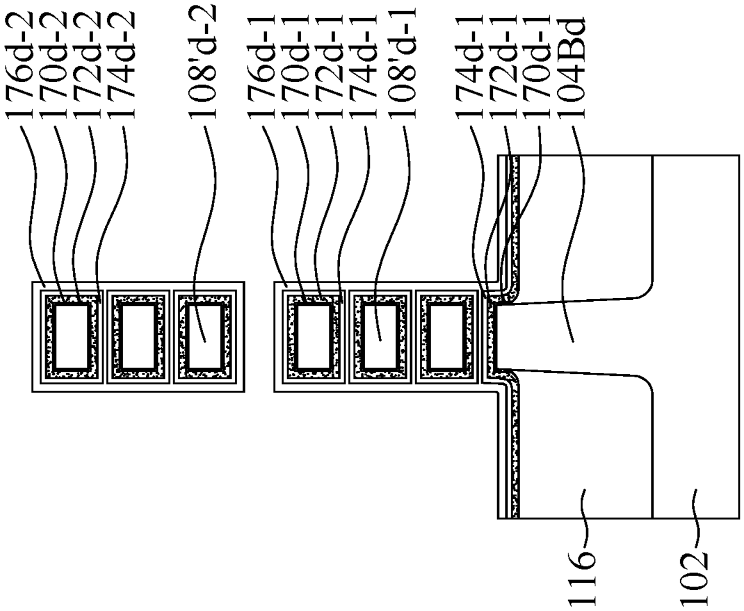
Figures 1, 7I:
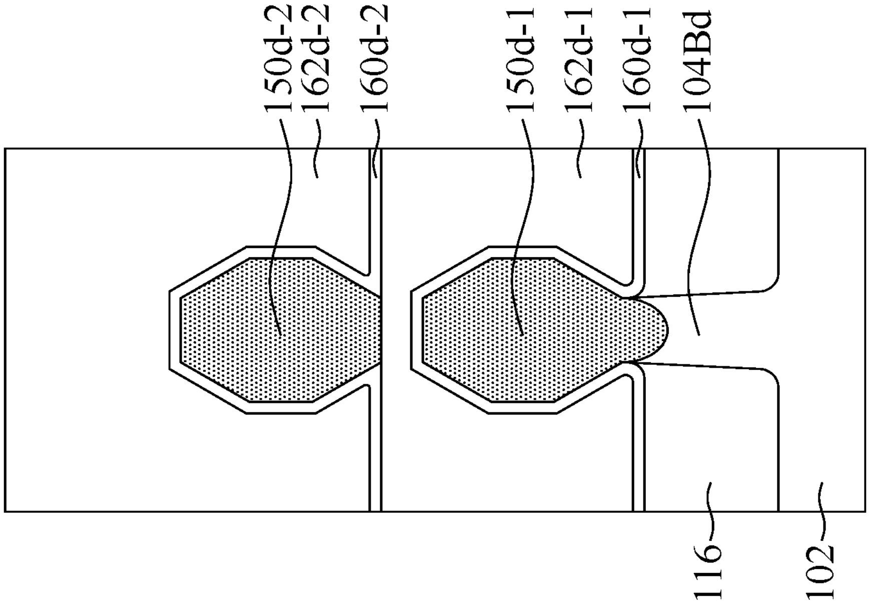
Figures 3, 7J:
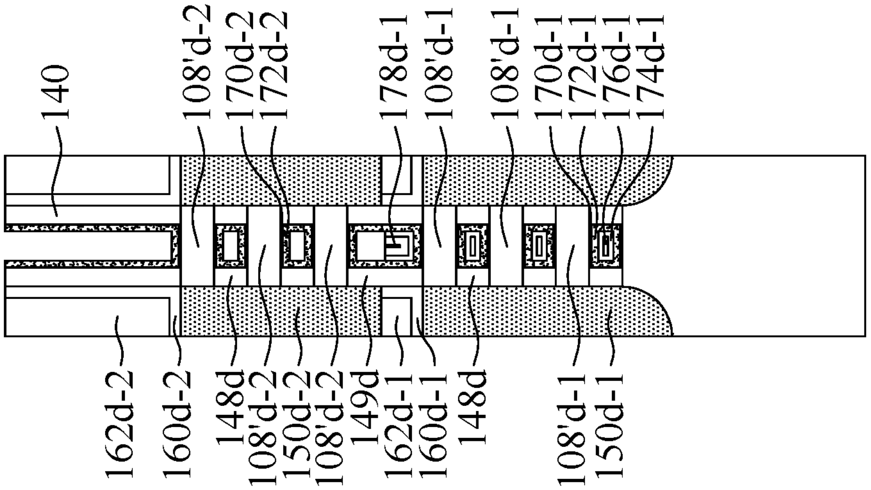
Figures 2, 7J:
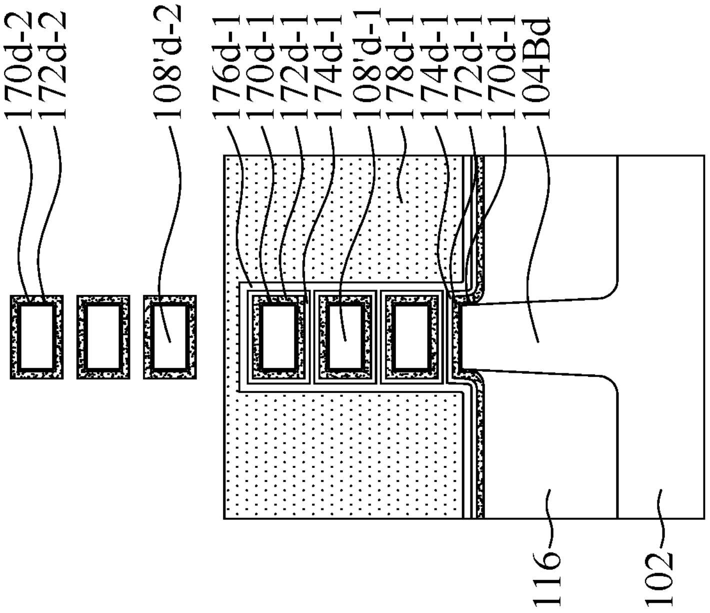
Figures 1, 7J:
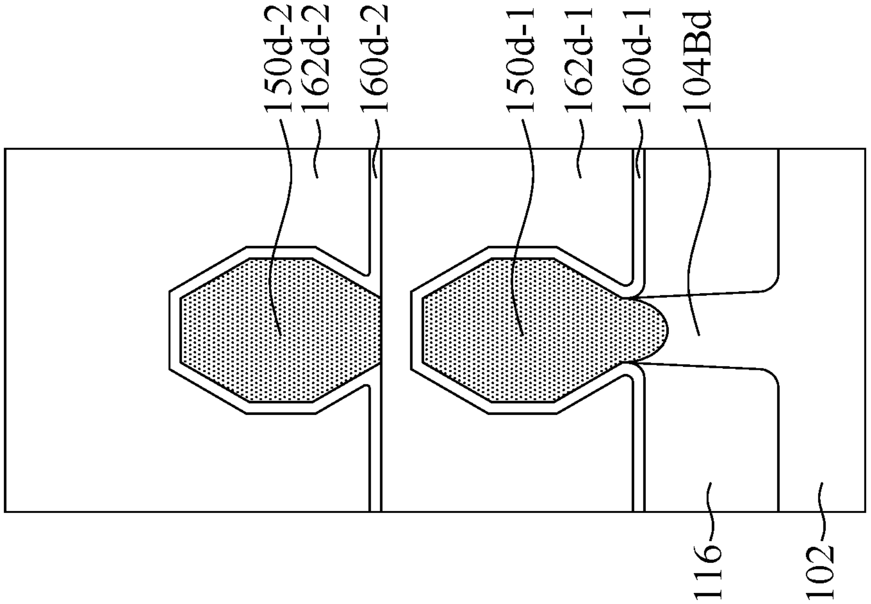
Figures 3, 7K:
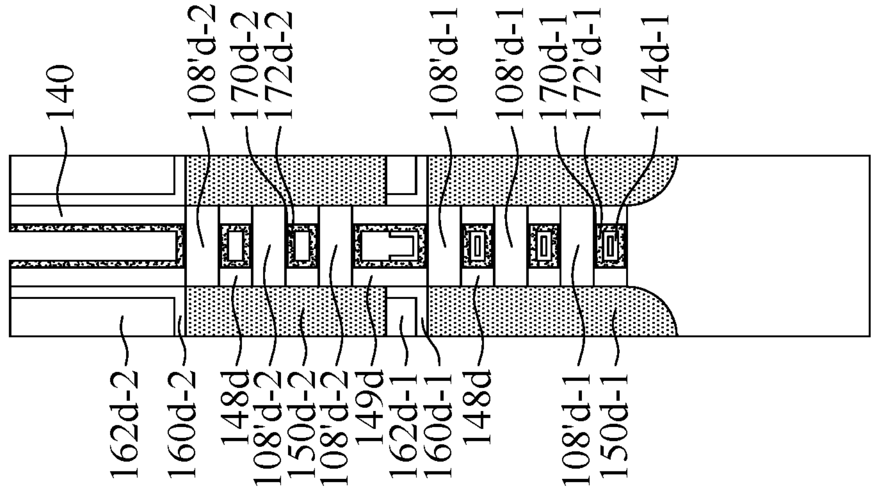
Figures 2, 7K:
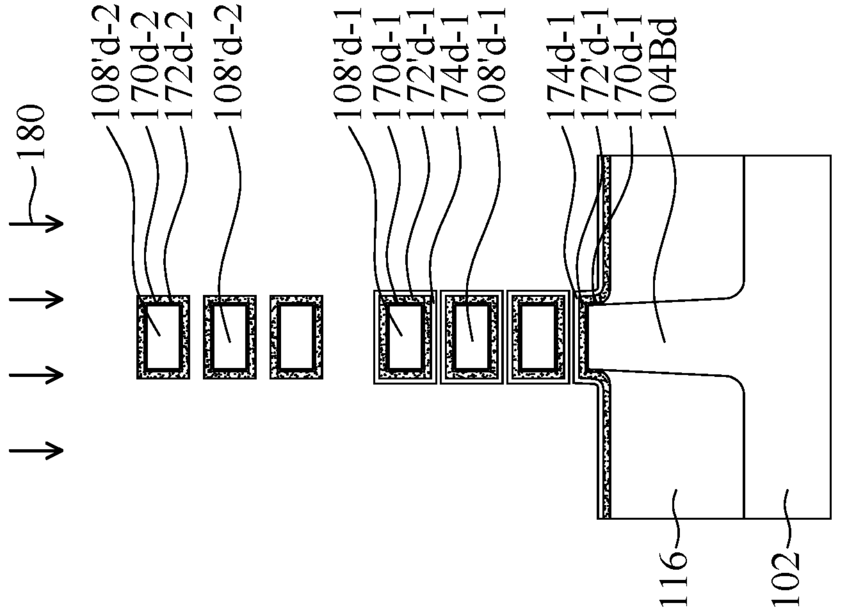
Figures 1, 7K:
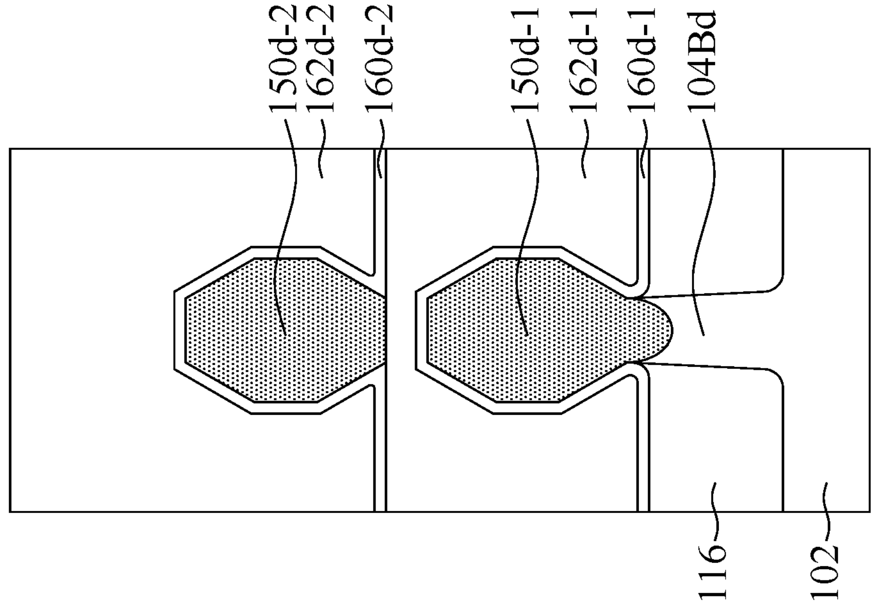
Figures 1, 7L:
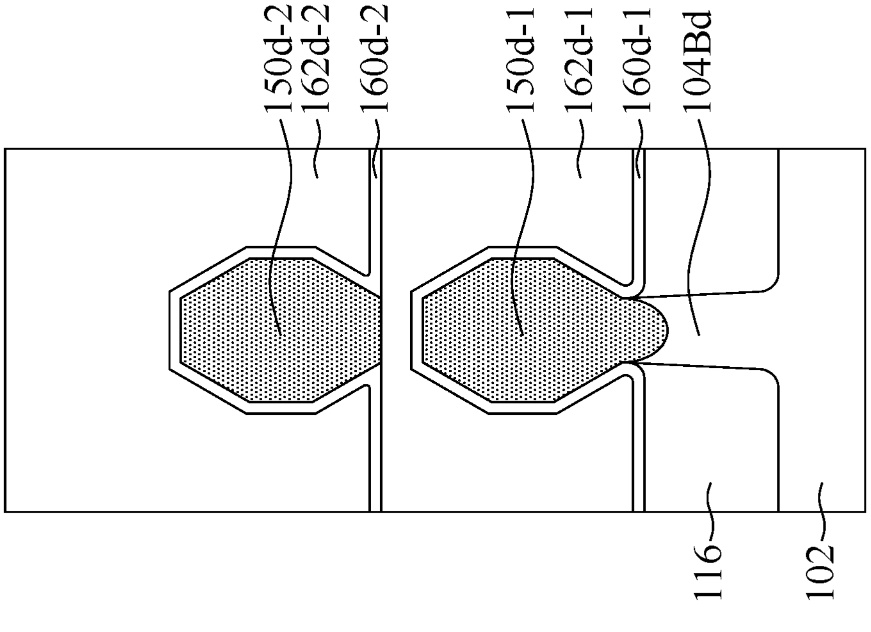
Figures 2, 7L:
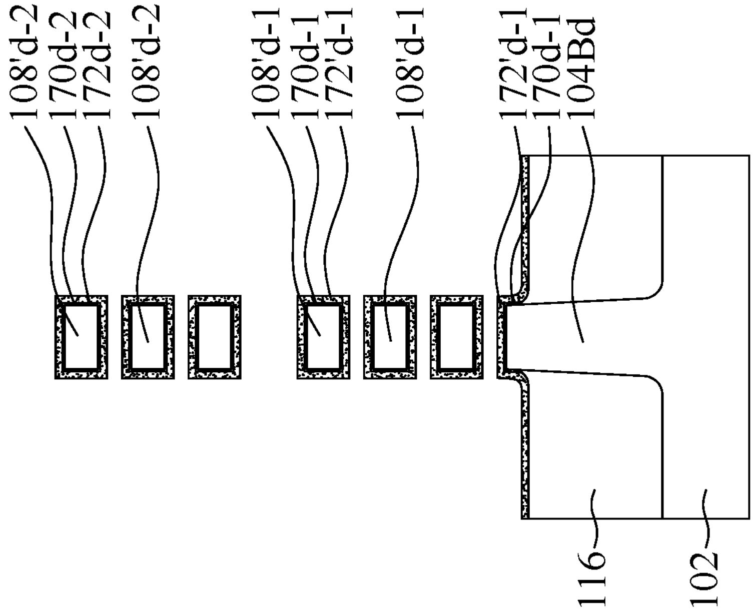
Figures 3, 7L:
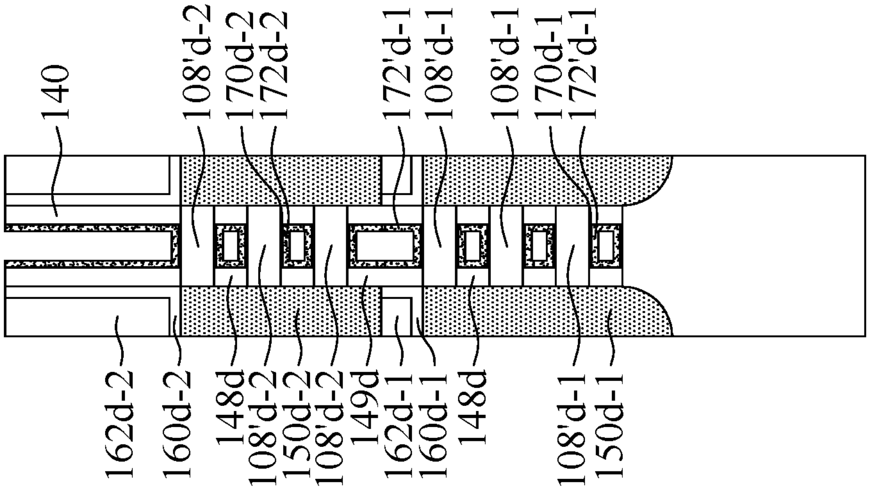
Figures 3, 7M:
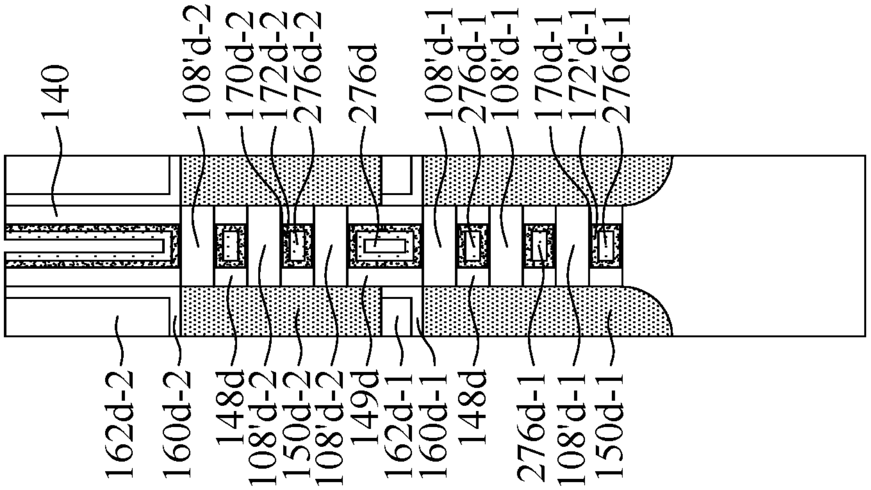
Figures 2, 7M:
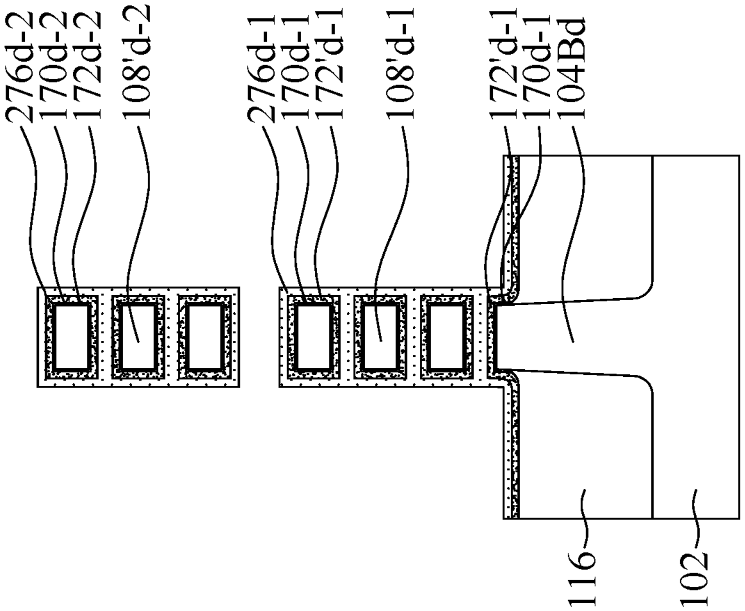
Figures 1, 7M:
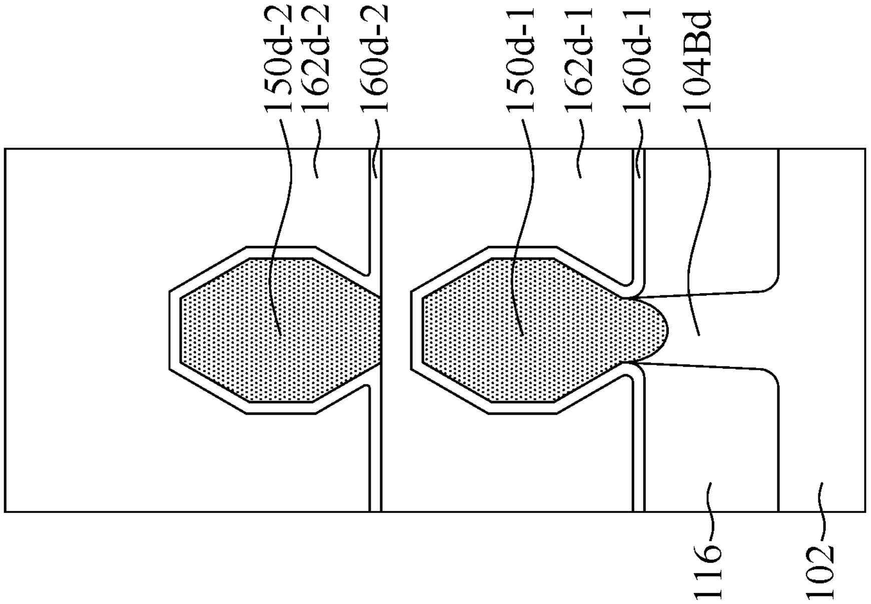
Figures 3, 7N:
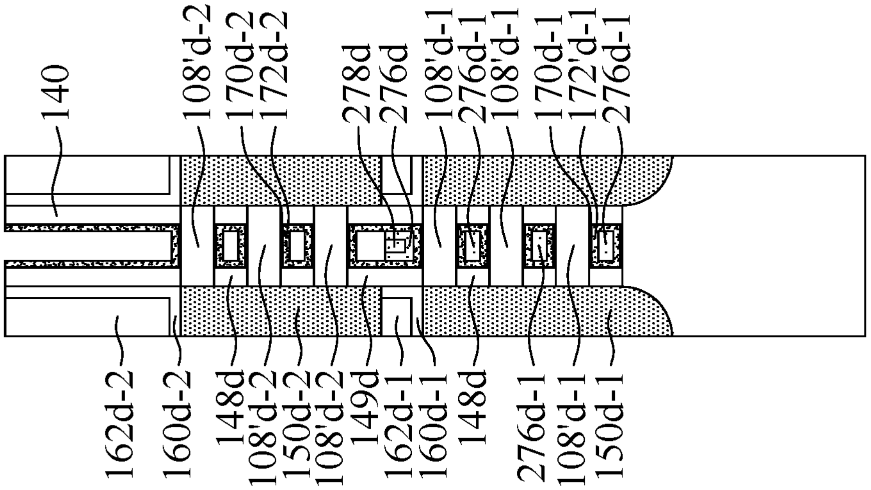
Figures 2, 7N:
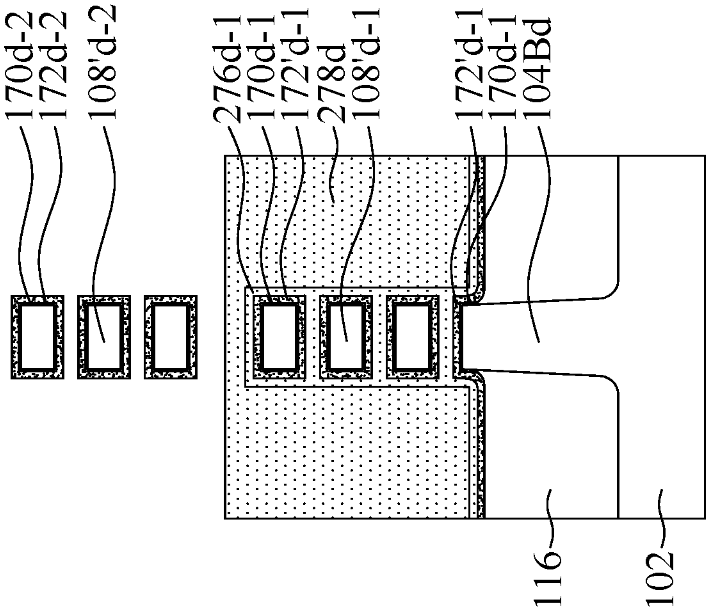
Figures 1, 7N:
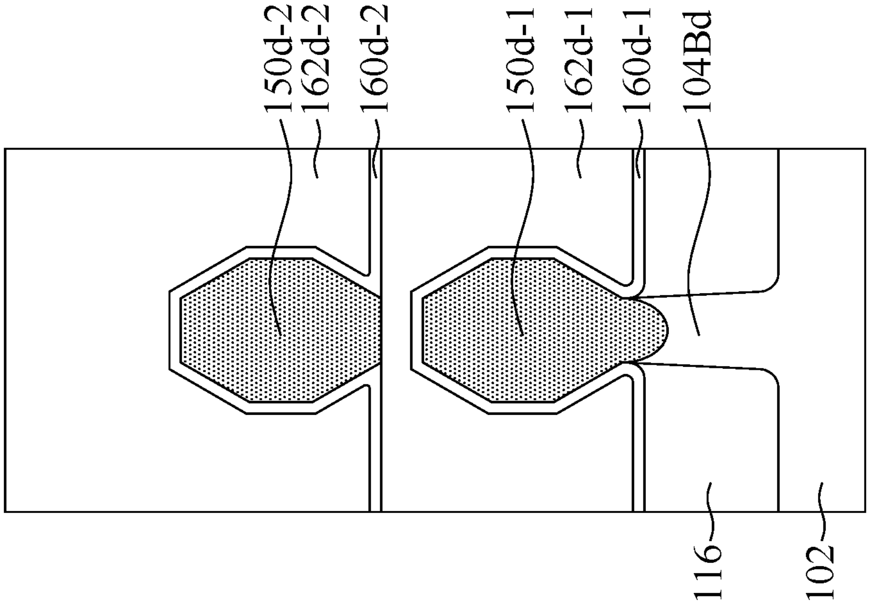
Figures 3, 7O:
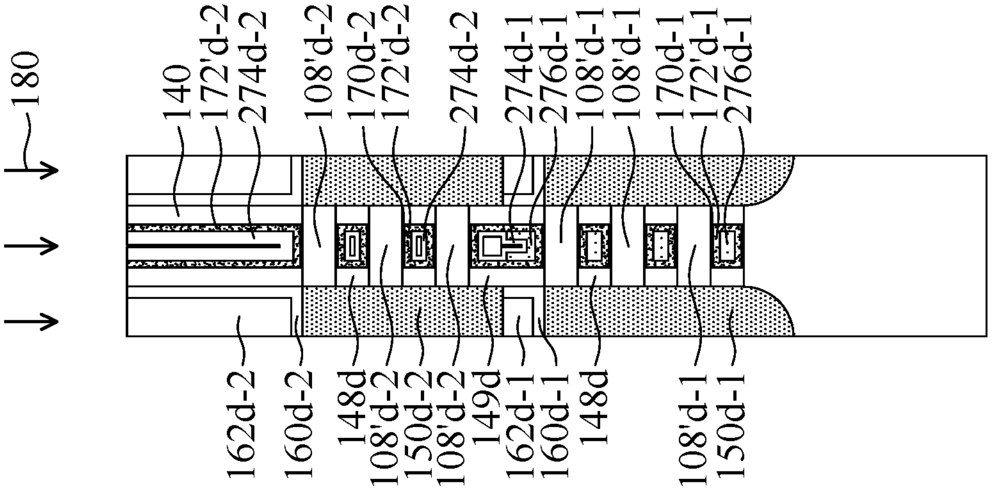
Figures 2, 7O:
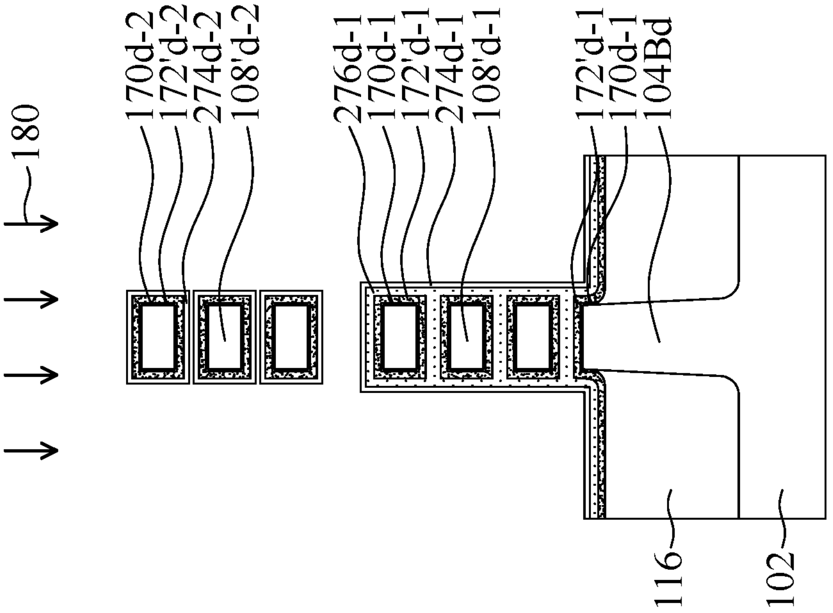
Figures 1, 7O:
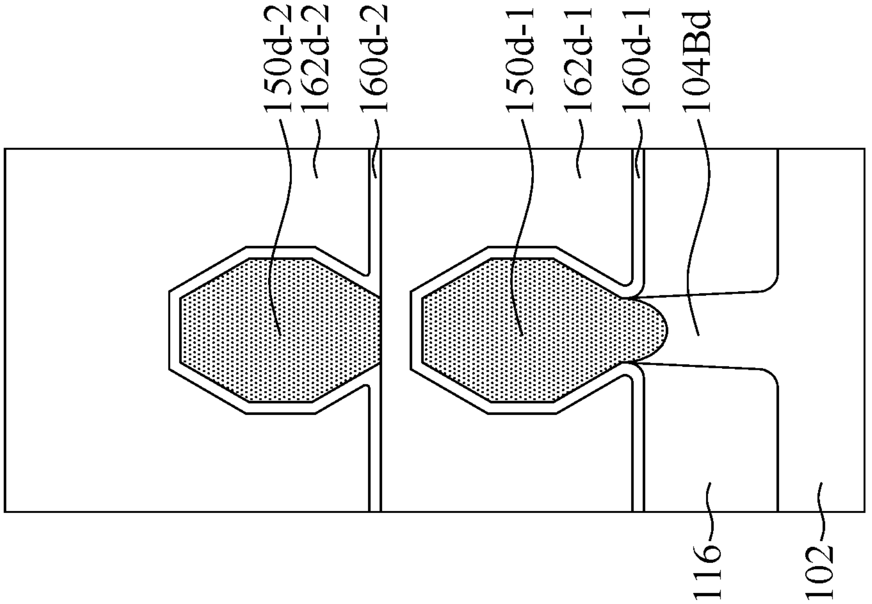
Figures 1, 7P:
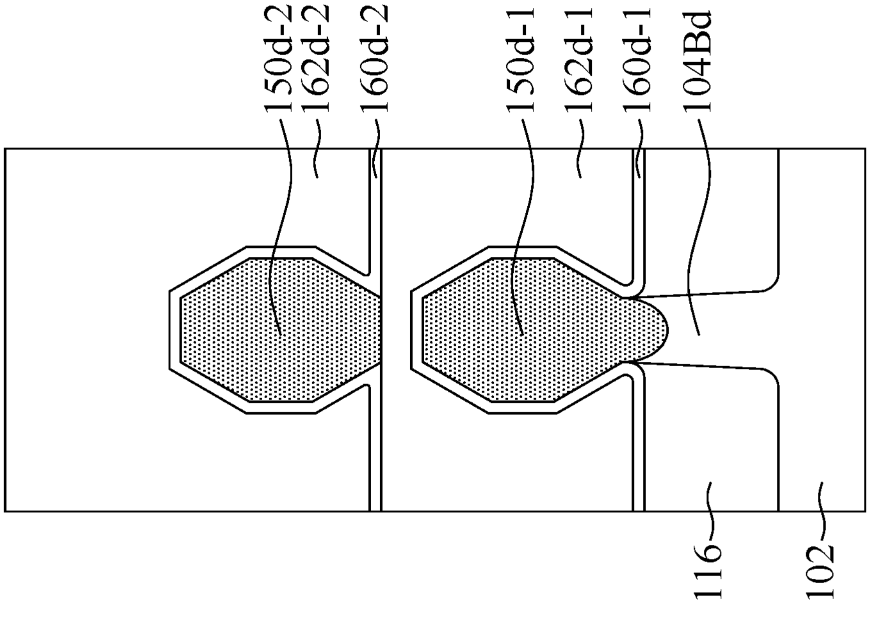
Figures 2, 7P:
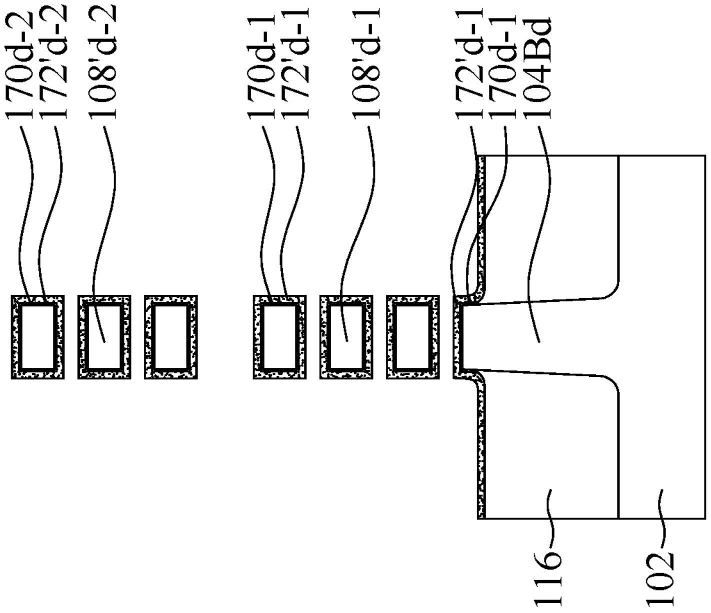
Figures 3, 7P:
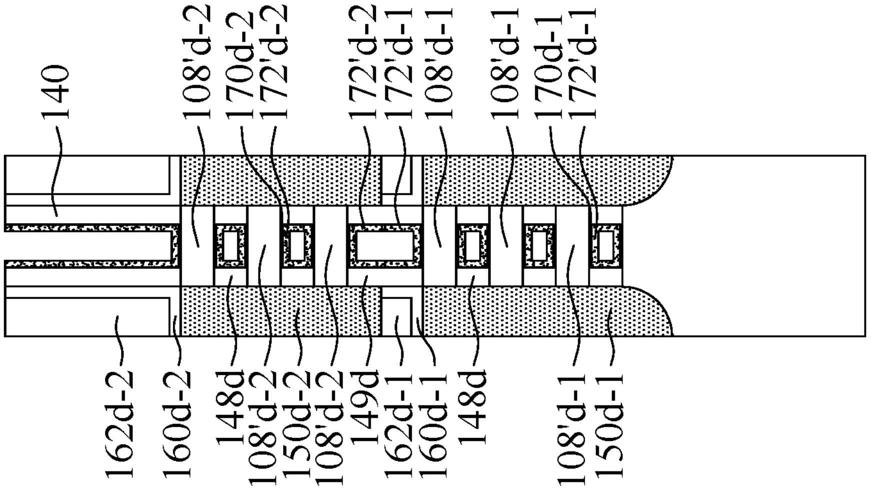
Figures 1, 7Q:
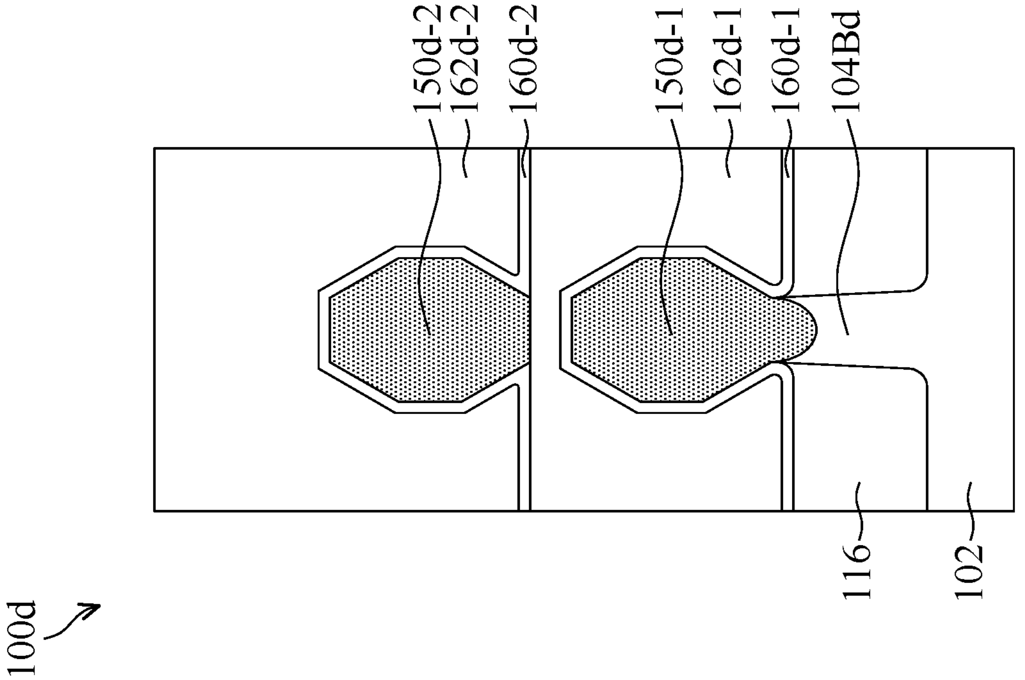
Figures 2, 7Q:
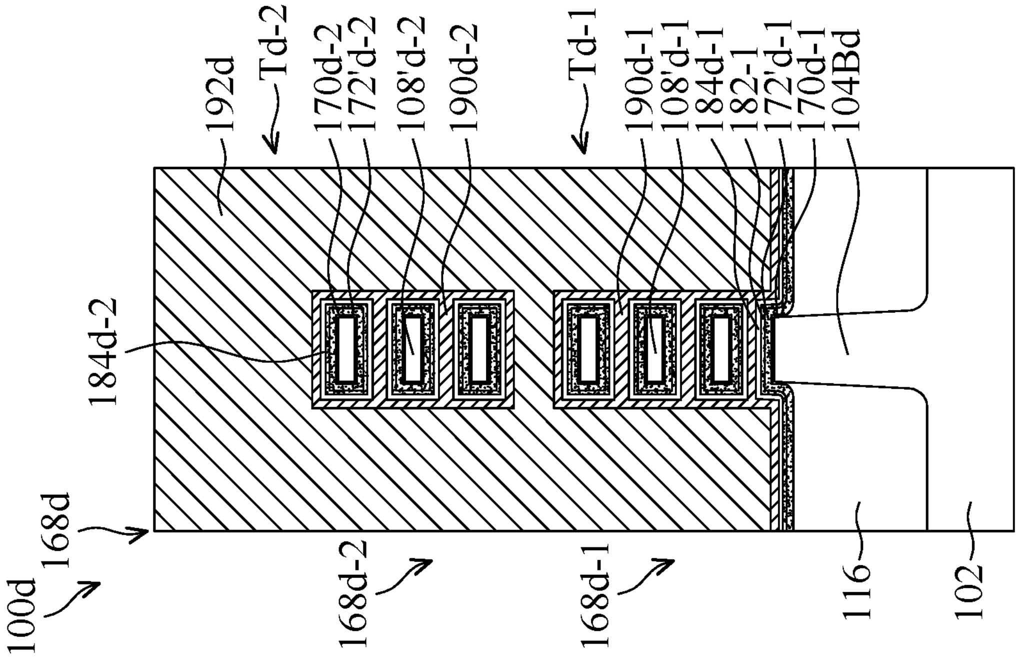
Figures 3, 7Q:
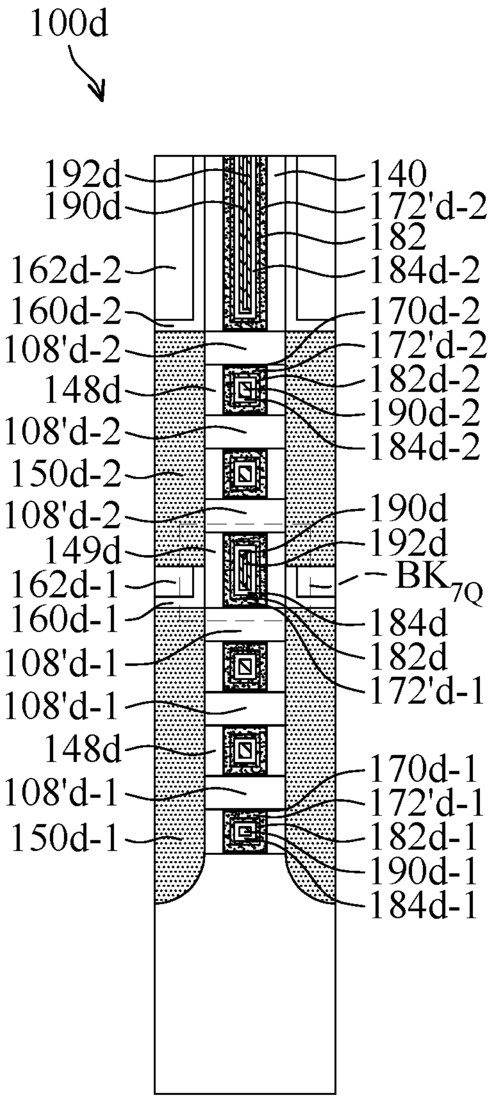
Figures 4, 7Q:
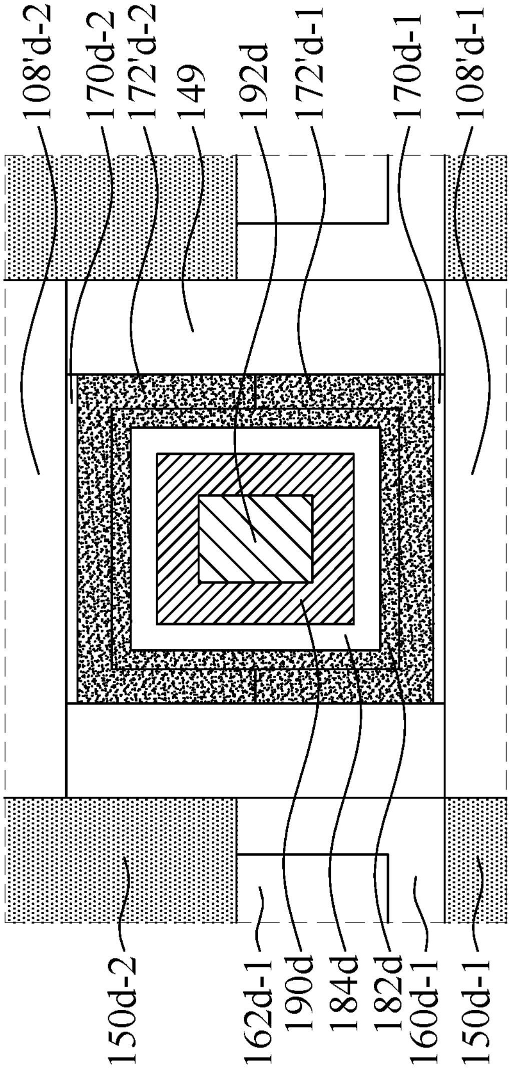
Figures 5, 7Q:
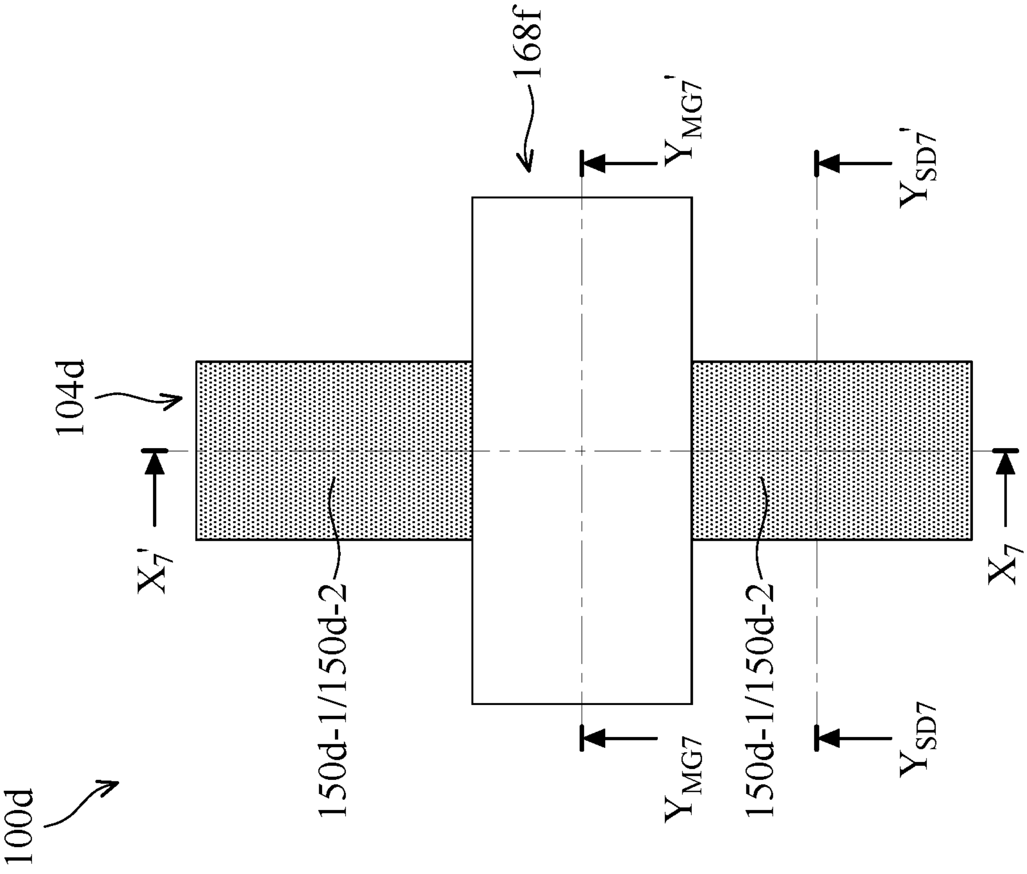
Figure 7Q:
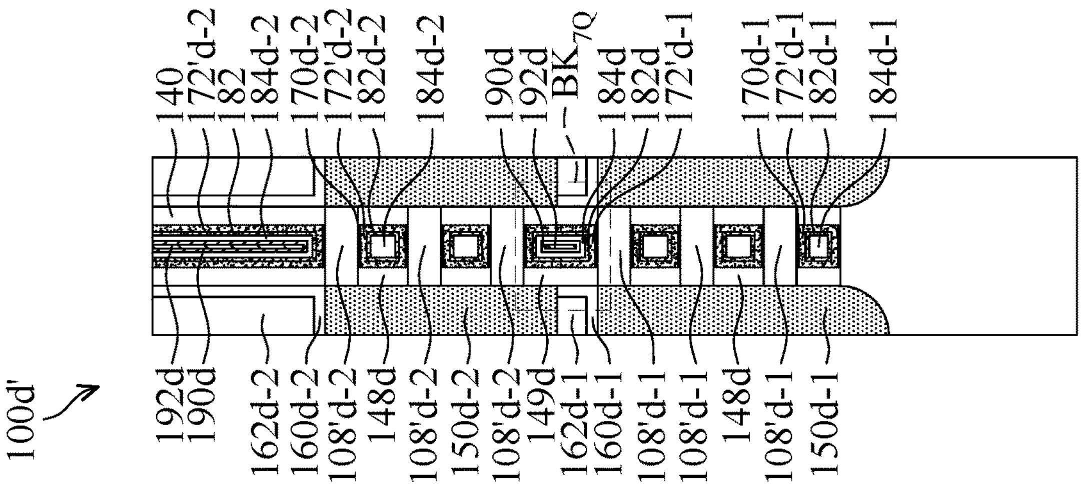
Figure 7Q:
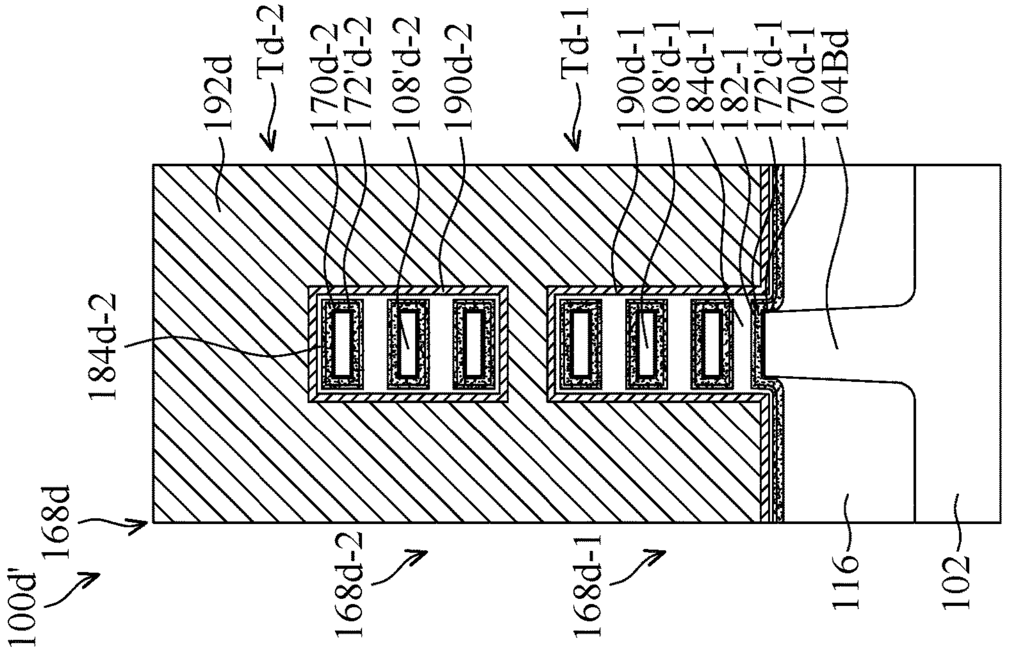

FIGS. 7A-1 to 7Q-1, 7A-2 to 7Q-2, and 7A-3 to 7Q-3 illustrate cross-sectional views of intermediate stages of manufacturing a semiconductor structure 100*d* in accordance with some embodiments. FIG. 7Q-4 illustrates an enlarged cross-sectional view of the semiconductor structure 100*d* of block $BK_{7Q}$ shown in FIG. 7Q-3 in accordance with some embodiments. FIG. 7Q-5 illustrates a diagrammatic top view of the semiconductor structure 100*d* in accordance with some embodiments. FIG. 7Q-5 has been simplified for the sake of clarity to better understand the inventive concepts of the present disclosure. More specifically, FIGS. 7A-1 to 7Q-1, 7A-2 to 7Q-2, and 7A-3 to 7Q-3 illustrate the cross-sectional views of intermediate stages of manufacturing the semiconductor structure 100*d* shown along line $Y_{SD7}$-$Y_{SD7}$' (i.e. in the Y direction), $Y_{MG7}$-$Y_{MG7}$' (i.e. in the Y direction), and $X_7$-$X_7$' (i.e. in the X direction) in FIG. 7Q-5, respectively, in accordance with some embodiments. Some processes and materials for forming the semiconductor structure 100*d* may be similar to, or the same as, those for forming the semiconductor structure 100 described previously and are not repeated herein.

First, a first semiconductor stack and a second semiconductor stack are formed in a first region 10*d* and a second region 20*d* over the substrate 102, and the first semiconductor stack, the second semiconductor stack, and the substrate 102 are patterned with a mask structure 110*d* to form a fin structure 104*d*, as shown in FIGS. 7A-1, 7A-2, and 7A-3 in accordance with some embodiments. As shown in FIG. 7A-1, the fin structure 104*d* includes a first portion 104*d*-1 including the first semiconductor stack formed in the first region 10*d*, a second portion 104*d*-2 including the second semiconductor stack formed in the second region 20*d*, and a base fin structure 104Bd in accordance with some embodiments. In addition, the first portion 104*d*-1 of the fin structure 104*d* vertically overlaps the second portion 104*d*-2 of the fin structure 104*d* in accordance with some embodiments.

In some embodiments, both the first semiconductor stack and the second semiconductor stack include the first semiconductor material layers 106 and the second semiconductor material layers 108 alternately stacked. In addition, a middle layer 109 is formed over the first semiconductor stack, and the second semiconductor stack is formed over the middle layer 109 in accordance with some embodiments. In some embodiments, the middle layer 109 is made of a material the same as that the first semiconductor material layers 106 are made of. In some embodiments, the middle layer 109 is made of SiGe.

After the fin structure 104*d* is formed, the mask structure 110*d* is removed, and the isolation structure 116 is formed around the fin structure 104*d*, as shown in FIGS. 7B-1, 7B-2, and 7B-3 in accordance with some embodiments. Afterwards, the dummy gate structure 130 is formed across the fin structure 104*d*, as shown in FIGS. 7C-1, 7C-2, and 7C-3 in accordance with some embodiments. After the dummy gate structure 130 is formed, a spacer layer is formed and an etching process is performed to form the gate spacers 140 and the source/drain recesses 144*d*, as shown in FIGS. 7D-1, 7D-2, and 7D-3 in accordance with some embodiments.

After the source/drain recesses 144*d* are formed, the first semiconductor material layers 106 in both the first region 10*d* and the second region 20*d* and the middle layer 109 are laterally etched to form notches, and inner spacers 148*d* are formed in the notches between the second semiconductor material layers 108 in both the first region 10*d* and the second region 20*d* and a middle spacer 149 is formed in the notch between the first region 10*d* and the second region 20*d*, as shown in FIGS. 7E-1, 7E-2, and 7E-3 in accordance with some embodiments. In some embodiments, the middle spacer 149 and the inner spacers 148*d* are made of the same material.

After the inner spacers 148*d* and the middle spacer 149 are formed, source/drain structures 150*d*-1 are formed in the bottom regions of the source/drain recesses 144*d*, as shown in FIGS. 7E-1, 7E-2, and 7E-3 in accordance with some embodiments. As shown in FIG. 7E-3, the source/drain structures 150*d*-1 are attached to opposite sides of the second semiconductor material layers 108 in the first portion 104*d*-1 of the fin structure 104*d* in the first region 10*d* in accordance with some embodiments.

Next, a contact etch stop layer (CESL) 160*d*-1 and an interlayer dielectric (ILD) layer 162*d*-1 are formed over the source/drain structures 150*d*-1 in the middle portions of the source/drain recesses 144*d*, as shown in FIGS. 7F-1, 7F-2, and 7F-3 in accordance with some embodiments. In some embodiments, the contact etch stop layer 160*d*-1 covers and in direct contact with the sidewalls of the middle spacers 149. In some embodiments, the contact etch stop layer 160*d*-1 and the interlayer dielectric layer 162-1 laterally sandwiched between the middle spacers 149.

After the contact etch stop layer 160*d*-1 and the interlayer dielectric layer 162*d*-1 are formed, source/drain structures 150*d*-2 are formed in the upper portion of the source/drain recesses 144*d*, as shown in FIGS. 7F-1, 7F-2, and 7F-3 in accordance with some embodiments. As shown in FIG. 7F-3, the source/drain structures 150*d*-2 are attached to opposite sides of the second semiconductor material layers 108 in the second portion 104*d*-2 of the fin structure 104*d* in the second region 20*d* in accordance with some embodiments. In some embodiments, the source/drain structures 150*d*-1 and 150*d*-2 are different types of source/drain structures. In some embodiments, the source/drain structures 150*d*-1 are made of n-type epitaxial materials, and the source/drain structures 150*d*-2 are made of p-type epitaxial materials.

Next, a contact etch stop layer 160*d*-2 and an interlayer dielectric layer 162*d*-2 are formed over the source/drain structures 150*d*-2 in the upper portions of the source/drain recesses 144*d*, and a polishing process is performed until the dummy gate electrode 130 is exposed, as shown in FIGS. 7G-1, 7G-2, and 7G-3 in accordance with some embodiments.

Next, the dummy gate structures 130, the first semiconductor material layers 106 in both the first region 10*d* and the second region 20*d*, and the middle layer 109 are removed to form gate trenches 166*d* including first portions 166*d*-1 and second portions 166*d*-2, as shown in FIGS. 7H-1, 7H-2, and 7H-3 in accordance with some embodiments. More specifically, the dummy gate structures 130 and the first semiconductor material layers 106 are removed to form channel structures (e.g. nanostructures) 108'*d*-1 and 108'*d*-2 with the second semiconductor material layers 108 of the first portion 104*d*-1 and the second portion 104*d*-2 of the fin structure 104*d* in accordance with some embodiments. Although not clearly shown in the figures, the channel structures 108'*d*-1 and 108'*d*-2 and the base fin structures 104Bd may have rounded corners.

As shown in FIGS. 7H-2 and 7H-3, the channel structures 108'*d*-2 vertically overlaps and aligned with the channel structures 108'*d*-1 in accordance with some embodiments. In some embodiments, a vertical distance between the bottommost structure of the channel structures 108'*d*-2 and the topmost structure of the channel structures 108'*d*-1 is greater than the vertical distance between the neighboring channel structures 108'*d*-1 and is also greater than the vertical distance between the neighboring channel structures 108'*d*-2.

After the channel structures 108'*d*-1 and 108'-2 are formed, interfacial layers 170*d* (including 170*d*-1 and 170*d*-2), gate dielectric layers 172*d* (including 172*d*-1 and 172*d*-2), dipole layers 174*d* (including 174*d*-1 and 174*d*-2), and hard mask layers 176*d* (including 176*d*-1 and 176*d*-2) are formed, as shown in FIGS. 71-1, 71-2, and 71-3 in accordance with some embodiments. More specifically, the interfacial layers 170*d*-1, the gate dielectric layers 172*d*-1, the dipole layers 174*d*-1, and the hard mask layer 176*d*-1 are formed to wrap around the channel structures 108'*d*-1 and to cover the base fin structure 104Bd, and the interfacial layers 170*d*-2, the gate dielectric layers 172*d*-2, the dipole layers 174*d*-2, and the hard mask layer 176*d*-2 are formed to wrap around the channel structures 108'*d*-2 in accordance with some embodiments.

In some embodiments, the interfacial layers 170*d*-1 and 170*d*-2 are made of the same material using the same deposition process. In some embodiments, the gate dielectric layers 172*d*-1 and 172*d*-2 are made of the same material using the same deposition process. In some embodiments, the dipole layers 174*d*-1 and 174*d*-2 are made of the same material using the same deposition process.

Afterwards, a photoresist layer 178*d* is formed in the first region 10*d* to cover the hard mask layer 176*d*-1, and the hard mask layer 176*d*-2 and the dipole layers 174*d*-2 are removed, as shown in FIGS. 7J-1, 7J-2, and 7J-3 in accordance with some embodiments. After the dipole layers 174*d*-2 are removed, the photoresist layer 178*d* and the hard mask layer 176*d*-1 in the first region 10*d* are also removed, and the treatment process 180 is performed to modify the gate dielectric layer 172*d*-1 in the first region 10*d*, as shown in FIGS. 7K-1, 7K-2, and 7K-3 in accordance with some embodiments. More specifically, the metal elements in the dipole layer 174*d*-1 are driven into the gate dielectric layer 172*d*-1 to form modified gate dielectric layer 172'*d*-1 in accordance with some embodiments.

After the treatment process 180 is performed, the dipole layer 174*d*-1 is removed, as shown in FIGS. 7L-1, 7L-2, and 7L-3 in accordance with some embodiments. Next, additional hard mask layers 176*d* (including 276*d*-1 and 276*d*-2) are formed over the modified gate dielectric layers 172'*d*-1 and the gate dielectric layer 172*d*-2, as shown in FIGS.

7M-1, 7M-2, and 7M-3 in accordance with some embodiments. Afterwards, an additional photoresist layer **278*d* is formed in the first region 10*d* to cover the hard mask layer 276*d*-1 in the first region 10*d*, and the hard mask layer 276*d*-2 exposed by the photoresist layer 278*d* is removed, as shown in FIGS. 7N-1, 7N-2, and 7N-3** in accordance with some embodiments.

After the hard mask layer **276*d*-2 is removed, a dipole layer 274*d*-1 is formed around the channel structures 108'*d*-1 in the first region 10*d* and a dipole layer 274*d*-2 is formed to wrap round the channel structures 108'*d*-1 in the second region 20*d*, as shown in FIGS. 7O-1, 7O-2, and 7O-3 in accordance with some embodiments. In some embodiments, the dipole layers 274*d*-1 and 274*d*-2** are made of the same material using the same deposition process.

As shown in FIG. 7O-2, the dipole layer **274*d*-1 is separated from the gate dielectric layer 172'*d*-1 wrapping around the channel structures 108'*d*-1 by the hard mask layer 276*d*-1, while the dipole layer 274*d*-2 is in direct contact with the gate dielectric layer 172*d*-2 wrapping around the channel structures 108'*d*-2** in accordance with some embodiments.

After the dipole layers **274*d*-1 and 274*d*-2 are formed, the treatment process 180 is performed to modify the gate dielectric layer 172*d*-2 in the second region 20*d*, so that modified gate dielectric layer 172'*d*-2 is formed, as shown in FIGS. 7O-1, 7O-2, and 7O-3 in accordance with some embodiments. As described previously, the dipole layer 274*d*-1 is spaced apart from the modified gate dielectric layer 172'*d*-1 during the treatment process 180. Accordingly, during the treatment process 180, second metal elements in the dipole layer 274*d*-2 are driven into the gate dielectric layer 172*d*-2 to form modified gate dielectric layer 172'*d*-2 in accordance with some embodiments. On the other hand, the second metal elements in the dipole layer 274*d*-1 are not driven into the gate dielectric layer 172'*d*-1 in accordance with some embodiments. In some embodiments, the second metal elements in the dipole layer 274*d*-2 are driven into the hard mask layer 276*d*-1 during the treatment process 180** shown in FIG. 7O-2.

Next, the dipole layers **274*d*-1 and 274*d*-2 and the hard mask layer 276*d*-1 are removed, as shown in FIGS. 7P-1, 7P-2, and 7P-3 in accordance with some embodiments. Afterwards, processes shown in FIGS. 3E to 3H are performed to form a gate structure 168*d*, as shown in FIGS. 7Q-1, 7Q-2, 7Q-3, and 7Q-4 in accordance with some embodiments. More specifically, gate dielectric layers 182 (including 182-1 and 182-2), cap layers 184 (including 184*d*-1 and 184*d*-2), work function metal layers 190*d* (including 190*d*-1 and 190*d*-2) and a gate filling layer 192*d* are formed in the gate trenches 166*d*-1 and 166*d*-2 in accordance with some embodiments. In some embodiments, the gate dielectric layers 182-1 and 182-2 are made of the same material using the same deposition process. In some embodiments, the cap layers 184*d*-1 and 184*d*-2 are made of the same material using the same deposition process. In some embodiments, the work function metal layers 190*d*-1 and 190*d*-2** are made of the same material using the same deposition process.

As shown in FIG. 7Q-2, the semiconductor structure **100*d* includes a transistor Td-1 in the first region 10*d* and a transistor Td-2 in the second region 20*d* in accordance with some embodiments. In addition, the transistor Td-2 vertically overlaps the transistor Td-1 in accordance with some embodiments. In some embodiments, the transistor Td-1 includes the channel structures 108'*d*-1, the source/drain structures 150*d*-1 attaching to opposite sides of the channel structures 108'*d*-1, and a portion 168*d*-1 of the gate structure 168*d* wrapping around the channel structures 108'*d*-1. Similarly, the transistor Td-2 includes the channel structures 108'*d*-2, the source/drain structures 150*d*-2 attaching to opposite sides of the channel structures 108'*d*-2, and a portion 168*d*-2 of the gate structure 168*d* wrapping around the channel structures 108'*d*-2** in accordance with some embodiments.

In some embodiments, the threshold voltage of the transistor Td-1 is different from the threshold voltage of the transistor Td-2, even though the work function metal layers **190*d*-1 and 190*d*-2 are made of the same material with the same thickness. In some embodiments, the thickness of the work function metal layer 190*d*-1 over the topmost structure of the channel structures 108'*d*-1 (e.g. the distance between the top surface of the gate dielectric layer 182*d*-1 and the surface of the gate filling layer 192*d* that is in contact with the work function metal layer 190*d*-1 over the topmost structure of the channel structures 108'*d*-1 in the Z direction) is substantially equal to the thickness of the work function metal layer 190*d*-2 over the topmost structure of the channel structures 108'*d*-2 (e.g. the distance between the top surface of the gate dielectric layer 182*d*-2 and the surface of the gate filling layer 192*d* that is in contact with the work function metal layer 190*d*-2 over the topmost structure of the channel structures 108'*d*-1 in the Z direction). In some embodiments, the gate filling layer 192*d* is continuously formed around the channel structures 108'*d*-1 and 108'*d*-2, and a portion of the gate filling layer is vertically sandwiched between the topmost structure of the channel structures 108'*d*-1 and the bottommost structure of the channel structures 108'*d*-2**.

In some embodiments, the modified gate dielectric layer **172'*d*-1 is doped with the first metal elements and is free of the second metal elements, while the modified gate dielectric layer 172'*d*-2 is doped the second metal elements and is free of the first metal elements. In addition, the modified gate dielectric layer 172'*d*-2 vertically overlaps the modified gate dielectric layer 172'*d*-1** in accordance with some embodiments.

In some embodiments, the modified gate dielectric layer **172'*d*-1 covers and in direct contact with a lower portion of the middle spacer layer 149, and the modified gate dielectric layer 172'*d*-2 covers and in direct contact with an upper portion of the middle spacer layer 149, as shown in FIG. 7Q-4. In some embodiments, a portion of the middle spacer 149 is sandwiched between the contact etch stop layer 160*d*-1 and the modified gate dielectric layer 172'*d*-1. In some embodiments, a portion of the middle spacer 149 is sandwiched between the contact etch stop layer 160*d*-1 and the modified gate dielectric layer 172'*d*-2. In some embodiments, a portion of the middle spacer 149 is sandwiched between the source/drain structure 150*d*-2 and the modified gate dielectric layer 172'*d*-2**.

Processes and materials for forming the mask structure **110*d*, the inner spacers 148*d*, the source/drain structures 150*d*-1 and 150*d*-2, the contact etch stop layers 160*d*-1 and 160*d*-2, the interlayer dielectric layers 162*d*-1 and 162*d*-2, the gate trenches 166*d*, the channel structures 108'*d*-1 and 108'*d*-2, the interfacial layers 170*d*-1 and 170*d*-2, the gate dielectric layers 172*d*-1 and 172*d*-2, the dipole layers 174*d*-1, 174*d*-2, 274*d*-1, and 274*d*-2, the hard mask layers 176*d*-1, 176*d*-2, 276*d*-1, and 276*d*-2, the photoresist layer 178*d* and 278*d*, the gate dielectric layers 182-1 and 182-2, the cap layers 184*d* including the cap layers 184*d*-1 and 184*d*-2, the work function metal layers 190*d*-1 and 190*d*-2, and the gate filling layer 192*d* may be similar to, or the same as, those for forming the mask structure 110, the inner spacers 148, the source/drain structures 150-1 and 150-2, the contact etch stop layers 160, the interlayer dielectric layers 162, the gate trenches 166, the channel structures 108'-1 and 108'-2, the interfacial layers 170, the gate dielectric layers 172, the dipole layers 174, the hard mask layers 176, the photoresist layer 178, the gate dielectric layers 182, the cap layers 184, the work function metal layers 190, and the gate filling layer 192** described previously and are not repeated herein.

Moreover, in some other embodiments, the cap layers **184*d*-1 and 184*d*-2 of the semiconductor structure 100*d* may be removed, similar to the semiconductor structure 100*a* described previously. Furthermore, the gate dielectric layers 172*d*-1 and 172*d*-2 may be treated according to the processes shown in FIGS. 5A to 5G in accordance with some embodiments. For example, the gate dielectric layer 172*d*-1 and/or 172*d*-2 may be modified twice, similar to, or the same as, the portion 172*b*"-1 of the semiconductor structure 100*b***.

FIGS. 7Q'-2 and 7Q'-3 illustrate cross-sectional views of a semiconductor structure **100*d*' in accordance with some embodiments. The semiconductor structure 100*d*' may be similar to the semiconductor structure 100*d* described previously, except the cap layer 184*d* between the channel structures 108'*d*-1 and 108'*d*-2 is merged in accordance with some embodiments. That is, the work function metal layer 190*d* does not extend between the channel structures 108'*d*-1 and 108'*d*-2 in accordance with some embodiments. In some embodiments, the thickness of the cap layer 184*d* in the semiconductor structure 100*d*' is greater than about 3 nm. Processes and materials for forming the semiconductor structure 100*d* may be similar to, or the same as, those for forming the semiconductor structure 100** described previously and are not repeated herein.

Figures 2, 8:
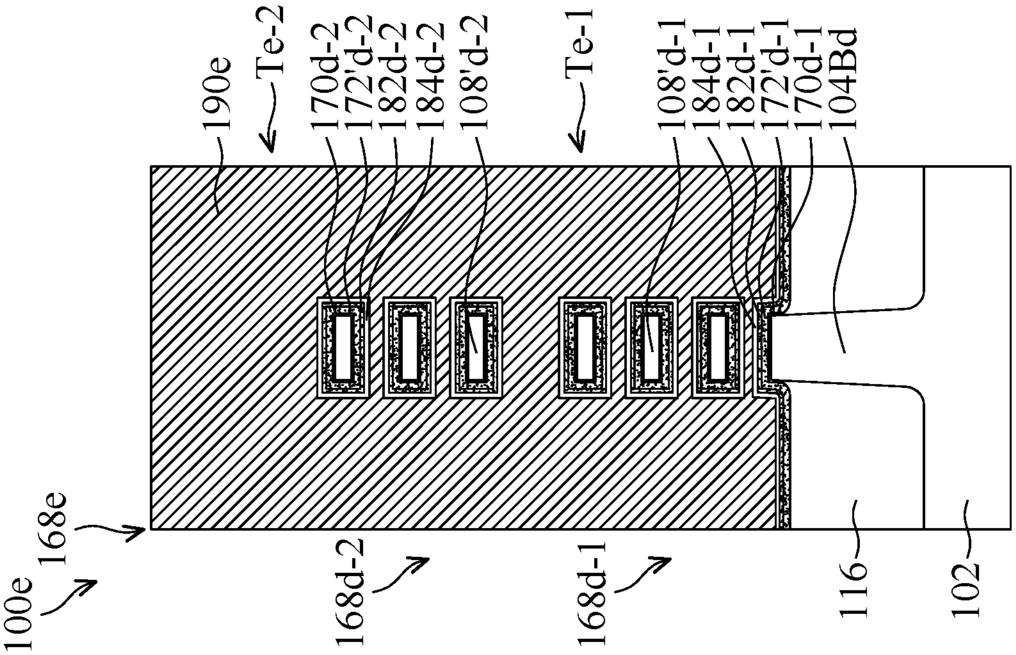
Figures 1, 8:
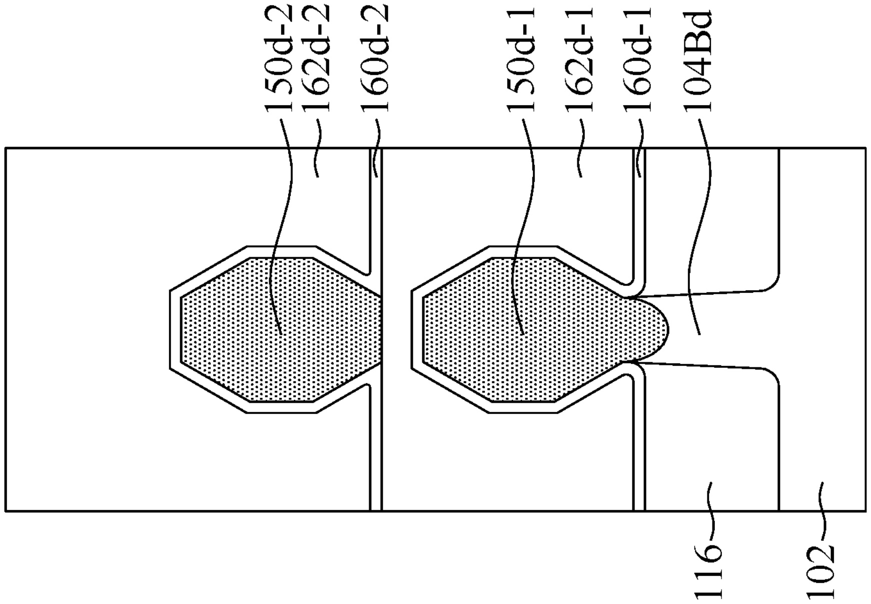
Figures 3, 8:
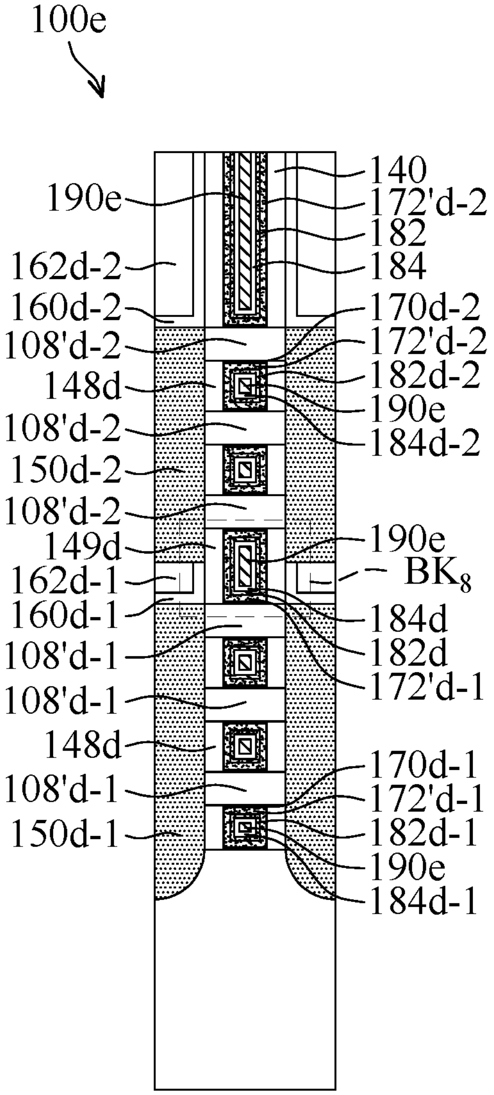
Figures 4, 8:
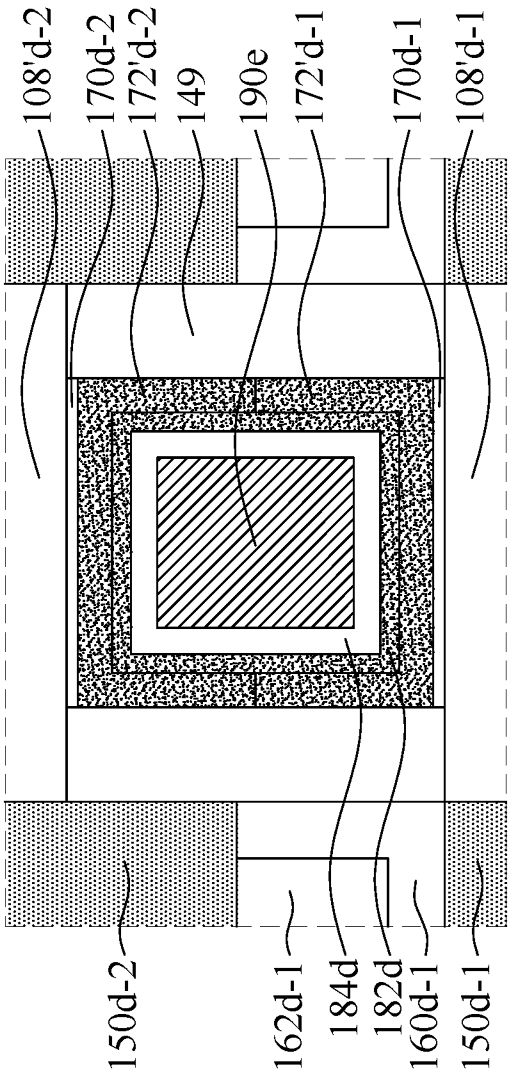

FIGS. 8-1, 8-2, and 8-3 illustrate cross-sectional views a semiconductor structure **100*e* in accordance with some embodiments. FIG. 8-4 illustrates an enlarged cross-sectional view of the semiconductor structure 100*e* of block BK8 shown in FIG. 8-3 in accordance with some embodiments. The semiconductor structure 100*e* may be similar to the semiconductor structure 100*d* described previously, except the gate filling layer is not formed in accordance with some embodiments. Some processes and materials for forming the semiconductor structure 100*e* may be similar to, or the same as, those for forming the semiconductor structure 100*d*** described previously and are not repeated herein.

More specifically, the processes shown in FIGS. 7A-1 to 7P-1, 7A-2 to 7P-2, 7A-3 to 7P-3, and 3E to 3F may be performed. After the cap layers **184*d*-1 and 184*d*-2 are formed, the gate trenches (e.g. the gate trenches 166*d*-1 and 166*d*-2) are completely filled with a work function metal layer 190*e* to form the semiconductor structure 100*e*, as shown in FIGS. 8-1, 8-2, and 8-3** in accordance with some embodiments.

As shown in FIG. 8-2, the semiconductor structure **100*e* includes a transistor Te-1 and a transistor Te-2 in accordance with some embodiments. In addition, the transistor Te-2 vertically overlaps the transistor Te-1 in accordance with some embodiments. In some embodiments, the transistor Te-1 includes the channel structures 108'*d*-1, the source/drain structures 150*d*-1 attaching to opposite sides of the channel structures 108'*d*-1, and a portion 168*e*-1 of the gate structure 168*e* wrapping around the channel structures 108'*d*-1. Similarly, the transistor Te-2 includes the channel structures 108'*d*-2, the source/drain structures 150*d*-2 attaching to opposite sides of the channel structures 108'*d*-2, and a portion 168*e*-2 of the gate structure 168*e* wrapping around the channel structures 108'*d*-2** in accordance with some embodiments.

In some embodiments, the threshold voltage of the transistor Te-1 is different from the threshold voltage of the transistor Te-2. In some embodiments, the work function metal layer **190*e* is continuously formed around the channel structures 108'*d*-1 and 108'*d*-2, and a portion of the work function metal layer 190*e* is vertically sandwiched between the topmost structure of the channel structures 108'*d*-1 and the bottommost structure of the channel structures 108'*d*-2**.

Processes and materials for forming the work function metal layers **190*e* may be similar to, or the same as, those for forming the work function metal layers 190 described previously and are not repeated herein. Moreover, in some other embodiments, the cap layers 184*d*-1 and 184*d*-2 of the semiconductor structure 100*d* may be removed, similar to the semiconductor structure 100*a*** described previously.

Figures 1, 9:
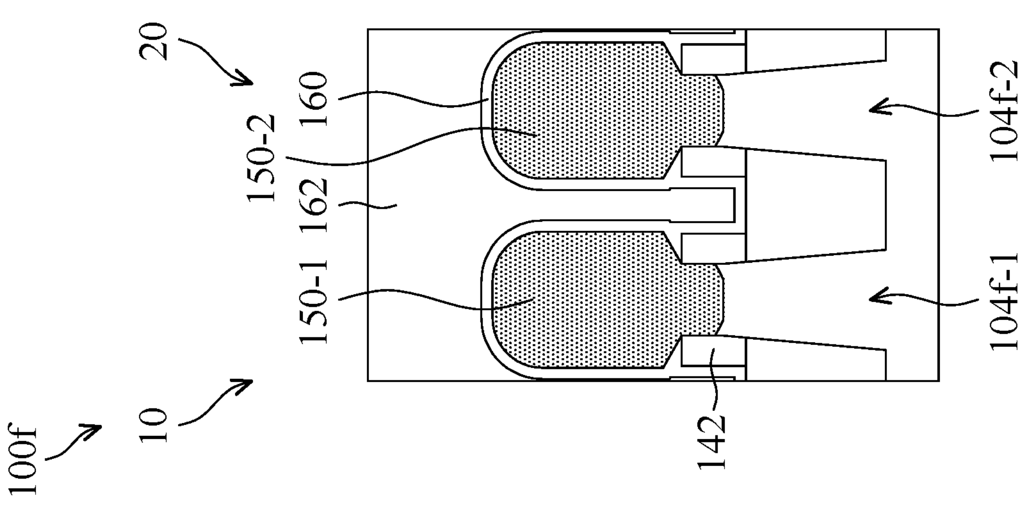
Figures 2, 9:
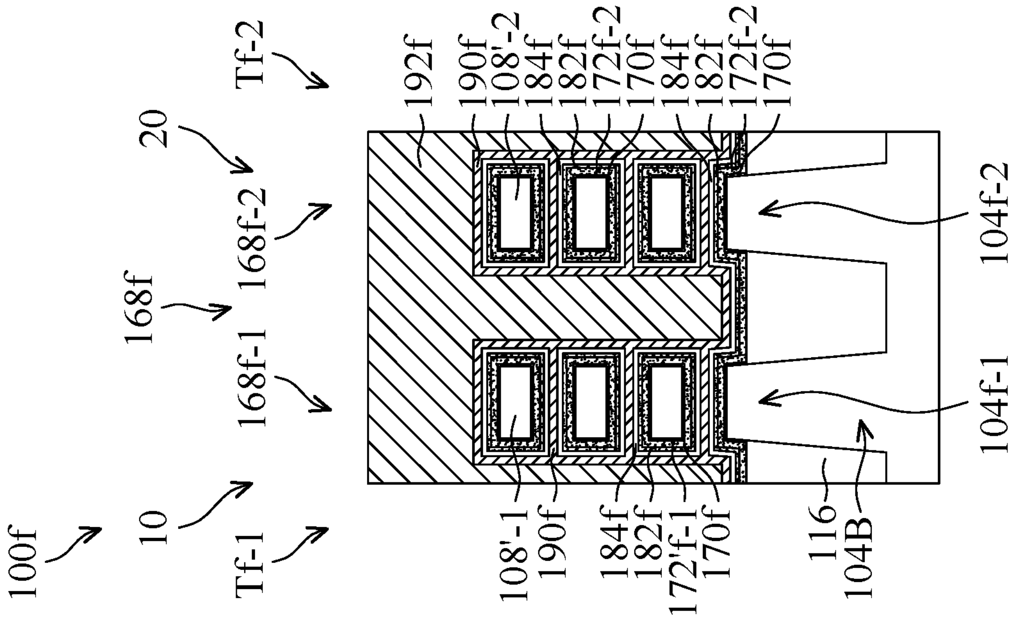
Figures 3, 9:
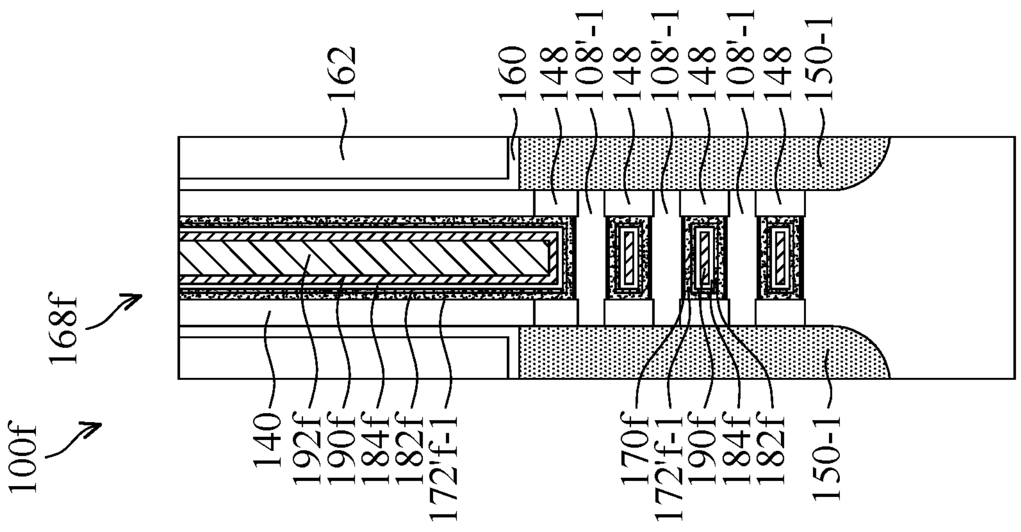
Figures 4, 9:
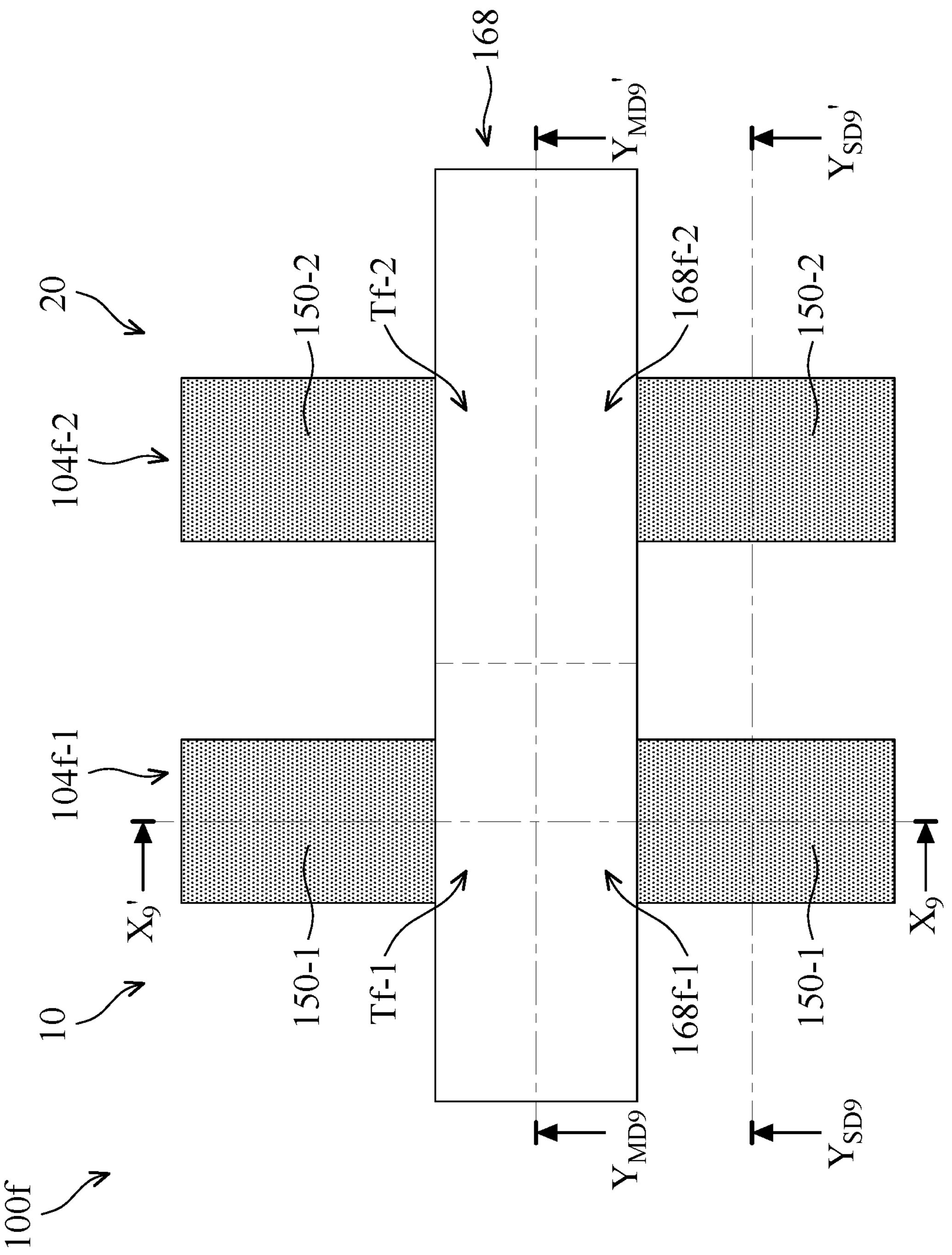

FIGS. 9-1, 9-2, and 9-3 illustrate cross-sectional views a semiconductor structure **100*f* in accordance with some embodiments. FIG. 9-4 illustrates a diagrammatic top view of the semiconductor structure 100*f* in accordance with some embodiments. FIG. 9-4 has been simplified for the sake of clarity to better understand the inventive concepts of the present disclosure. More specifically, FIGS. 9-1, 9-2, and 9-3 illustrate the cross-sectional views of intermediate stages of manufacturing the semiconductor structure 100*f* shown along line $Y_{SD9}$-$Y_{SD9}$' (i.e. in the Y direction), $Y_{MG9}$-$Y_{MG9}$' (i.e. in the Y direction), and $X_9$-$X_9$' (i.e. in the X direction) in FIG. 9-4**, respectively, in accordance with some embodiments.

The semiconductor structure **100*f* may be similar to the semiconductor structure 100 described previously, except the processes are applied to a FinFET structure in accordance with some embodiments. Some processes and materials for forming the semiconductor structure 100*f* may be similar to, or the same as, those for forming the semiconductor structure 100** described previously and are not repeated herein.

More specifically, fin structures **104*f*-1 and 104*f*-2 are formed by patterning the substrate 102**. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

After the fin structures **104*f*-1 and 104*f*-2 are formed, processes shown in FIGS. 2A-1 to 2H-1, 2A-2 to 2H-2, and 2A-3 to 2H-3 may be performed. Next, the dummy gate structure (e.g. the dummy gate structure 130) is removed, and the processes shown in FIGS. 3A to 3H are performed to form a gate structure 168*f* across the fin structures 104*f*-1 and 104*f*-2, as shown in FIGS. 9-2 and 9-3** in accordance with some embodiments.

As shown in FIG. 9-2, the semiconductor structure **100*f* includes a transistor Tf-1 and a transistor Tf-2 in accordance with some embodiments. In some embodiments, the transistor Tf-1 includes the fin structure 104*f*-1, a portion 168*f*-1 of a gate structure 168*f* formed across the fin structure 104*f*-1, and source/drain structures 150-1 formed adjacent to opposite sides of the portion 168*f*-1** of the gate structure

168*f*. Similarly, the transistor Tf-2 includes the fin structure 104*f*-2, a portion 168*f*-2 of the gate structure 168*f* formed across the fin structure 104*f*-2, and source/drain structures 150-2 formed adjacent to opposite sides of the portion 168*f*-2 of the gate structure 168*f* in accordance with some embodiments. In some embodiments, the gate structure 168*f* includes an interfacial layer 170*f*, a gate dielectric layer 172*f* having portions 172*f*-1 and 172*f*-2, a gate dielectric layer 182*f*, a cap layer 184*f*, a work function metal layer 190*f*, and a gate filling layer 192*f*. In some embodiments, the portion 172'*f*-1 includes the first metal elements while the portion 172*f*-2 does not include the first metal elements, so that the threshold voltage of the transistor Tf-1 is different from the threshold voltage of the transistor Tf-2.

Processes and materials for forming the interfacial layer 170*f*, the gate dielectric layer 172*f*, the gate dielectric layer 182*f*, the cap layer 184*f*, the work function metal layer 190*f*, and the gate filling layer 192*f* may be similar to, or the same as, those for forming the interfacial layer 170, the gate dielectric layer 172, the gate dielectric layer 182, the cap layer 184, the work function metal layer 190, and the gate filling layer 192 described previously and are not repeated herein.

Moreover, in some other embodiments, the cap layers 184*f* of the semiconductor structure 100*f* may be removed, similar to the semiconductor structure 100*a* described previously. Furthermore, the gate dielectric layers 172*f* may be treated according to the processes shown in FIGS. 5A to 5G in accordance with some embodiments.

Generally, multiple work function metal layers may be formed in gate structures, so that the resulting transistors can have different threshold voltages. For example, in a gate structure, more than one work function metal layer may be formed. However, as the sizes of the semiconductor devices continuously shrunk, the spaces for forming the gate structures may be mainly occupied by the work function metal layers. That is, there may not be enough space for form gate filling layers.

In addition, during the patterning processes for forming different work function metal layers in different regions, multiple etching processes may need to be performed, and fully removing the metal layers without damaging the elements exposed during the etching processes may be challenging. On the other hand, different types of the work function metal layers may be formed in a single metal gate structure. For examples, a p-type transistor may include both the n-type and the p-type work function metal layers. Therefore, the difference of the threshold voltages between the p-type and n-type transistors may be reduced and the reliability may also be degraded. In addition, the metal elements in one type of work function metal layers may diffuse into the other type of work function metal layers. That is, at the interfaces between two types of work function metal layers, the metal in a p-type work function metal layer may diffuse into an n-type work function metal layer, and the metal in an n-type work function metal layer may diffuse into a p-type work function metal layer, and therefore the threshold voltages may not be as designed and the performance of the resulting transistors may be undermined.

Accordingly, in the embodiments described above, at least one portion of the gate dielectric layer (e.g. the gate dielectric layer 172) is doped with metal elements in the dipole layer (e.g. the dipole layer 174), so that the threshold voltages of the transistors may be adjusted. That is, although only a single type of the work function metal layer (e.g. the work function metal layer 190) is used, the transistors can still have different threshold voltages in accordance with some embodiments. In addition, there can still be enough spaces for forming the gate filling layer (e.g. the gate filling layer 192) in the gate trenches. Therefore, the reliability and the performance of the resulting transistors may be improved.

In some embodiments, the gate dielectric layer at the n-type transistor (e.g. the transistor T-1) is treated with the metal elements, and therefore both the n-type transistor and the neighboring p-type transistor (e.g. the transistor T-2) include a p-type work function metal layer but include no n-type work function metal layer. Since no n-type work function metal layer is formed, the threshold voltage of the p-type transistor will not be affected due to the n-type work function metal layer which will usually be formed therein and therefore may have a lower threshold voltage. In addition, the gate dielectric layer with no n-type work function metal layer (e.g. Al containing layer) formed thereon may have an improved reliability.

Furthermore, there will be no interface between two types of the work function metal layers. Meanwhile, the metal elements are doped in the gate dielectric layer, such an oxide layer, and the diffusion of the metal elements in an oxide layer may be relatively slow. Therefore, boundary effect due to the diffusion of the metal elements between different types of the work function metal layers will not occur. Accordingly, the performance may be improved.

Moreover, a cap layer (e.g. the cap layer 184) is formed over the gate dielectric layers and an annealing process (e.g. the post deposition annealing process 186) is performed to densify the gate dielectric layer (e.g. the gate dielectric layers 172 and 182), so that the quality of the gate dielectric layer may be improved in accordance with some embodiments. In addition, the cap layer may remain in the gate structure, so the gate dielectric layer will not be damaged due to the removal of the cap layer.

It should be appreciated that the elements shown in the semiconductor structures 100, 100*a*, 100*b*, 100*c*, 100*d*, 100*e*, and 100*f* may be combined and/or exchanged. For example, the semiconductor structure may include at least one of the modified portions 172"*b*-1, 172'*b*-2, 172'*b*-3, and 172*b*-4. In addition, it should be noted that same elements in FIGS. 1A to 9-3 may be designated by the same numerals and may include materials that are the same or similar and may be formed by processes that are the same or similar; therefore such redundant details are omitted in the interests of brevity. In addition, although FIGS. 1A to 9-3 are described in relation to the method, it will be appreciated that the structures disclosed in FIGS. 1A to 9-3 are not limited to the method but may stand alone as structures independent of the method. Similarly, the methods shown in FIGS. 1A to 9-3 are not limited to the disclosed structures but may stand alone independent of the structures. Furthermore, the channel structures (e.g. the nanostructures) described above may include nanowires, nanosheets, or other applicable nanostructures in accordance with some embodiments.

Also, while the disclosed methods are illustrated and described below as a series of acts or events, it should be appreciated that the illustrated ordering of such acts or events may be altered in some other embodiments. For example, some acts may occur in a different order and/or concurrently with other acts or events apart from those illustrated and/or described above. In addition, not all illustrated acts may be required to implement one or more aspects or embodiments of the description above. Furthermore, one or more of the acts depicted above may be carried out as one or more separate acts and/or phases.

Furthermore, the terms "approximately," "substantially," "substantial" and "about" used above account for small variations and may be varied in different technologies and be within the deviation range understood by the skilled in the art. For example, when used in conjunction with an event or circumstance, the terms can refer to instances in which the event or circumstance occurs precisely as well as instances in which the event or circumstance occurs in a close approximation.

Embodiments for forming semiconductor structures may be provided. The semiconductor structure may include forming a gate dielectric layer in a first region and a second region and modifying the gate dielectric layer with a first metal element in the first region but not in the second region. Afterwards, a cap layer may be formed over the modified gate dielectric layer to densify the gate dielectric layer, so the quality of the gate dielectric layer may be improved. Next, a work function metal layer may be formed in both the first region and the second region. Since the gate dielectric layer in the first region is doped with the first metal element, the threshold voltages of the first and second transistor may be different.

In some embodiments, a method for manufacturing a semiconductor structure is provided. The method for manufacturing the semiconductor structure includes forming a first channel structure in a first region and a second channel structure in a second region and forming a first type of source/drain structures attached to opposite sides of the first channel structure and a second type of source/drain structures attached to opposite sides of the second channel structure. The method for manufacturing the semiconductor structure also includes forming a first gate dielectric layer having a first portion covering the first channel structure and a second portion covering the second channel structure and driving a first metal element into the first portion of the first gate dielectric layer. The method for manufacturing the semiconductor structure also includes forming a cap layer over both the first portion and the second portion of the first gate dielectric layer after driving the first metal element into the first portion of the first gate dielectric layer and performing an annealing process on the first gate dielectric layer under the cap layer. The method for manufacturing the semiconductor structure also includes forming a work function metal layer continuously extends from the first region to the second region and covering the first channel structure and the second channel structure.

In some embodiments, a method for manufacturing a semiconductor structure is provided. The method for manufacturing the semiconductor structure includes forming a first type of source/drain structures and a second type of source/drain structures over a substrate and forming first channel structures vertically suspended over the substrate and sandwiched between the first type of source/drain structures. The method for manufacturing the semiconductor structure also includes forming second channel structures vertically suspended over the substrate and sandwiched between the second type of source/drain structures and forming a first gate dielectric layer having a first portion wrapping around the first channel structures and a second portion wrapping around the second channel structures. The method for manufacturing the semiconductor structure also includes forming a first dipole layer in physical contact with the first portion of the first gate dielectric layer and spaced apart from the second portion of the first gate dielectric layer and forming a second gate dielectric layer over the first gate dielectric layer. In addition, the first gate dielectric layer and the second gate dielectric layer are made of a same dielectric material. The method for manufacturing the semiconductor structure also includes forming a cap layer wrapping around the first channel structures and the second channel structures over the second gate dielectric layer and annealing the first gate dielectric layer and the second gate dielectric layer after forming the cap layer.

In some embodiments, a semiconductor structure is provided. The semiconductor structure includes a first type of source/drain structures formed in a first region and a second type of source/drain structures formed in a second region over a substrate and first channel structures separated from each other along a first direction and interposing the first type of the source/drain structures along a second direction that is different from the first direction. The semiconductor structure also includes second channel structures separated from each other along the first direction and interposing the second type of the source/drain structures along the second direction and a gate dielectric layer having a first portion in the first region wrapping around the first channel structures and a second portion in the second region wrapping around the second channel structures. In addition, the first portion of the gate dielectric layer is doped with a first metal element, and a concentration of the first metal element in a lower portion of the first portion of the gate dielectric layer is greater than a concentration of the first metal element in an upper portion of the first portion of the gate dielectric layer. The semiconductor structure also includes a work function metal layer formed over both the first portion and the second portion of the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a first channel structure in a first region and a second channel structure in a second region;

forming a first type of source/drain structures attached to opposite sides of the first channel structure and a second type of source/drain structures attached to opposite sides of the second channel structure;

forming a first gate dielectric layer having a first portion covering the first channel structure and a second portion covering the second channel structure;

forming a second gate dielectric layer on the first gate dielectric layer, wherein the second gate dielectric layer includes a third portion wrapping around the first channel structure and a fourth portion wrapping around the second channel structure;

forming a dipole layer on the third portion of the second gate dielectric layer;

performing a first annealing process to drive a first metal element from the dipole layer into the third portion of the second gate dielectric layer;

removing the dipole layer;

forming a third gate dielectric layer on the second gate dielectric layer and contacting the third portion and the fourth portion of the second gate dielectric layer after the removing of the dipole layer;

forming a cap layer over both the third portion and the fourth portion of the second gate dielectric layer after the performing of the first annealing process;

performing a second annealing process to the first gate dielectric layer, the second gate dielectric layer, the third gate dielectric layer, and the cap layer; and forming a work function metal layer that contacts the cap layer and continuously extends from the first region to the second region and covering the first channel structure and the second channel structure.

2. The method for manufacturing the semiconductor structure as claimed in claim 1, wherein the first gate dielectric layer includes a dielectric constant less than those of the second gate dielectric layer and the third gate dielectric layer.

3. The method for manufacturing the semiconductor structure as claimed in claim 2, wherein the third gate dielectric layer is thinner than the second gate dielectric layer.

4. The method for manufacturing the semiconductor structure as claimed in claim 3, wherein the second gate dielectric layer and the third gate dielectric layer are made of a same material.

5. The method for manufacturing the semiconductor structure as claimed in claim 1, wherein the first channel structure and the second channel structure are suspended over a substrate and spaced apart from each other.

6. The method for manufacturing the semiconductor structure as claimed in claim 1, further comprising:

driving a second metal element into a second portion of the first gate dielectric layer in the second region, wherein the first metal element is different from the second metal element.

7. The method for manufacturing the semiconductor structure as claimed in claim 1, wherein the first region vertically overlaps the second region.

8. The method for manufacturing the semiconductor structure as claimed in claim 1, wherein the first channel structure is a p-type doped channel structure;

the second channel structure is an n-type doped channel structure; and the work function metal layer is made of a p-type work function metal.

9. A method for manufacturing a semiconductor structure, comprising:

forming a first type of source/drain structures and a second type of source/drain structures over a substrate;

forming first channel structures vertically suspended over the substrate and sandwiched between the first type of source/drain structures;

forming second channel structures vertically suspended over the substrate and sandwiched between the second type of source/drain structures;

forming an interfacial layer having a first portion wrapping around the first channel structures and a second portion wrapping around the second channel structures;

forming a first gate dielectric layer on the interfacial layer and having a third portion wrapping around the first channel structures and a fourth portion wrapping around the second channel structures;

forming a first dipole layer in physical contact with the first portion of the first gate dielectric layer and spaced apart from the second portion of the first gate dielectric layer;

performing a first annealing process to the first dipole layer;

forming a second gate dielectric layer over the first gate dielectric layer and contacting the first gate dielectric layer after the performing of the first annealing process, wherein the first gate dielectric layer and the second gate dielectric layer are made of a same dielectric material and have a dielectric constant greater than that of the interfacial layer;

forming a cap layer contacting the second gate dielectric layer and wrapping around the first channel structures and the second channel structures over the second gate dielectric layer; and performing a second annealing process to the first gate dielectric layer and the second gate dielectric layer after the forming of the cap layer.

10. The method for manufacturing the semiconductor structure as claimed in claim 9, further comprising:

forming a work function metal layer in direct contact with a top surface of the cap layer after the performing of the second annealing process; and forming a gate filling layer in direct contact with a top surface of the work function metal layer, wherein a first portion of the work function metal layer formed vertically over a topmost structure of the first channel structures has a first thickness, a second portion of the work function metal layer formed vertically over a topmost structure of the second channel structures has a second thickness that is substantially equal to the first thickness.

11. The method for manufacturing the semiconductor structure as claimed in claim 9, further comprising:

removing the first dipole layer before forming the second gate dielectric layer, wherein the performing of the first annealing process to the first dipole layer includes driving a first metal element of the first dipole layer into the first portion of the first gate dielectric layer.

12. The method for manufacturing the semiconductor structure as claimed in claim 11, further comprising:

forming a second dipole layer in physical contact with the second portion of the first gate dielectric layer; and driving a second metal element of the second dipole layer into the second portion of the first gate dielectric layer.

13. The method for manufacturing the semiconductor structure as claimed in claim 9, further comprising:

forming a dielectric wall structure laterally interposing the first channel structures and the second channel structures, wherein the first portion of the first gate dielectric layer is in direct contact with a first sidewall of the dielectric wall structure, and the second portion of the first gate dielectric layer is in direct contact with a second sidewall of the dielectric wall structure that is opposite to the first sidewall, and wherein the dielectric wall structure is vertically extending into the substrate, is partially embedded in the substrate, and contacts sidewalls of the substrate.

14. The method for manufacturing the semiconductor structure as claimed in claim 9, further comprising:

forming a first semiconductor stack over the substrate and a second semiconductor stack over the first semiconductor stack, wherein each of the first semiconductor stack and the second semiconductor stack comprises first semiconductor material layers and second semiconductor material layers alternately stacked;

patterning the first semiconductor stack and the second semiconductor stack to form a fin structure;

removing the first semiconductor material layers of the first semiconductor stack to form the first channel structures with the second semiconductor material layers of the first semiconductor stack; and removing the first semiconductor material layers of the second semiconductor stack to form the second channel structures with the second semiconductor material layers of the second semiconductor stack, wherein the first portion of the first gate dielectric layer vertically overlaps the second portion of the first gate dielectric layer.

15. A method for manufacturing a semiconductor structure, comprising:

forming a first type of source/drain structures and a second type of source/drain structures over a substrate;

forming first channel structures vertically suspended over the substrate and sandwiched between the first type of source/drain structures;

forming second channel structures vertically suspended over the substrate and sandwiched between the second type of source/drain structures;

forming an interfacial layer wrapping around the first channel structures and the second channel structures;

forming a first gate dielectric layer on the interfacial layer and having a first portion wrapping around the first channel structures and a second portion wrapping around the second channel structures;

forming a first dipole layer in physical contact with the first portion of the first gate dielectric layer and spaced apart from the second portion of the first gate dielectric layer;

performing a first annealing process to drive a first metal element of the first dipole layer into the first portion of the first gate dielectric layer;

removing the first dipole layer;

forming a second gate dielectric layer over and contacting a top surface of the first gate dielectric layer, wherein the first gate dielectric layer and the second gate dielectric layer are made of a same dielectric material;

forming a cap layer contacting the second gate dielectric layer and wrapping around the first channel structures and the second channel structures;

performing a second annealing process to the first gate dielectric layer and the second gate dielectric layer after the forming of the cap layer;

forming a work function metal layer in direct contact with a top surface of the cap layer after the performing of the second annealing process; and forming a gate filling layer in direct contact with a top surface of the work function metal layer.

16. The method for manufacturing the semiconductor structure as claimed in claim 15, further comprising:

forming a second dipole layer in physical contact with the second portion of the first gate dielectric layer; and driving a second metal element of the second dipole layer into the second portion of the first gate dielectric layer.

17. The method for manufacturing the semiconductor structure as claimed in claim 15, wherein a first portion of the work function metal layer formed vertically over a topmost structure of the first channel structures has a first thickness, a second portion of the work function metal layer formed vertically over a topmost structure of the second channel structures has a second thickness that is substantially equal to the first thickness.

18. The method for manufacturing the semiconductor structure as claimed in claim 15, wherein the second gate dielectric layer is thinner than those of the first gate dielectric layer; and the interfacial layer includes a dielectric constant less than that of the first gate dielectric layer and the second gate dielectric layer.

19. The method for manufacturing the semiconductor structure as claimed in claim 15, further comprising:

forming a dielectric wall structure laterally interposing the first channel structures and the second channel structures, wherein the first portion of the first gate dielectric layer is in direct contact with a first sidewall of the dielectric wall structure, and the second portion of the first gate dielectric layer is in direct contact with a second sidewall of the dielectric wall structure that is opposite to the first sidewall, and wherein the dielectric wall structure is vertically extending into the substrate, is partially embedded in the substrate, and contacts sidewalls of the substrate.

20. The method for manufacturing the semiconductor structure as claimed in claim 15, further comprising:

forming a first semiconductor stack over the substrate and a second semiconductor stack over the first semiconductor stack, wherein each of the first semiconductor stack and the second semiconductor stack comprises first semiconductor material layers and second semiconductor material layers alternately stacked;

patterning the first semiconductor stack and the second semiconductor stack to form a fin structure;

removing the first semiconductor material layers of the first semiconductor stack to form the first channel structures with the second semiconductor material layers of the first semiconductor stack; and removing the first semiconductor material layers of the second semiconductor stack to form the second channel structures with the second semiconductor material layers of the second semiconductor stack, wherein the first portion of the first gate dielectric layer vertically overlaps the second portion of the first gate dielectric layer.

* * * * *